US012657356B2

(12) United States Patent　　　　　(10) Patent No.:　US 12,657,356 B2
Bolchover et al.　　　　　　　　　　　(45) Date of Patent:　　　Jun. 16, 2026

(54) PREDICTING TORQUE AND DRAG BUCKLING BEHAVIOR OF A DRILL STRING AND CASING

(71) Applicant: Schlumberger Technology Corporation, Sugar Land, TX (US)

(72) Inventors: Paul Bolchover, Houston, TX (US); Ji Tang Liu, Beijing (CN); Rongbing Chen, Beijing (CN)

(73) Assignee: Schlumberger Technology Corporation, Sugar Land, TX (US)

( * ) Notice: Subject to any disclaimer, the term of this patent is extended or adjusted under 35 U.S.C. 154(b) by 361 days.

(21) Appl. No.: 18/592,734

(22) Filed: Mar. 1, 2024

(65) Prior Publication Data

US 2025/0278532 A1　　Sep. 4, 2025

(51) Int. Cl.
　　G06F 30/20　　　　(2020.01)
　　E21B 44/00　　　　(2006.01)
　　E21B 47/007　　　(2012.01)

(52) U.S. Cl.
　　CPC .............. G06F 30/20 (2020.01); E21B 44/00 (2013.01); E21B 47/007 (2020.05)

(58) Field of Classification Search
　　CPC .......... G06F 30/20; G06F 30/25; G06F 30/27; G06F 30/28; G06F 2111/00–2119/22; E21B 44/00; E21B 47/007; E21B 2200/20
See application file for complete search history.

(56) References Cited

FOREIGN PATENT DOCUMENTS

| CA | 3102189 A1 | 7/2021 |
| EP | 2583214 B1 | 7/2019 |

OTHER PUBLICATIONS

Kapitaniak et al. "Numerical Study of Forward and Backward Whirling of Drill-String", Nov. 2017, Journal of Computational and Nonlinear Dynamics vol. 12 (Year: 2017).*
Hajianmaleki and Daily "Critical-Buckling-Load Assessment of Drillstrings in Different Wellbores by Use of the Explicit Finite-Element Method" Jun. 2014 SPE Drilling and Completion (Year: 2014).*
Gao and Huang "A review of down-hole tubular string buckling in well engineering", Jul. 24, 2015 (Year: 2015).*
(Continued)

*Primary Examiner* — Rehana Perveen
*Assistant Examiner* — Troy A Maust
(74) *Attorney, Agent, or Firm* — Kyle R. Miiller

(57)　　　　　ABSTRACT
A method for predicting buckling behavior in a torque and drag analysis of a tubular string in a wellbore includes performing a first finite element analysis (FEA) on the tubular string. The method also includes determining one or more first properties of the tubular string based upon the first FEA. The method also includes identifying a possible buckling zone in the tubular string based upon the one or more first properties. The method also includes splitting the possible buckling zone into a plurality of segments. The method also includes performing a second FEA on one or more of the segments. The method also includes determining one or more second properties of the tubular string based upon the second FEA. The method also includes comparing the one or more first properties of first FEA to the one or more second properties of second FEA to identify incremental changes therebetween.

4 Claims, 55 Drawing Sheets

(56)     References Cited

OTHER PUBLICATIONS

Huang et al. "A study of tubular string buckling in vertical wells" Sep. 30, 2016, International Journal of Mechanical Sciences (Year: 2016).*

Arbatani et al., "An Approach To Directional Drilling Simulation: Finite Element And Finite Segment Methods With Contact", Computational Mechanics, vol. 57, Mar. 22, 2016, pp. 1001-1015.

Chen et al., "Simulating Drillstring Dynamics Motion and Post-Buckling State with Advanced Transient Dynamics Model", SPE Drilling & Completion, vol. 36, No. 03, Sep. 8, 2021, pp. 613-627.

* cited by examiner

Figure 1:
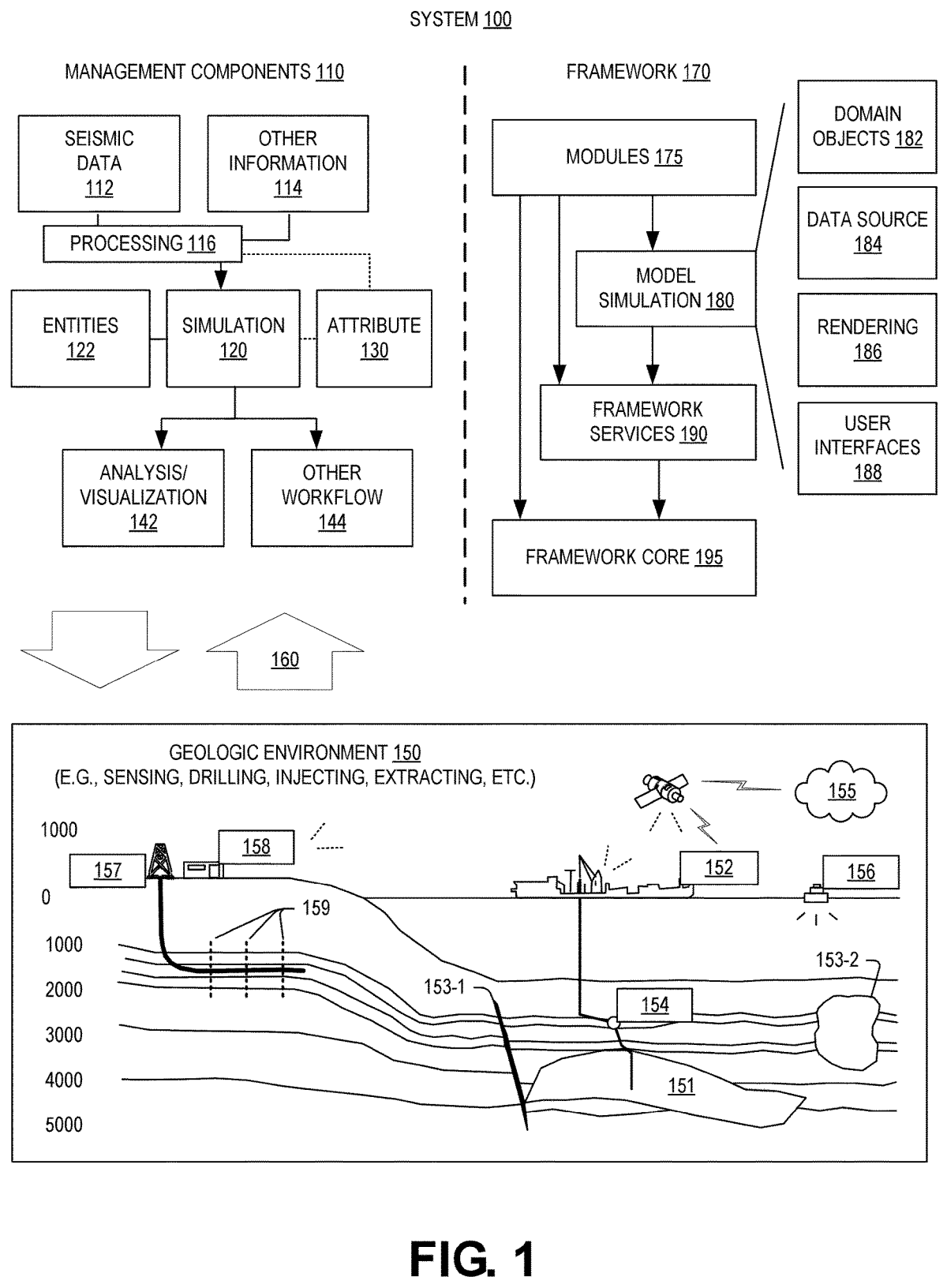

SYSTEM 100

MANAGEMENT COMPONENTS 110

| SEISMIC DATA 112 | OTHER INFORMATION 114 |
|---|---|

PROCESSING 116

| ENTITIES 122 | SIMULATION 120 | ATTRIBUTE 130 |
|---|---|---|

| ANALYSIS/ VISUALIZATION 142 | OTHER WORKFLOW 144 |
|---|---|

160

FRAMEWORK 170

MODULES 175

MODEL SIMULATION 180

FRAMEWORK SERVICES 190

FRAMEWORK CORE 195

| DOMAIN OBJECTS 182 |
|---|
| DATA SOURCE 184 |
| RENDERING 186 |
| USER INTERFACES 188 |

GEOLOGIC ENVIRONMENT 150
(E.G., SENSING, DRILLING, INJECTING, EXTRACTING, ETC.)

SINUSOIDAL

300

HELICAL

SURFACE WEIGHT

DOWNHOLE WEIGHT

PREDICTING TORQUE AND DRAG BUCKLING BEHAVIOR OF A DRILL STRING AND CASING

BACKGROUND

In operations such as "drill assembly trip in" or "casing running into hole," buckling occurs when the compressive load in a tubular exceeds a predetermined value, beyond which the tubular is no longer stable and deforms into a sinusoidal or helical shape. The sinusoidal buckling (e.g., a first mode of buckling) corresponds to a tube that snaps into a sinusoidal shape. This first mode of buckling is sometimes called lateral buckling, snaking, or two-dimensional buckling. The helical buckling (e.g., a second mode of buckling) corresponds to a tube that snaps into a helical shape (i.e., spiral shape). The helical buckling can cause so called "helical lockup" when compressive forces on a string in helical buckling prevent axial movement due to contact and axial friction. Forces at surface are not transmitted to the bit.

Using a drilling simulation computation engine based on non-linear finite element analysis (FEA), a drill string may be modeled as a 3D beam element with 6 degrees of freedom (DOF). The engine can handle the pipe large deformation and coupling between bending and axial deformation. The engine can also predict the buckling deformation of drillstring and the increments of contact force and bending moment. The engine includes several different packages such as a static torque and drag (T&D) engine and a dynamic engine. For one simulation case, the T&D engine spends seconds to 1 minutes, while the dynamics engine may spend several minutes to finish.

The difficulty of buckling prediction is numerical stability due to the buckled drill string being under unstable or having singular status. Conventional numerical solution faces a convergence issue, especially under severe load conditions.

SUMMARY

A method for predicting buckling behavior in a torque and drag analysis of a tubular string in a wellbore is disclosed. The method includes performing a first finite element analysis (FEA) on the tubular string. The method also includes determining one or more first properties of the tubular string based upon the first FEA. The method also includes identifying a possible buckling zone in the tubular string based upon the one or more first properties. The method also includes splitting the possible buckling zone into a plurality of segments. The method also includes performing a second FEA on one or more of the segments. The second FEA is different than the first FEA. The method also includes determining one or more second properties of the tubular string based upon the second FEA. The method also includes comparing the one or more first properties of first FEA to the one or more second properties of second FEA to identify incremental changes therebetween. The method also includes applying the incremental changes to the first FEA to produce an updated first FEA.

A computing system is also disclosed. The computing system includes one or more processors and a memory system. The memory system includes one or more non-transitory computer-readable media storing instructions that, when executed by at least one of the one or more processors, cause the computing system to perform operations. The operations include performing a first finite element analysis (FEA) on the tubular string. The operations also include determining one or more first properties of the tubular string based upon the first FEA. The operations also include identifying a possible buckling zone in the tubular string based upon the one or more first properties. The operations also include splitting the possible buckling zone into a plurality of segments. The operations also include performing a second FEA on one or more of the segments, wherein the second FEA is different than the first FEA. The operations also include determining one or more second properties of the tubular string based upon the second FEA. The operations also include comparing the one or more first properties of first FEA to the one or more second properties of second FEA to identify incremental changes therebetween. The operations also include applying the incremental changes to the first FEA to produce an updated first FEA.

A non-transitory computer-readable medium is also disclosed. The medium stores instructions that, when executed by one or more processors of a computing system, cause the computing system to perform operations. The operations include performing a first finite element analysis (FEA) on a tubular string in a wellbore. The operations also include iteratively performing a series of sub-operations. The series of sub-operations includes determining one or more first properties of the tubular string based upon the first FEA. The series of sub-operations also includes identifying a possible buckling zone in the tubular string based upon the axial load. The series of sub-operations also includes splitting the possible buckling zone into a plurality of segments. The series of sub-operations also includes performing a second FEA on one or more of the segments. The series of sub-operations also includes determining one or more second properties of the tubular string based upon the second FEA. The series of sub-operations also includes comparing the one or more first properties of first FEA to the one or more second properties of second FEA to identify incremental changes therebetween. The series of sub-operations also includes applying the incremental changes to the first FEA to produce an updated first FEA, wherein the updated first FEA comprises a linear FEA.

BRIEF DESCRIPTION OF THE DRAWINGS

The accompanying drawings, which are incorporated in and constitute a part of this specification, illustrate embodiments of the present teachings and together with the description, serve to explain the principles of the present teachings. In the figures:

FIG. 1 illustrates an example of a system that includes various management components to manage various aspects of a geologic environment, according to an embodiment.

DETAILED DESCRIPTION

Figure 2:
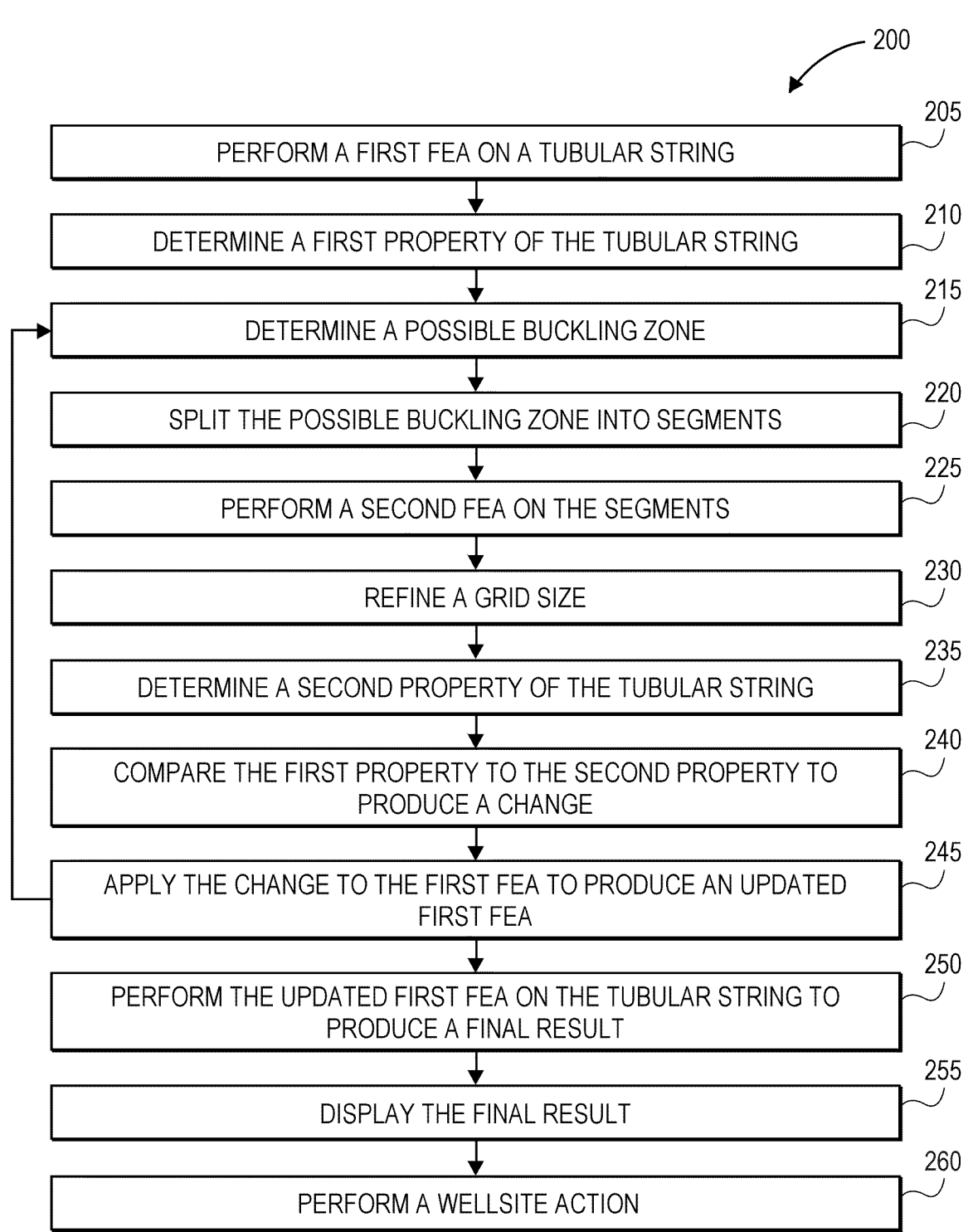
FIG. 2 illustrates a flowchart of a method for predicting buckling behavior in a torque and drag analysis of a tubular string in a wellbore, according to an embodiment.

Reference will now be made in detail to embodiments, examples of which are illustrated in the accompanying drawings and figures. In the following detailed description, numerous specific details are set forth in order to provide a thorough understanding of the invention. However, it will be apparent to one of ordinary skill in the art that the invention may be practiced without these specific details. In other instances, well-known methods, procedures, components, circuits, and networks have not been described in detail so as not to unnecessarily obscure aspects of the embodiments.

It will also be understood that, although the terms first, second, etc. may be used herein to describe various elements, these elements should not be limited by these terms. These terms are only used to distinguish one element from another. For example, a first object or step could be termed a second object or step, and, similarly, a second object or step could be termed a first object or step, without departing from the scope of the present disclosure. The first object or step, and the second object or step, are both, objects or steps, respectively, but they are not to be considered the same object or step.

The terminology used in the description herein is for the purpose of describing particular embodiments and is not intended to be limiting. As used in this description and the appended claims, the singular forms "a," "an" and "the" are intended to include the plural forms as well, unless the context clearly indicates otherwise. It will also be understood that the term "and/or" as used herein refers to and encompasses any possible combinations of one or more of the associated listed items. It will be further understood that the terms "includes," "including," "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Further, as used herein, the term "if" may be construed to mean "when" or "upon" or "in response to determining" or "in response to detecting," depending on the context.

Attention is now directed to processing procedures, methods, techniques, and workflows that are in accordance with some embodiments. Some operations in the processing procedures, methods, techniques, and workflows disclosed herein may be combined and/or the order of some operations may be changed.

FIG. 1 illustrates an example of a system 100 that includes various management components 110 to manage various aspects of a geologic environment 150 (e.g., an environment that includes a sedimentary basin, a reservoir 151, one or more faults 153-1, one or more geobodies 153-2, etc.). For example, the management components 110 may allow for direct or indirect management of sensing, drilling, injecting, extracting, etc., with respect to the geologic environment 150. In turn, further information about the geologic environment 150 may become available as feedback 160 (e.g., optionally as input to one or more of the management components 110).

In the example of FIG. 1, the management components 110 include a seismic data component 112, an additional information component 114 (e.g., well/logging data), a processing component 116, a simulation component 120, an attribute component 130, an analysis/visualization component 142 and a workflow component 144. In operation, seismic data and other information provided per the components 112 and 114 may be input to the simulation component 120.

In an example embodiment, the simulation component 120 may rely on entities 122. Entities 122 may include earth entities or geological objects such as wells, surfaces, bodies, reservoirs, etc. In the system 100, the entities 122 can include virtual representations of actual physical entities that are reconstructed for purposes of simulation. The entities 122 may include entities based on data acquired via sensing, observation, etc. (e.g., the seismic data component 112 and other information 114). An entity may be characterized by one or more properties (e.g., a geometrical pillar grid entity of an earth model may be characterized by a porosity property). Such properties may represent one or more measurements (e.g., acquired data), calculations, etc.

In an example embodiment, the simulation component 120 may operate in conjunction with a software framework such as an object-based framework. In such a framework, entities may include entities based on pre-defined classes to facilitate modeling and simulation. A commercially available example of an object-based framework is the MICROSOFT® .NET® framework (Redmond, Washington), which provides a set of extensible object classes. In the .NET® framework, an object class encapsulates a module of reusable code and associated data structures. Object classes can be used to instantiate object instances for use in by a program, script, etc. For example, borehole classes may define objects for representing boreholes based on well data.

In the example of FIG. 1, the simulation component 120 may process information to conform to one or more attributes specified by the attribute component 130, which may include a library of attributes. Such processing may occur prior to input to the simulation component 120 (e.g., consider the processing component 116). As an example, the simulation component 120 may perform operations on input information based on one or more attributes specified by the attribute component 130. In an example embodiment, the simulation component 120 may construct one or more models of the geologic environment 150, which may be relied on to simulate behavior of the geologic environment 150 (e.g., responsive to one or more acts, whether natural or artificial). In the example of FIG. 1, the analysis/visualization component 142 may allow for interaction with a model or model-based results (e.g., simulation results, etc.). As an example, output from the simulation component 120 may be input to one or more other workflows, as indicated by a workflow component 144.

As an example, the simulation component 120 may include one or more features of a simulator such as the ECLIPSE™ reservoir simulator (SLB, Houston Texas), the INTERSECT™ reservoir simulator (SLB, Houston Texas), etc. As an example, a simulation component, a simulator, etc. may include features to implement one or more meshless techniques (e.g., to solve one or more equations, etc.). As an example, a reservoir or reservoirs may be simulated with respect to one or more enhanced recovery techniques (e.g., consider a thermal process such as SAGD, etc.).

In an example embodiment, the management components 110 may include features of a commercially available framework such as the PETREL® seismic to simulation software framework (SLB, Houston, Texas). The PETREL® framework provides components that allow for optimization of exploration and development operations. The PETREL® framework includes seismic to simulation software components that can output information for use in increasing reservoir performance, for example, by improving asset team productivity. Through use of such a framework, various professionals (e.g., geophysicists, geologists, and reservoir engineers) can develop collaborative workflows and integrate operations to streamline processes. Such a framework may be considered an application and may be considered a data-driven application (e.g., where data is input for purposes of modeling, simulating, etc.).

In an example embodiment, various aspects of the management components 110 may include add-ons or plug-ins that operate according to specifications of a framework environment. For example, a commercially available framework environment marketed as the OCEAN® framework environment (SLB, Houston, Texas) allows for integration of add-ons (or plug-ins) into a PETREL® framework workflow. The OCEAN® framework environment leverages .NET® tools (Microsoft Corporation, Redmond, Washington) and offers stable, user-friendly interfaces for efficient development. In an example embodiment, various components may be implemented as add-ons (or plug-ins) that conform to and operate according to specifications of a framework environment (e.g., according to application programming interface (API) specifications, etc.).

FIG. 1 also shows an example of a framework 170 that includes a model simulation layer 180 along with a framework services layer 190, a framework core layer 195 and a modules layer 175. The framework 170 may include the commercially available OCEAN® framework where the model simulation layer 180 is the commercially available PETREL® model-centric software package that hosts OCEAN® framework applications. In an example embodiment, the PETREL® software may be considered a data-driven application. The PETREL® software can include a framework for model building and visualization.

As an example, a framework may include features for implementing one or more mesh generation techniques. For example, a framework may include an input component for receipt of information from interpretation of seismic data, one or more attributes based at least in part on seismic data, log data, image data, etc. Such a framework may include a mesh generation component that processes input information, optionally in conjunction with other information, to generate a mesh.

In the example of FIG. 1, the model simulation layer 180 may provide domain objects 182, act as a data source 184, provide for rendering 186 and provide for various user interfaces 188. Rendering 186 may provide a graphical environment in which applications can display their data while the user interfaces 188 may provide a common look and feel for application user interface components.

As an example, the domain objects 182 can include entity objects, property objects and optionally other objects. Entity objects may be used to geometrically represent wells, surfaces, bodies, reservoirs, etc., while property objects may be used to provide property values as well as data versions and display parameters. For example, an entity object may represent a well where a property object provides log information as well as version information and display information (e.g., to display the well as part of a model).

In the example of FIG. 1, data may be stored in one or more data sources (or data stores, generally physical data storage devices), which may be at the same or different physical sites and accessible via one or more networks. The model simulation layer 180 may be configured to model projects. As such, a particular project may be stored where stored project information may include inputs, models, results and cases. Thus, upon completion of a modeling session, a user may store a project. At a later time, the project can be accessed and restored using the model simulation layer 180, which can recreate instances of the relevant domain objects.

In the example of FIG. 1, the geologic environment 150 may include layers (e.g., stratification) that include a reservoir 151 and one or more other features such as the fault 153-1, the geobody 153-2, etc. As an example, the geologic environment 150 may be outfitted with any of a variety of sensors, detectors, actuators, etc. For example, equipment 152 may include communication circuitry to receive and to transmit information with respect to one or more networks 155. Such information may include information associated with downhole equipment 154, which may be equipment to acquire information, to assist with resource recovery, etc. Other equipment 156 may be located remote from a well site and include sensing, detecting, emitting or other circuitry. Such equipment may include storage and communication circuitry to store and to communicate data, instructions, etc.

As an example, one or more satellites may be provided for purposes of communications, data acquisition, etc. For example, FIG. 1 shows a satellite in communication with the network 155 that may be configured for communications, noting that the satellite may additionally or instead include circuitry for imagery (e.g., spatial, spectral, temporal, radiometric, etc.).

FIG. 1 also shows the geologic environment 150 as optionally including equipment 157 and 158 associated with a well that includes a substantially horizontal portion that may intersect with one or more fractures 159. For example, consider a well in a shale formation that may include natural fractures, artificial fractures (e.g., hydraulic fractures) or a combination of natural and artificial fractures. As an example, a well may be drilled for a reservoir that is laterally extensive. In such an example, lateral variations in properties, stresses, etc. may exist where an assessment of such variations may assist with planning, operations, etc. to develop a laterally extensive reservoir (e.g., via fracturing, injecting, extracting, etc.). As an example, the equipment 157 and/or 158 may include components, a system, systems, etc. for fracturing, seismic sensing, analysis of seismic data, assessment of one or more fractures, etc.

As mentioned, the system 100 may be used to perform one or more workflows. A workflow may be a process that includes a number of worksteps. A workstep may operate on data, for example, to create new data, to update existing data, etc. As an example, a may operate on one or more inputs and create one or more results, for example, based on one or more algorithms. As an example, a system may include a workflow editor for creation, editing, executing, etc. of a workflow. In such an example, the workflow editor may provide for selection of one or more pre-defined worksteps, one or more customized worksteps, etc. As an example, a workflow may be a workflow implementable in the PETREL® software, for example, that operates on seismic data, seismic attribute(s), etc. As an example, a workflow may be a process implementable in the OCEAN® framework. As an example, a workflow may include one or more worksteps that access a module such as a plug-in (e.g., external executable code, etc.).

Predicting Buckling Behavior in a Torque and Drag Analysis of a Tubular String in a Wellbore The present disclosure provides an improvement to a drill simulation software T&D engine, which using a nonlinear FEA model, it has been validated to be accurate when compared to a field measurement. The T&D engine still has a convergence issue for cases with severe load conditions. The present disclosure focuses on solving this convergence issue. As described in greater detail below, the present disclosure includes firstly calculating whole drill string by liner FEA, instead of the baseline engine's non-linear FEA. The solution of the drill string is then split into many independent solutions of fixed length segments. The segments may be from about 10 feet to about 100 feet or about 100 feet to about 500 feet (e.g., about 300 to about 400 feet). Each segment may be solved with a non-linear FEA model, and its extra effect is applied back to whole drill string, one-by-one from bottom to surface and finally combined together to get final result. Adaptively, mesh refinement may be introduced in a single segment solution, which further increases solution reliability.

FIG. 2 illustrates a flowchart of a method for predicting buckling behavior in a torque and drag analysis of a tubular string in a wellbore, according to an embodiment. An illustrative order of the method 200 is provided below;

however, one or more portions of the method 200 may be performed in a different order, simultaneously, repeated, or omitted.

The method 200 may include performing a first finite element analysis (FEA) on a tubular string, as at 205. The first FEA may be a linear FEA. The drill string may be or include a drill string, a coiled tubing, a casing, a liner, or a combination thereof. This may help to skip the possible convergence issue using non-linear FEA.

The method 200 may also include (e.g., iteratively) performing a series of operations, as at 210. The series of operations may include portions 215-255 of the method 200. The series of operations may be a repetitive loop to analyze different segments of the tubular string proceeding from a lowermost segment to an uppermost segment. The series of operations may be performed until no possible buckling zone is identified and/or until the second FEA (described below) is performed on the uppermost segment of the tubular string.

The series of operations may also include determining one or more first properties of the tubular string based upon the first FEA, as at 215. The first properties may be or include an initial axial load, a torque, and bending moment, or a combination thereof.

The series of operations may also include identifying a possible buckling zone for the tubular string based upon the one or more first properties, as at 220. In one example, the possible buckling zone may be identifying based upon the axial load. More particularly, the axial load may be compared to data in a (e.g., public) analytical based buckling threshold to identify the possible buckling zone. The size (e.g., length) of the buckling zone may depend upon the load conditions on the tubular string.

Figure 3A:
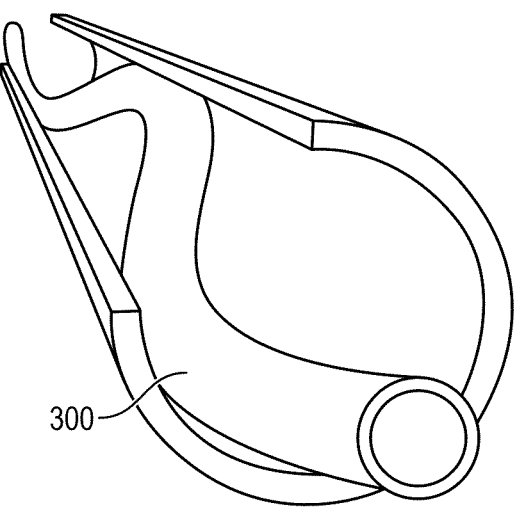
FIG. 3A illustrates a perspective view of a tubular sting with a first (e.g., sinusoidal) mode of buckling.
Figure 3B:
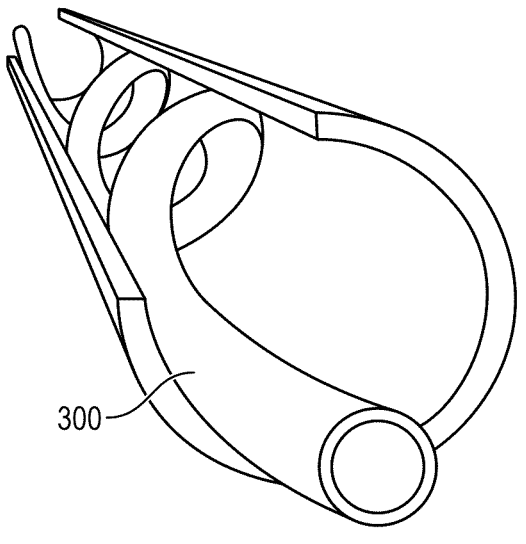
FIG. 3B illustrates a perspective view of the tubular string with a second (e.g., helical) mode of buckling.
Figure 3C:
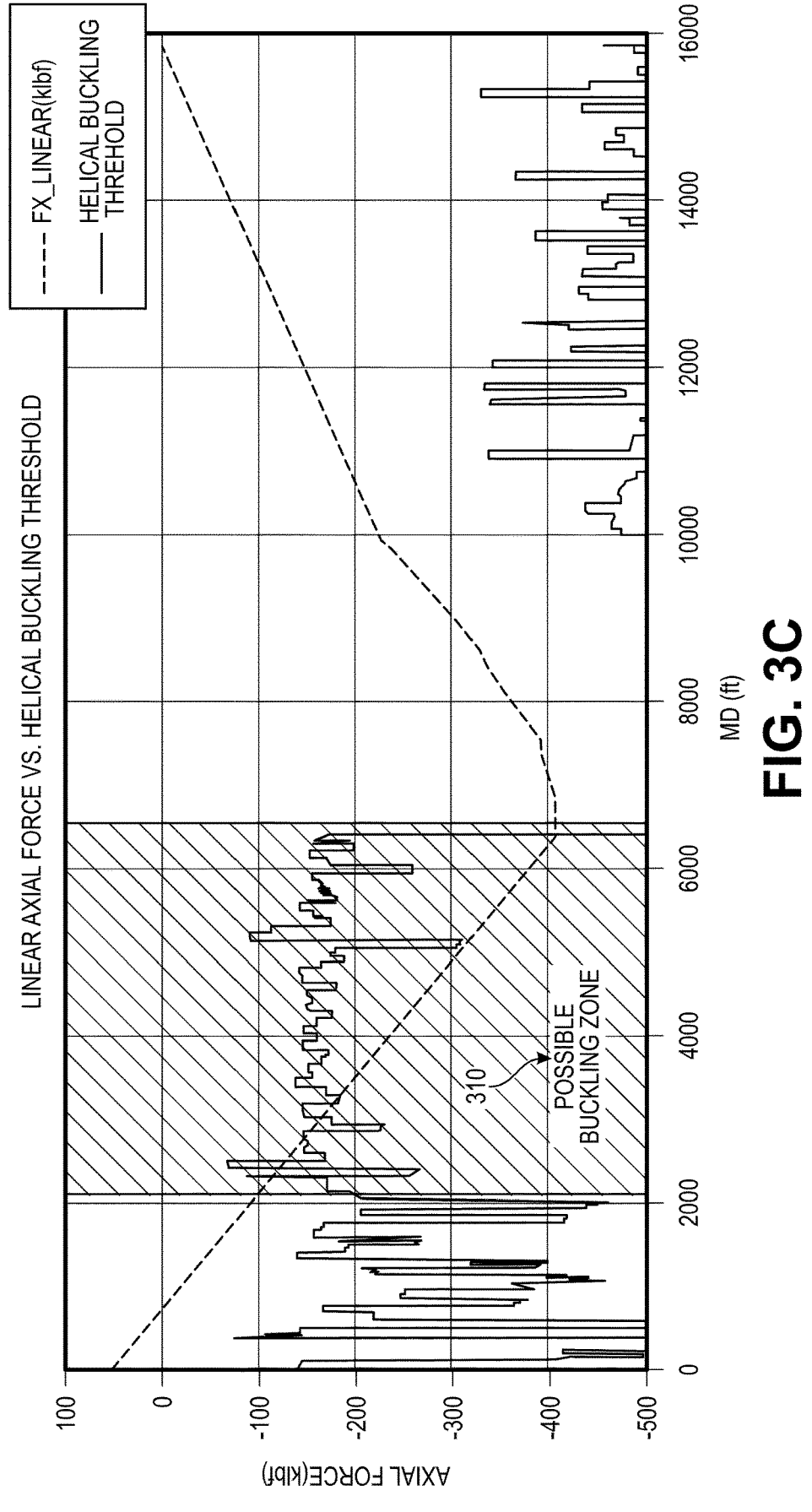
FIG. 3C illustrates a graph showing a possible buckling zone for the tubular string, according to an embodiment.

FIG. 3A illustrates a perspective view of a tubular sting 300 with a first (e.g., sinusoidal) mode of buckling, FIG. 3B illustrates a perspective view of the tubular string 300 with a second (e.g., helical) mode of buckling, and FIG. 3C illustrates a graph showing a possible buckling zone 310 for the tubular string 300, according to an embodiment.

Figure 4:
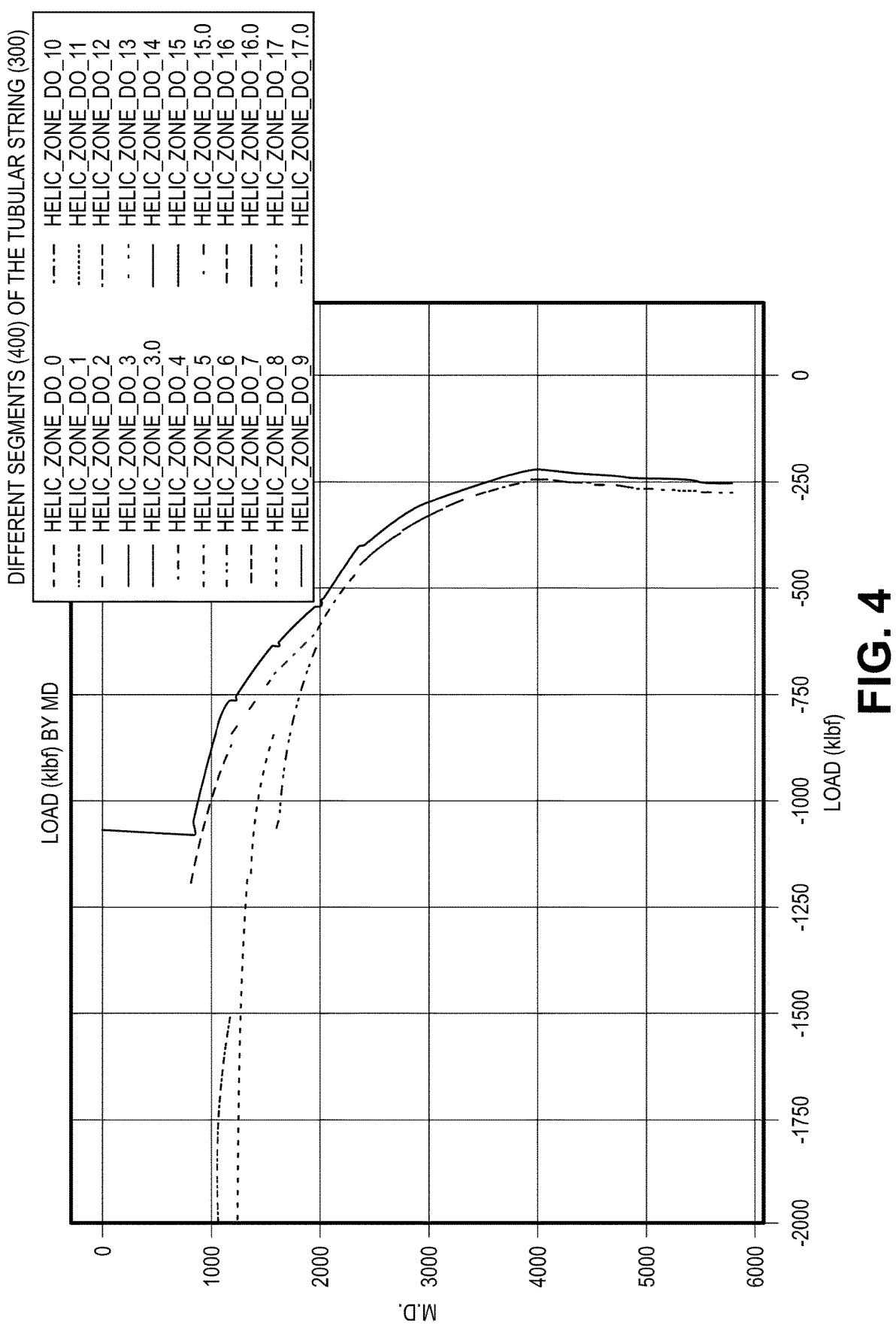
FIG. 4 illustrates a graph showing a plurality of segments of the buckling zone, according to an embodiment.

The series of operations may also include splitting the possible buckling zone 310 into a plurality of segments, as at 225. The segments may be independent fixed-length segments. In an example, each segment may be from about 300 feet to about 400 feet. FIG. 4 illustrates a graph showing a plurality of segments 400 of the buckling zone 310, according to an embodiment.

The series of operations may also include performing a second FEA on one or more of the segments 400, as at 230. In one embodiment, the second FEA may be performed on a lowermost of the one or more segments 400 that has not been processed before (i.e., has not had the second FEA performed on it yet). For example, the second FEA of the first iteration of the series of operations may be performed on the lowermost of the one or more segments 400 (e.g., closest to the drill bit), the second FEA of the second iteration of the series of operations may be performed the segment directly above the lowermost segment, and so forth until, the top of the possible buckling zone 310 or the top of the tubular string 300 is reached. The second FEA may be or include a non-linear FEA.

The series of operations may also include refining a grid size to improve convergence of the second FEA performed on the one or more segments 400, as at 235.

The series of operations may also include determining one or more second properties of the tubular string 300 based upon the second FEA, as at 240. The one or more second properties may be the same as, or different from, the one or more first properties. For example, the one or more second properties may be or include the axial load, the torque and bending moment, or a combination thereof.

The series of operations may also include comparing the one or more first properties of the first (e.g., linear) FEA to the one or more second properties of the second (e.g., non-linear) FEA, as at 245. This may, for example, yield incremental changes of the axial load and/or the torque and bending moment.

The series of operations may also include applying the incremental changes to the first FEA to produce an updated first FEA, as at 250. More particularly, the incremental changes may be applied to the whole tubular string linear FEA model as an extra boundary condition. Compared to the whole drill string non-linear model (e.g., the second FEA), this shorter segment may have a better numerical stability in the sense of matrix condition value(s).

The series of operations may also include performing the updated first FEA on the tubular string 300 to produce a final result, as at 255. In one embodiment, the final result may indicate a new buckling zone in the tubular string 300 (i.e., a buckling zone not identified at 220 above). If a new buckling zone is identified, the method 200 may loop back (e.g., to identifying a possible buckling zone at 220). If no new buckling zone is identified, the method 200 may proceed to 260 below. The loop and/or iterations may cease when no further buckling zones are found and/or the uppermost segment of the tubular string 300 has been processed. One or more portions of the method 200 (e.g., 215-255) may be repeated on each of the segments, one-by-one, proceeding from the bottom of the tubular string 300 to the top of the tubular string 300. Each segment adds an extra boundary condition to the whole tubular string 300. The whole tubular string 300 combines each of the segments 400 to produce the final result.

The method 200 may also include displaying the final result, as at 260.

The method 200 may also include performing a wellsite action, as at 265. The wellsite action may be based upon the updated first FEA, the final result, the new buckling zone, or a combination thereof. The wellsite action may be or include generating and/or transmitting a signal (e.g., using a computing system) that instructs or causes a physical action to occur at a wellsite. The wellsite action may also or instead include performing the physical action at the wellsite. The physical action may include selecting where to drill a wellbore, drilling the wellbore, varying a weight and/or torque on a drill bit that is drilling the wellbore, varying a drilling trajectory of the wellbore, varying a concentration and/or flow rate of a fluid pumped into the wellbore, or the like. The physical action may also or instead include varying a weight and/or torque on the tubular string 300.

In an embodiment, a mesh refinement may be adaptively introduced in a single segment solution. If this single segment solution is still not convergent in a very low possibility, this further increases solution reliability.

Typical Case Validation

Figure 5:
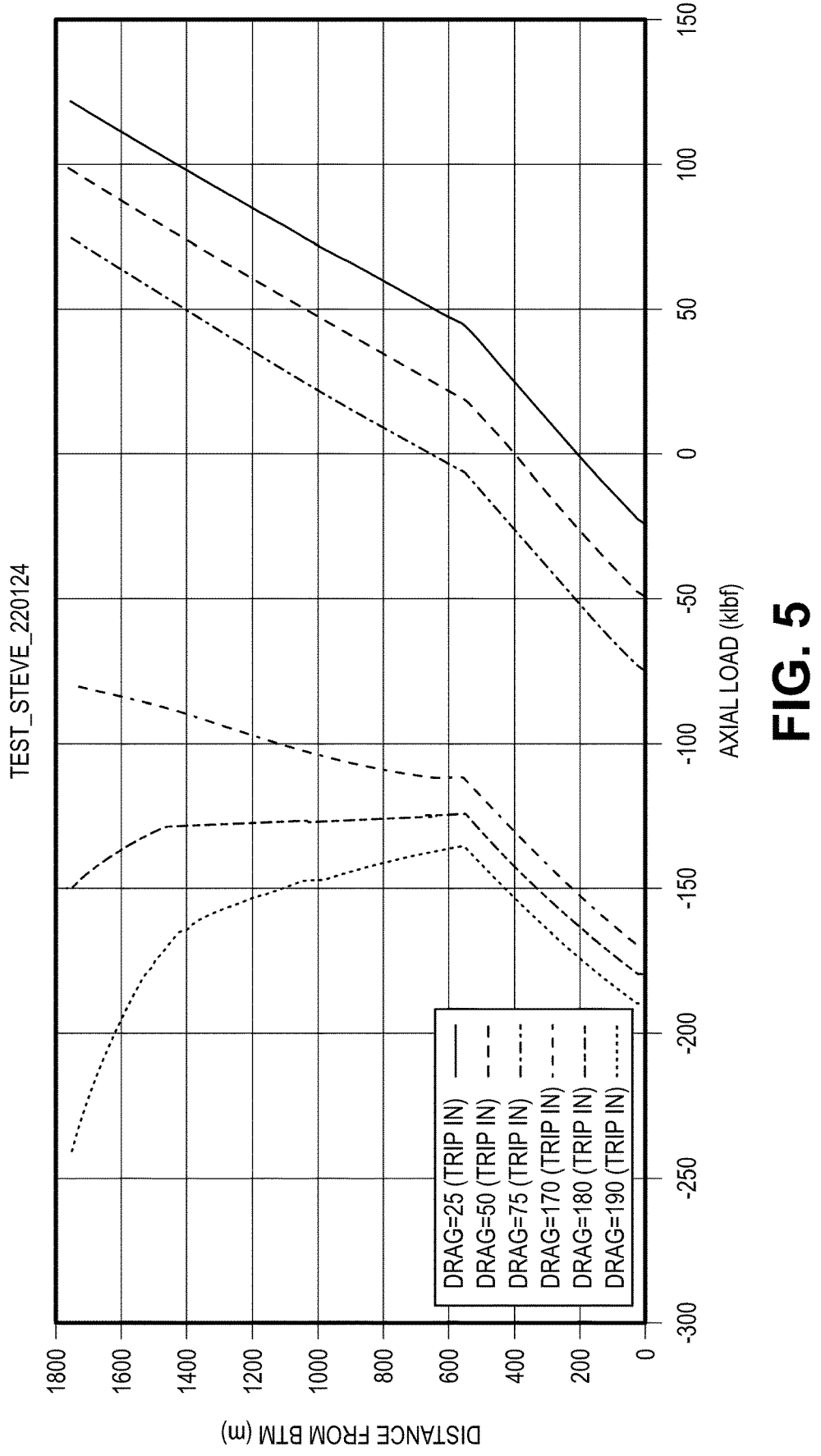
FIGS. 5 and 6 illustrate graphs showing a result of the method including part of the result curves for pair comparison, according to an embodiment.
Figure 6:
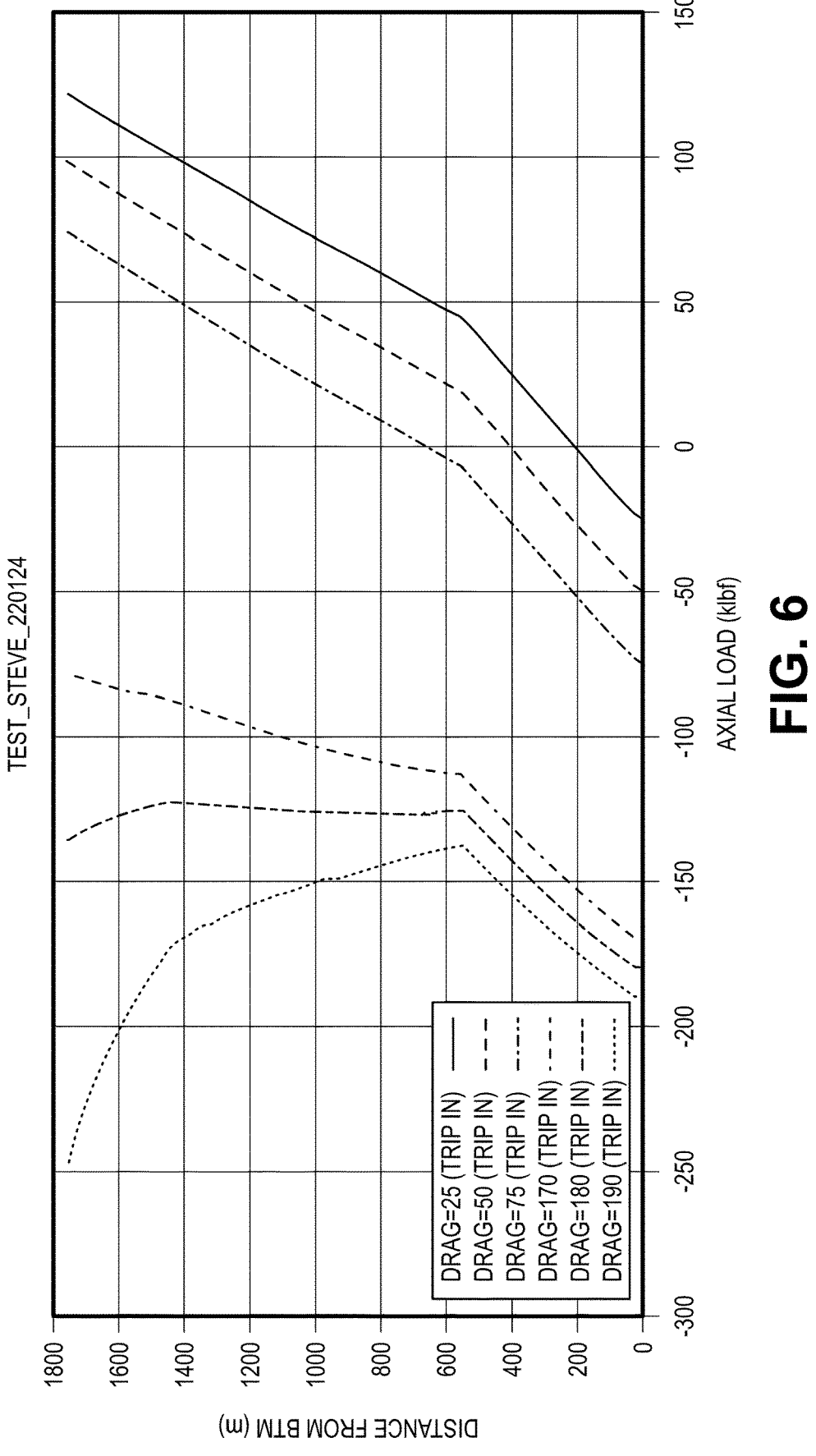

FIGS. 5 and 6 illustrate graphs showing a result of the method 200 including part of the result curves for pair comparison, according to an embodiment. An example of a T&D baseline result of axial force is provided below. In this example, when drag force>190 klbf, the solution fails due to a convergence issue. The six cases are very close, considering the numerical stability essence of buckling solution.

TABLE 1

| Case info. | Top axial force | | Relative |
| --- | --- | --- | --- |
| | Base line | Current idea | error (%) |
| Drag = 25 klbf | 122.925 | 122.47 | −0.37% |
| Drag = 50 klbf | 99.134 | 98.784 | −0.35% |
| Drag = 50 klbf | 75.091 | 74.772 | −0.42% |
| Drag = 170 klbf | −80.195 | −78.53 | −2.08% |
| Drag = 180 klbf | −150.49 | −138.49 | −7.97% |
| Drag = 190 klbf | −243.312 | −247.653 | 1.78% |

Figure 7:
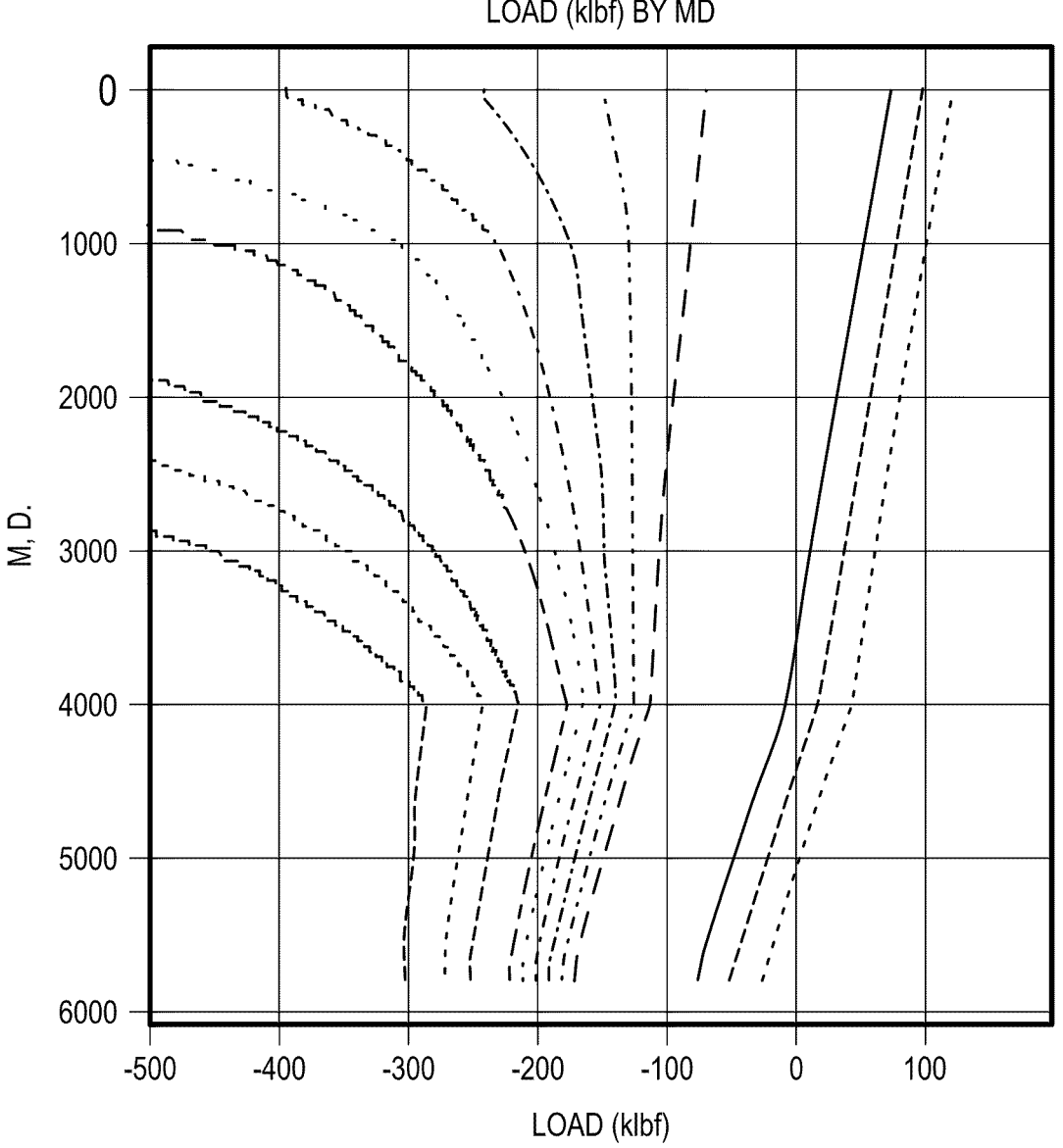
FIG. 7 illustrates another graph showing a result of the method, according to an embodiment.

FIG. 7 illustrates another graph showing a result of the method 200, according to an embodiment. When the drag force is extended to a larger scope, the solutions still converge, and the curves show a consistent trend between each other. This proves the method's reliability and good accuracy.

Simulating Drillstring Dynamics Motion and Post-Buckling State with Advanced Transient Dynamics Model As drilling sections become deeper and longer, they transfer more weight downhole to improve the rate of penetration. Drillstring dynamics and buckling are some limiters for drilling efficiency. Aggressive drilling parameters may lead to severe downhole dynamics, which leads to cutter breakage and/or tool damage. When axial compression exceeds a certain threshold, the drillstring buckles sinusoidally inside the wellbore first, followed by helical buckling. Buckling leads to accelerated joint wear, tool fatigue failures, and lower drilling efficiency. To better manage drillstring dynamics and buckling, the method 200 may be used to simulate drillstring dynamics motion and a post-buckling state using an advanced transient dynamics model.

An analysis methodology was developed on the basis of the finite element transient dynamics model. The model captures the enriched physics of drillstring dynamics and loading: the large deformation of buckled drillstring, the strong nonlinearity of contact and friction forces, and the dynamically triggered instability caused by drilling rotation. Transient dynamics simulations are conducted for drillstring with the actual well trajectory and rotation speed. The weight on bit (WOB) is ramped up gradually, and the drillstring deformation is monitored to detect the onset of buckling or dynamics instability.

To conduct the model validation, the buckling inception loads predicted by the model may be compared against the analytical equation of buckling loads. A field extended reach drilling (ERD) job may be simulated by the model. The downhole weight and torque data from the measurement-while-drilling (MWD) tool may be used to validate the weight transfer prediction by the model. Most conventional buckling theories use the analytical equations of the buckling load, which are normally derived on the basis of the idealized assumptions, such as perfect wellbore shape and uniform tubular geometry. However, the method 200 simulates the drillstring behaviors in the field drilling conditions and aims to capture effects of wellbore friction and string rotation. The transient dynamics model may be capable of simulating drillstring dynamics movement (e.g., whirling and/or snaking) and weight lockup under severe helical buckling. The method 200 may also interpret the drillstring behaviors from the simulation results. Using the transient dynamics model, the method 200 can simulate the dynamics and buckling behaviors of drillstring and help mitigate associated risks in well planning and execution phases.

More complex ERD wells have been planned and drilled in the last decade. Horizontal sections of the well may include slimhole configurations. To improve drilling effi- ciency, the operator may apply more weight and/or higher rotation speed. The excessive axial compression may lead to buckling of the drillstring. One challenge in well construc- tion is the difficulty of transmitting the axial weight to the bit when buckling occurs. When severe helical buckling occurs, tubulars can experience excessive deformation and wellbore contact, which may lead to various failures, like the prema- ture wear of tool joints, over-torque issues, and bending fatigue damage. The high rotation speed and wellbore fric- tion drag may drive the system into dynamics instability, such as snaking and whirling. The adverse vibrations can cause bit breakages, connection twist-offs, and MWD fail- ures. Dynamics centrifugal force can amplify the lateral deflection and contact force of drillstring. A model account- ing for the buckling deformation and dynamics movement of drillstring may help provide drilling risk mitigation and efficiency improvement. Buckling is a phenomenon in which the drillstring suddenly loses the lateral stability under high axial compression.

Figure 8B:
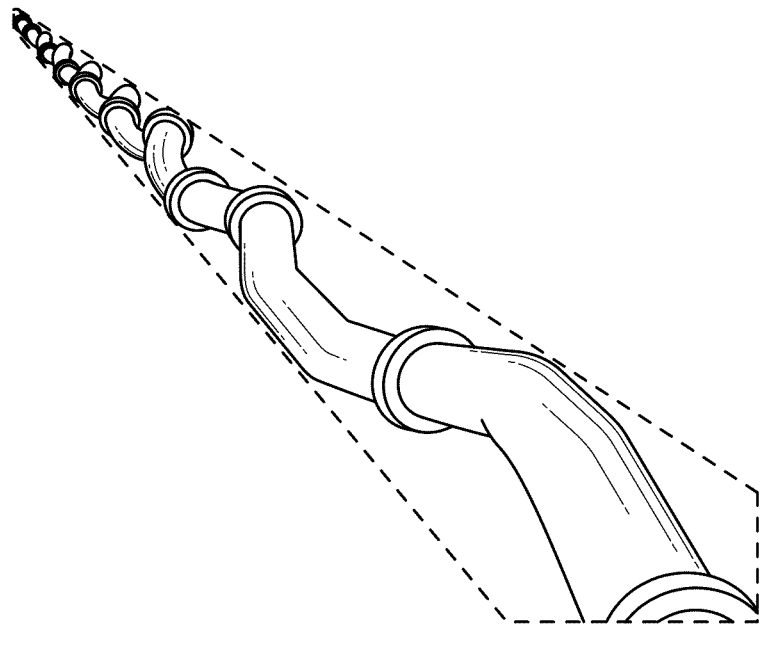
FIGS. 8A and 8B illustrate drillstring buckling modes, according to an embodiment.
Figure 8A:
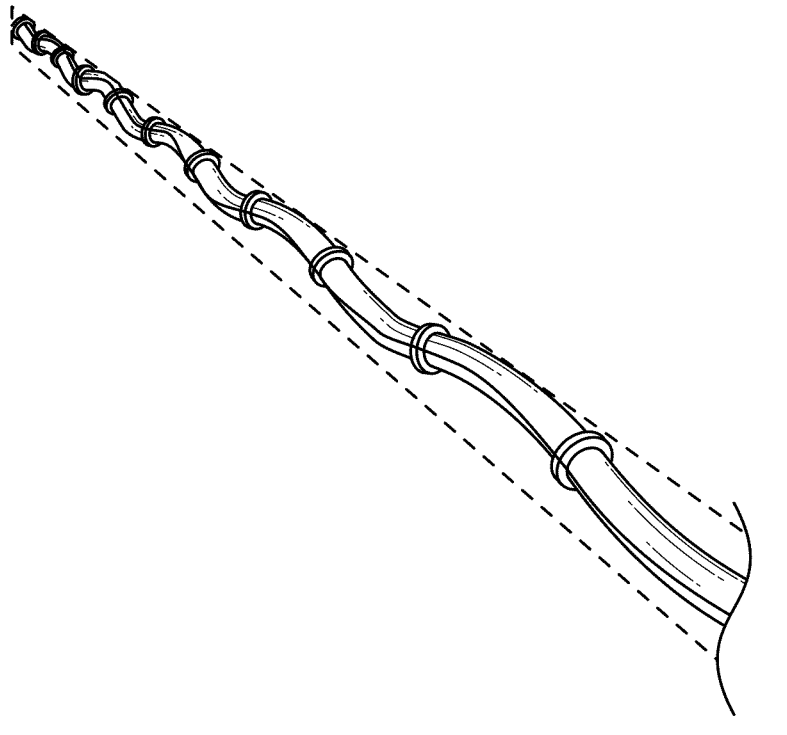

FIGS. 8A and 8B illustrate drillstring buckling modes, according to an embodiment. More particularly, FIG. 8A shows a sinusoidal mode, and FIG. 8B shows a helical mode. Normally, the drillstring first buckles sinusoidally inside the wellbore when axial compression exceeds a threshold called the sinusoidal buckling limit, and then deforms to a helical shape when the axial force further increases. In the present buckling prediction method, the torque and drag (T&D) model may be used to calculate the axial force distribution. The T&D model can be based on the soft-string, stiff-string, or static finite element method (FEM). The buckling may be flagged at tubular locations where the predicted axial force crosses the buckling limit force calculated from analytical equations.

The derived equation for the buckling limit force is:

$$F_{sin,vertical} = 1.94(EI)^{1/3} w_e^{2/3} \tag{1}$$

where EI is the bending stiffness, and we is the equivalent wet pipe weight in unit length. The limit forces for sinusoi- dal and helical buckling are:

$$F_{sin,incline} = 2\sqrt{\frac{EI w_e \sin\theta_i}{r_c}}, \ F_{hel,incline} = 2(2\sqrt{2} - 1)\sqrt{\frac{EI w_e \sin\theta_i}{r_c}}, \tag{2}$$

where $r_c$ is the pipe radial clearance, and hi is the inclination angle of the wellbore.

An example of an analytical equation for the sinusoidal buckling limit force in a building section with constant curvature is given in Eq. 3.

$$F_{sin,build-curve} = \frac{4EI}{r_c R}\left(1 + \sqrt{1 + \frac{r_c R^2 w_e \sin\theta_i}{4EI}}\right) \tag{3}$$

Here, R is the radius of wellbore curvature. An analytical equation for contact force increment caused by helical buckling of tubular in an inclined/horizontal wellbore is:

$$F_{cont,hel} = \frac{r_c F_a}{4EI} \tag{4}$$

Equation 4 gives the contact force increment over a unit pipe length, where Fa is the axial force. A perturbation solution may be obtained to describe the dynamic snaking motion of the rotating pipe, which correlates well with the experimental results. It shows that rotation speed does not affect the critical load of dynamic buckling. A fourth order differential equation for tubular buckling may be solved by the principal of virtual work and energy conservation. Fric- tion effect on buckling critical force and post-buckling configurations of tubular were studied without considering the dynamic effect. Without the pipe rotation, the proposed model shows that the transverse friction can increase the buckling force by 30 to 50%.

An experimental study has been conducted to investigate the tool joint effect on the buckling/post-buckling behaviors of drillstring in a straight horizontal well. It shows that the tool joint has no effect on the sinusoidal buckling limit force but can increase the helical buckling limit force by 20%. The tool joint also helps improve the axial force transfer effi- ciency. The post-buckling string deformation and weight transfer may be measured using a high accuracy continuous gyro inside the drillpipe and weight subs at the surface and downhole. This shows that the pipe tool joint has consider- able effects on the buckling wavelength and the onset of lockup. The equation-based method is fast to compute, and the interpretation of results is intuitive. However, analytical equations are derived on the basis of idealized assumptions, such as perfect wellbore shape, long uniform drillstring without tool joints, specific boundary conditions, and neglect of friction or dynamic effect of rotating tubular.

Fruitful researches have been conducted to incorporate more influencing factors in the tubular buckling forces and post-buckling configurations through an analytical approach. However, it is difficult to consider the physics of tubular buckling in a single analytical solution. The equa- tion-based method can give satisfactory buckling prediction for specific and idealized cases. A numerical model may be a more practical approach of investigating tubular buckling and can help assess the contact force/bending moment increment in the post-buckling stage under a more general field operation environment.

The explicit FEM may be used to solve the challenging nonlinear buckling behaviors of drillstring in straight and curved wellbore. The transient dynamics model of a drill- string in the lateral section of a well may be developed on the basis of the nonlinear FEM. Two different lateral vibra- tion modes may be observed in the simulation: snaking and whirling. These vibration modes can be treated as the dynamic equivalents for the sinusoidal and helical buckling in the static analysis. Mathematically, sinusoidal buckling is snaking with zero frequency. Because of the limited com- putation power available and the complexity of the model, it was very time-consuming to run a transient dynamics model. The 3D nonlinear dynamics model was developed to solve dynamic behaviors of drillstring. The model may be used to study the effects of rotation speed, friction, and connectors on the buckling limit forces and post-buckling behaviors. It shows that the contact force increases dramati- cally when dynamic whirl or helical buckling occurs. A dynamic FEM of coiled tubing was used to evaluate the onset of buckling modes, post-buckling configurations, and lock-up behaviors when slacking off the coiled tubing. The T&D calculation may be performed using the new dynamic drillstring model. The model can capture the contact force and local stress in the high dogleg wellbore or when helical buckling occurs. Moreover, compared with the static model, the explicit dynamic approach has better convergence performance.

The method 200 analyzes drillstring dynamics motions and a post-buckling state. A finite element-based transient dynamics model acts as the backbone for this method 200. The model captures the components for dynamics motion and buckling prediction: the wellbore contact friction, tubular rotation, dynamic loading, and the strong nonlinear coupling between lateral and axial pipe deformation. Transient dynamics simulations may be conducted with actual drillstring, well trajectory (e.g., micro-tortuosity can be included), and drilling parameters. This method 200 enables more realistic predictions of drillstring movement and deflection under the real field drilling conditions. The method 200 may be automatic and may interpret drillstring behaviors on the basis of the displacement prediction.

Method—Numerical Model of Drillstring

A drillstring is a long and slender assembly composed of various tubulars and drilling tools with complex geometry. It is subjected to complex loading conditions such as T&D, gravity, wellbore contact, friction, and dynamic inertia force caused by rotation. To account for the influences of those factors, an FEM-based numerical model may be used to solve dynamics movement and buckling deflection of the drillstring. The model is an advanced drilling system model that is capable of predicting the static and dynamic responses of the drillstring. The model may be used by service companies in many applications for bit selection, bottomhole assembly (BHA) design, drilling parameters optimization, and post-well analysis and validation on the basis of field data. Extensive laboratory single cutter tests were conducted with different cutter shapes, formation types, and confining pressures. The rock-mechanics data from the single cutter test is applied to the full bit model to capture the bit-rock interaction. Thus, the bit behaviors, such as torque, weight, depth of cut, and dynamics excitation, can be accurately calculated.

Figure 9:
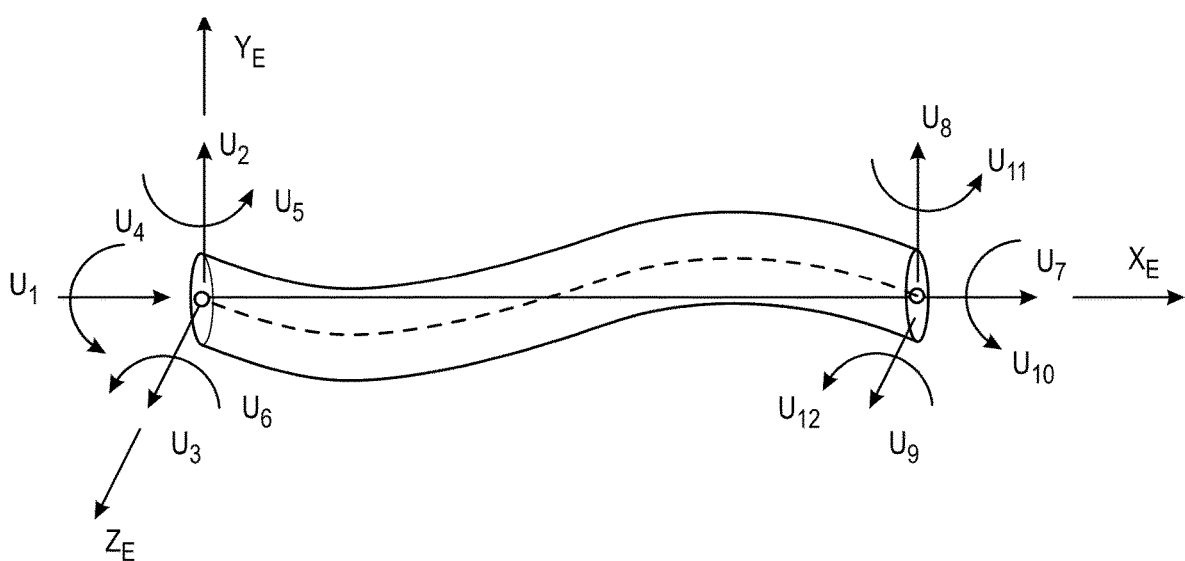
FIG. 9 illustrates a schematic view of a 3D beam element used in the drillstring model, according to an embodiment.

FIG. 9 illustrates a schematic view of a 3D beam element used in the drillstring model, according to an embodiment. The beam element is the basic building block of 3D drillstring model in FEM. Each node of the beam element has six degrees of freedom (DOFs), including three translations and three rotations. The nonlinear coupling between torsional and bending DOF is considered in the FEM formulations, and the robust implicit FEM engine enables the simulation of large deformation of tubulars under confinement of the wellbore.

Figure 10A:
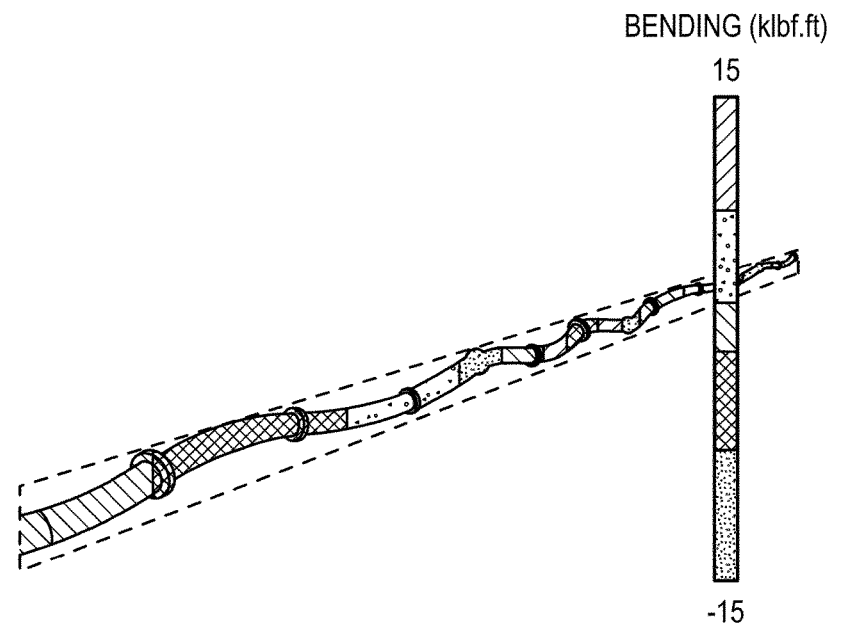
FIGS. 10A-10C illustrate simulation results of the drill-string model, according to an embodiment.
Figure 10B:
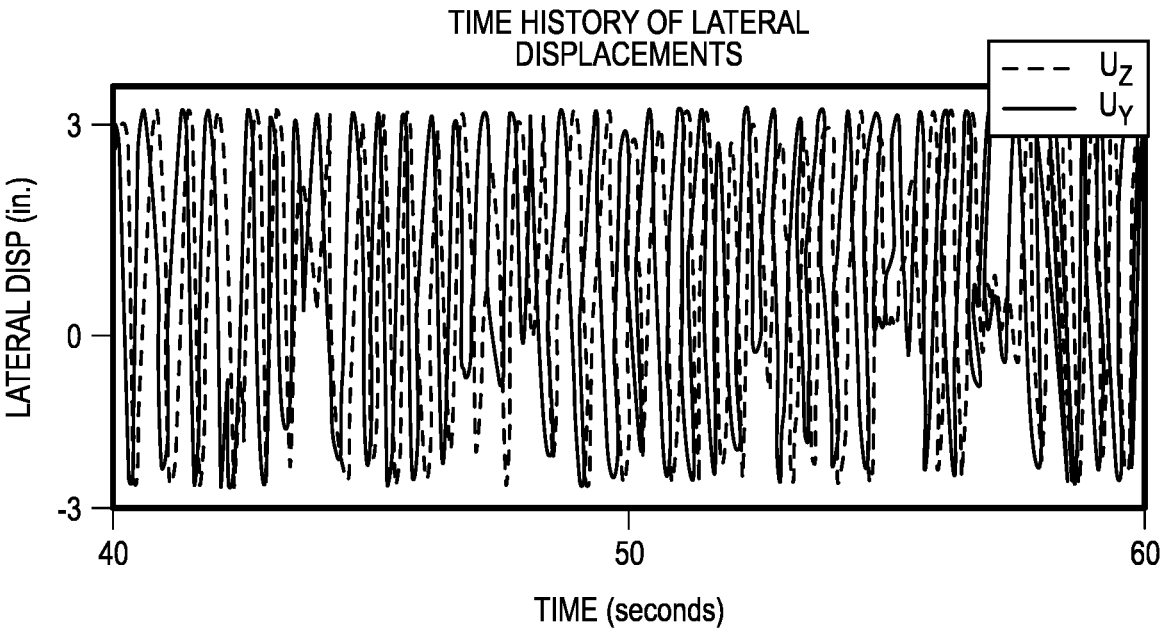
Figure 10C:
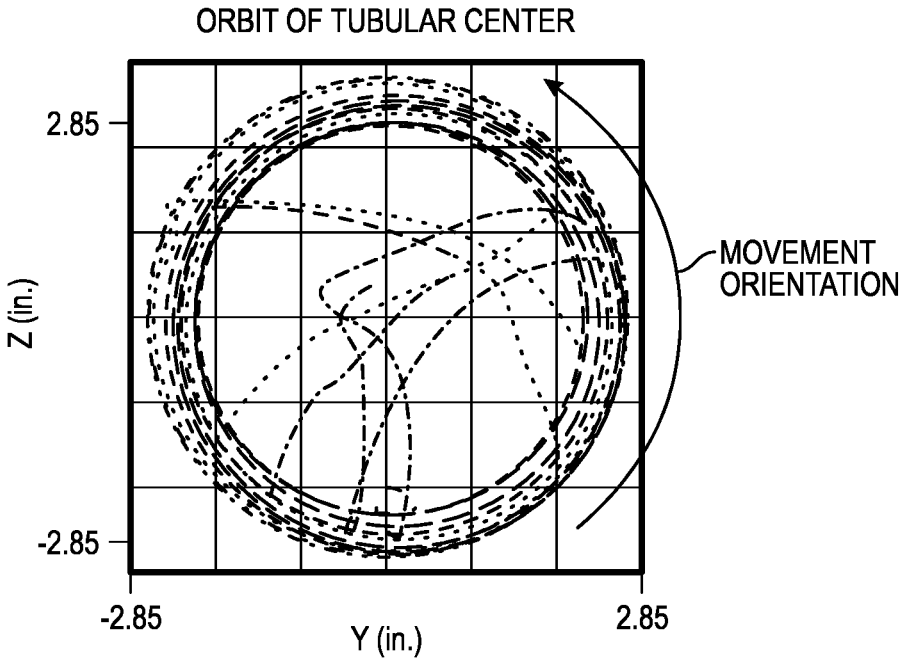

FIGS. 10A-10C illustrate simulation results of the drillstring model, according to an embodiment. More particularly, FIG. 10A illustrates a 3D snapshot of tubular deflection. The lines are the contact force, and the contour is the bending moment. FIG. 10B illustrates a time history plot of two lateral displacements. FIG. 10C illustrates an orbit of tubular center. The arrow shows the orientation of tubular center movement. In FIG. 10A, the lines indicate the magnitude and orientation of contact forces. It implies severe lateral deflection occurs in the drillstring, and the contact can be found at both tool joint and pipe body. By predicting the dynamics movement and post-buckling configuration, the model may be capable of computing the tubular loading under complex drilling conditions. The contour of the 3D plot shows the magnitude of bending moment. It can be used to evaluate the fatigue damage accumulation of crooked tubulars under rotation. At a given location of the drillstring, the history of lateral displacements and the orbit of tubular center in a 20-second time window are plotted in FIGS. 10B and 10C. It indicates the drillstring has backward whirl motion [i.e., the center orbit movement direction (counter-clockwise) is opposite to the tubular self-rotation direction (clockwise)].

Static and Transient Dynamics Drilling Models

Depending on the FEM formulations, the drilling model can be categorized into two types: static and transient dynamics. In the static model, it is assumed that the drillstring keeps stationary in the wellbore, and the static tubular deformation and wellbore contact forces are determined. After the typical FEM procedure, the drillstring mechanics behavior can be described by the static equilibrium equation:

$$[K]\{U\} = \{F\} \tag{5}$$

where [K] is elasticity stiffness matrices, and fUg and fFg are the displacement and external force vectors of the drillstring, respectively.

Figure 11A:
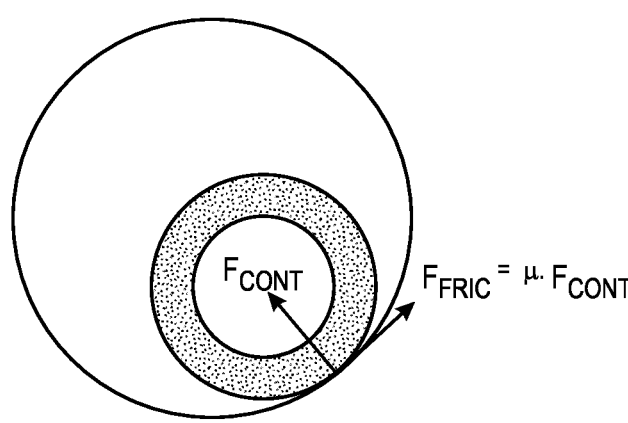
FIGS. 11A and 11B illustrate contact and friction models, according to an embodiment.
Figure 11B:
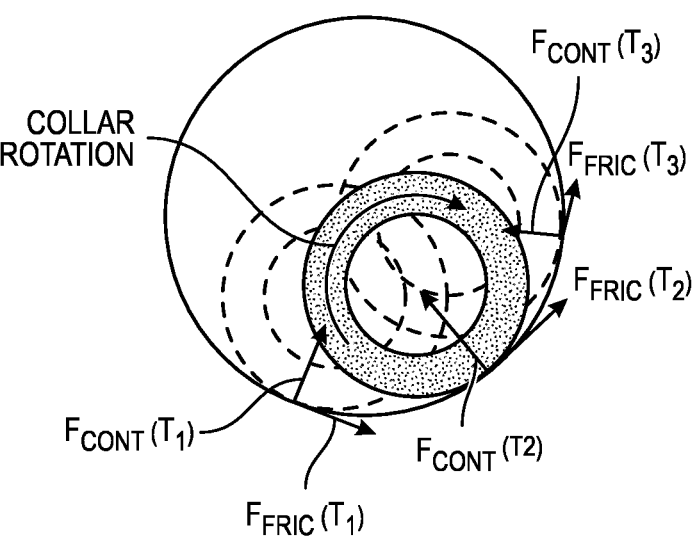

FIGS. 11A and 11B illustrate contact and friction models, according to an embodiment. More particularly, FIG. 11A illustrates a static model, and FIG. 11B illustrates a transient dynamics model. The static equilibrium can be solved by the implicit method iteratively. The drillstring does not rotate in the static model. To account for the contact friction, a static external force equaling the Coulomb friction is applied at the contact point. Its direction is the opposite of the direction of rotation of the tubular (FIG. 11A). The static model cannot consider the effect of drillstring rotation and dynamics loading.

The transient dynamics model simulates the rotation of the drillstring and enables the drillstring to move freely inside the wellbore. There is no assumption made on the external force and contact location of the drillstring. The system transient response is governed by the following dynamics equilibrium equation:

$$[M]\{\ddot{U}(t)\} + [C]\{\dot{U}(t)\} + [K]\{U(t)\} = \{F(t)\} \tag{6}$$

where [M] and [C] are FEM mass matrix and damping matrix, and f_Ug and f€ Ug are the velocity and acceleration vectors, respectively.

At each timestep, the equilibrium equation may be solved by the implicit method. The transient time history of force and tubular displacement can be solved by a numerical integration technique such as the Newmark method. The proportional damping model is adopted here to capture the mud viscous damping and pipe material damping. The damping matrix may be expressed as a linear combination of the mass and stiffness matrices. The contact is established when the lateral displacement of the tubular exceeds the gap of tubular and wellbore. The spring-dashpot type model may be used to describe the relation of contact force magnitude and interference depth. The contact force may be solved iteratively by matching the tubular deflection and external contact force. The friction force may be calculated on the basis of the friction coefficient and normal contact force and is applied in the direction opposite to the relative motion. The model can define different static and dynamic friction coefficients. The transient dynamics model can accurately simulate the dynamic behavior of the drillstring, such as the lateral swing of the tubular caused by the pipe rotation (FIG. 11B). When severe buckling deformation occurs in the tubular, the increased contact force may lead to string lock-up inside the wellbore. Rotating the crooked string actually makes the tubular roll around the wellbore. From the dynamics perspective, the string possesses the backward whirl motion. The transient model may be capable of capturing the deflection caused by buckling and dynamics snaking/whirling motions.

Simulation Workflow and Result Interpretation

The transient drilling dynamics model may account for the influencing factors of drillstring dynamics motion and buckling under actual field drilling conditions. First, the field job application data is collected, such as the drillstring and BHA configuration, casing profile, well survey, and drilling parameters. A transient dynamics simulation is then performed using the data. The WOB in the simulation can be ramped up to determine the inception of dynamics and buckling.

In the conventional equation-based buckling analysis method, the buckling mode and buckled tubular location are determined by comparing the string axial force with the corresponding buckling limit forces computed from the analytical equations. The buckling force and post-buckling shape can be determined through the finite element linear buckling analysis, also known as eigenvalue-based buckling analysis. Eigenvalue analysis estimates the upper bound of the buckling load (e.g., bifurcation load), and the eigenvector provides the corresponding buckling mode shape. Similar to modal analysis, eigenvalue analysis shows the normalized deformed shape of the buckled structure. To obtain the actual tubular deformation magnitude after buckling, the nonlinear buckling analysis may be performed. In the present disclosure, the FEM-based transient dynamics model may be used to predict the buckling load and post-buckling shape. In the model, the actual loading history can be applied in multiple steps rather than in a single step as in a linear analysis. The effects of the loading application sequence and ramping up speed of surface rotation speed and weight can be evaluated. The transient dynamics analysis can also handle nonlinearities coming from the large deformation and irregular contacts of buckled tubular. For the linear buckling analysis, theoretically, it is possible to calculate as many buckling modes as the number of DOFs in FEM. It may predict multiple post-buckling configurations after passing the helical buckling load. By applying the actual loading history in the transient dynamics model, the transient history of tubular displacement can be simulated. After the simulation runs a sufficient length of time and reaches a relatively steady state, a user can analyze the results to determine dynamics motions and buckling modes of tubular corresponding to the given loading history.

The transient dynamics model predicts the time history of displacements and forces of the tubular. When the drillstring has sinusoidal buckling under the ramped up axial compression, it may start to swing back and forth (snaking motion) with respect to the static sinusoidal buckling configuration because of the dynamic effect of pipe rotation. The position angle (see the definition in FIG. 7) of sinusoidal buckling and snaking motion of pipe can be expressed by Eq. 7, $$\theta(x) = A_\theta \cdot \sin\left(\frac{2\pi}{p}x\right) \tag{7}$$

-continued
$$\theta(x, t) = A_\theta \cdot \sin\left(\frac{2\pi}{p}x\right) \cdot \cos\left(\frac{2\pi}{T}t\right)$$

where p is the spatial period of sinusoidal buckling, and T is the snaking motion period. The sinusoidal buckling can be treated as the snaking motion with zero frequency. After further increasing the axial compression, the tubular buckles helically, and the contact force increases significantly. The tubular tends to roll around the wellbore when rotating pipe.

From the dynamic motion point of view, the tubular has the whirl motion. Similarly, the position angle of helical buckling and whirl of pipe can be expressed by Equation 8.

$$\theta(x) = \frac{2\pi}{p}x, \tag{8}$$

$$\theta(x, t) = \frac{2\pi}{p}x + \frac{2\pi}{T}t.$$

Here, p is the pitch distance of helical buckling, and T is the whirl motion period. One focus of the method 200 is on the amplitude of displacement to evaluate severity of tubular deformation. The snaking and whirl motion may be treated as the dynamic equivalents for the sinusoidal and helical buckling in the static analysis.

Figure 12A:
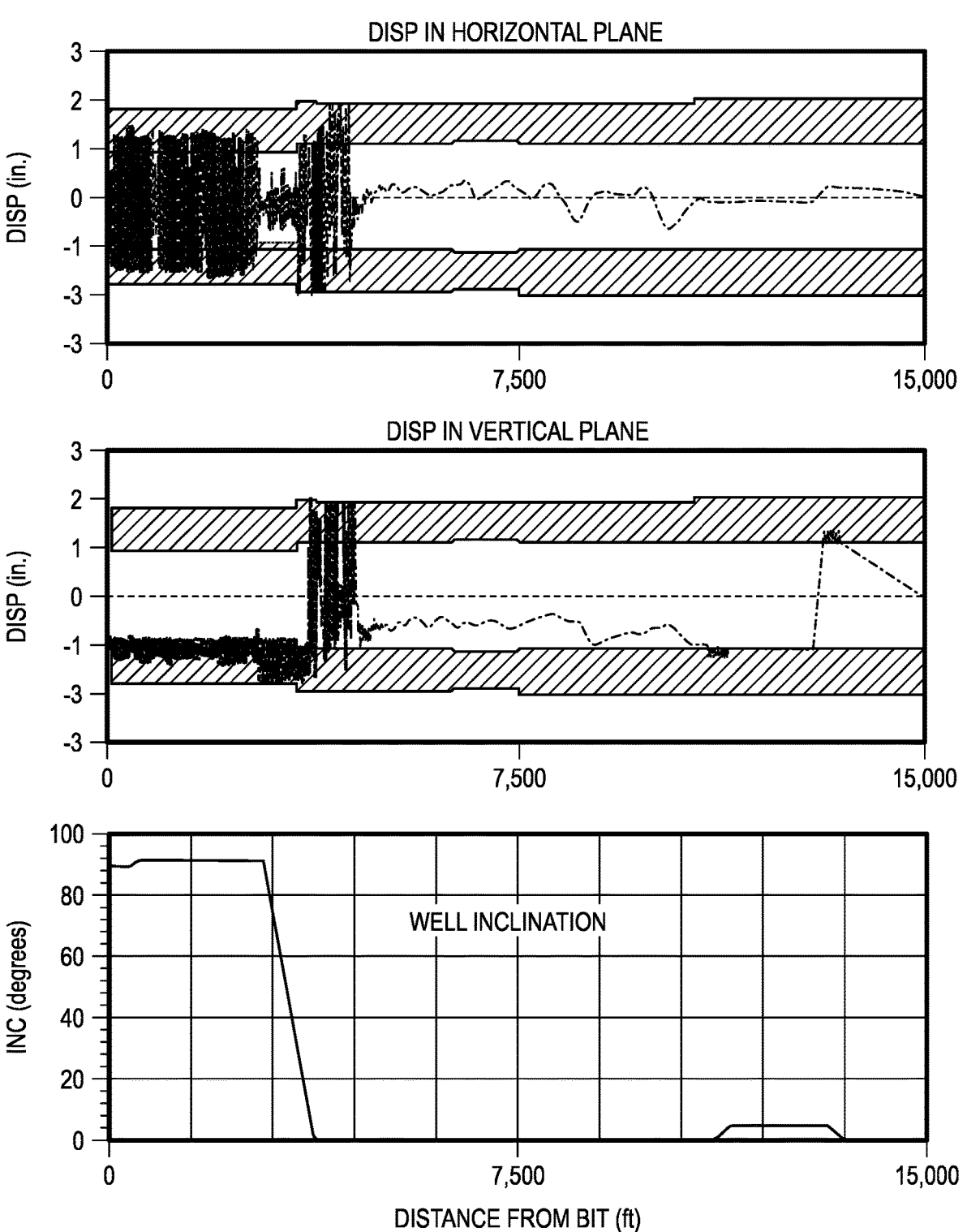
FIGS. 12A and 12B illustrate snapshots of drillstring displacement in a transient dynamics model, according to an embodiment.
Figure 12B:
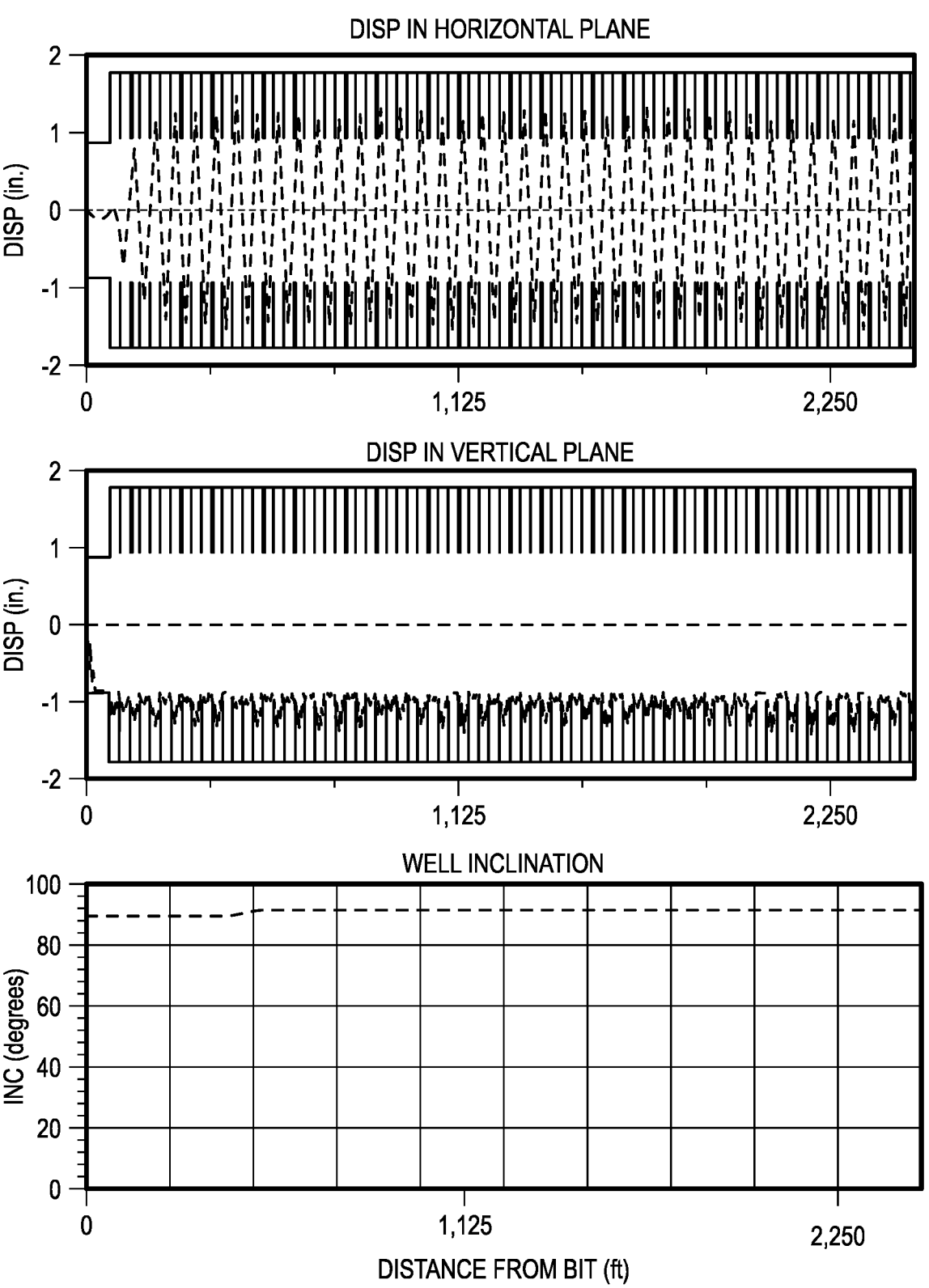
Figure 13A:
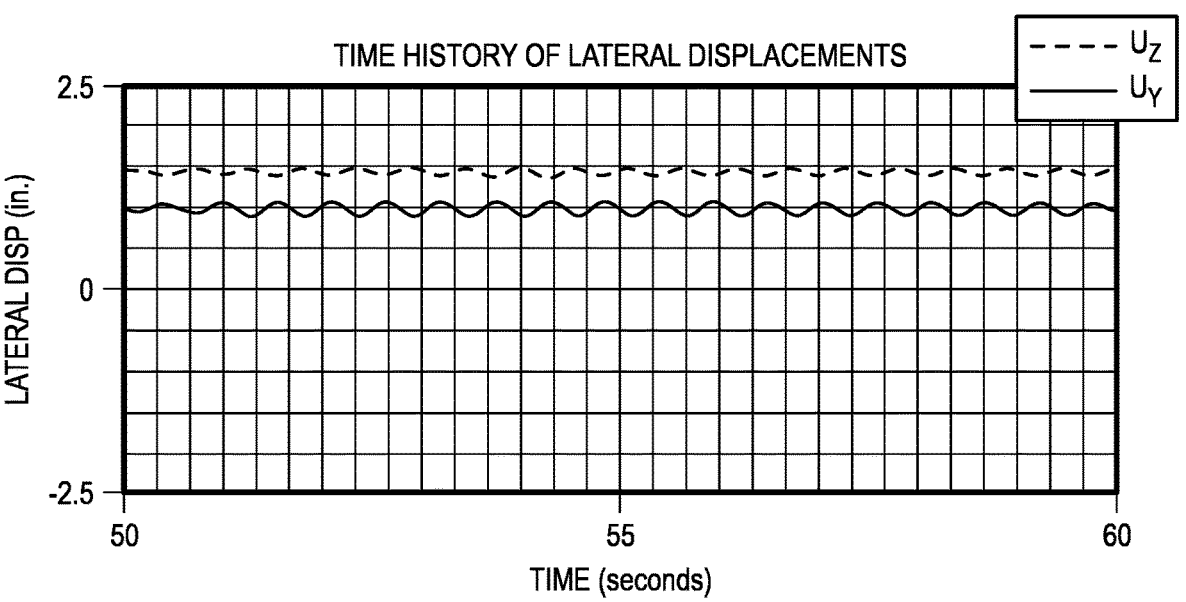
FIGS. 13A-13D illustrate history results of the transient dynamics model, according to an embodiment.
Figure 13B:
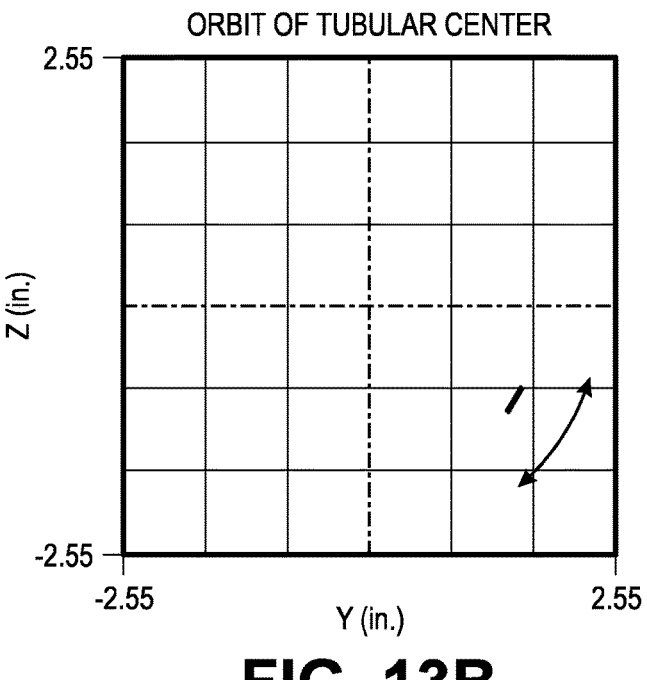
Figure 13C:
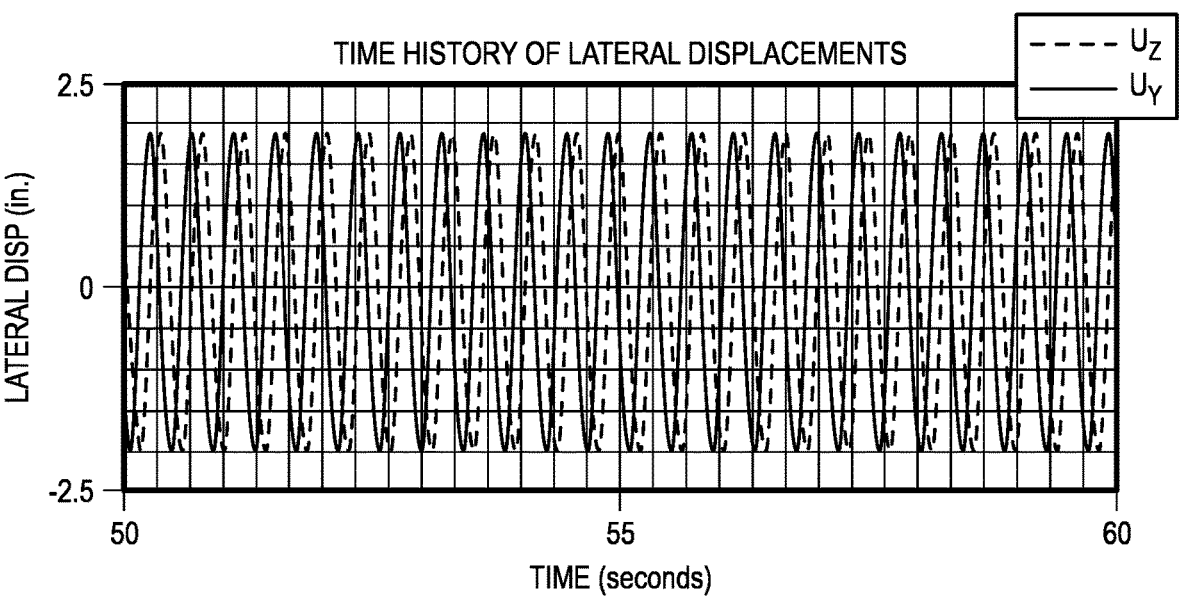
Figure 13D:
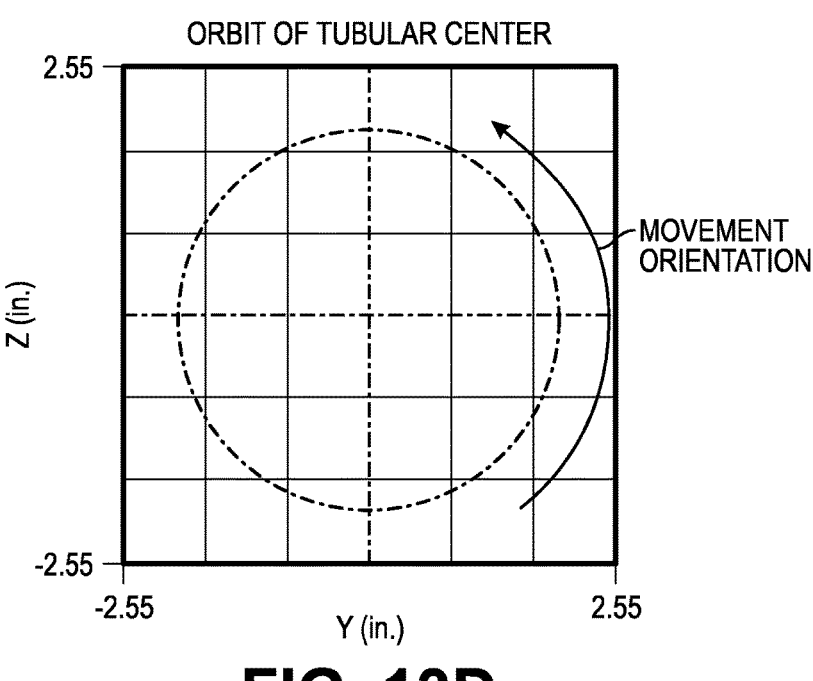

FIGS. 12A and 12B illustrate snapshots of drillstring displacement in a transient dynamics model, according to an embodiment. More particularly, FIG. 12A shows results of the full drillstring, and FIG. 12B shows results magnified in the lateral. FIGS. 13A-13D illustrate history results of the transient dynamics model, according to an embodiment. More particularly, FIG. 13A shows lateral displacements of the pipe at 740 feet from the bit, FIG. 13B shows a center orbit of the pipe at 740 feet from the bit, FIG. 13C shows lateral displacements at 3900 feet from the bit, and FIG. 13D shows a center orbit at 3900 feet from the bit. In this example, the drillstring includes a 6.75-in. collar, 5-in. heavy-weight drillpipe (HWDP), and 5-in. drillpipe. The 8.5-in. hole has a J-shape trajectory with the last 3,000 ft in the lateral. The drilling parameters are as follows: 100 rev/min with a WOB of 28,000 lbf. FIGS. 12A and 12B present the snapshot of drillstring lateral displacements in two orthogonal planes, where the black lines represent the original clearance between collar and wellbore. The left end is at the bit, and the right end is at the surface. FIGS. 13A-13D present the history plots of lateral displacements and center orbits of pipe at two locations of drillstring.

In the magnified view in FIG. 12B, the string deformed into a sinusoidal shape in the horizontal plane. The history plots of lateral displacement and center orbit (where the tubular shows the largest lateral deflection in the snapshot) in FIGS. 13A and 13B imply that the tubular has relatively small snaking motions near the equilibrium state (compared to the spatial amplitude of buckling deformation). This part of the drillstring can be considered to have sinusoidal buckling.

Per the analytical equation, the sinusoidal buckling may occur at the axial compression force of 50,000 lbf. The transient dynamics model predicts sinusoidal buckling as low as a WOB of 28,000 lbf. In the range of 3,500 to 4,500 ft from the bit in FIG. 12A, the drillstring deformation shows sinusoidal shapes in both horizontal and vertical planes. By looking at the history plots of displacements and center orbit in FIGS. 13C and 13D, the tubular has backward whirl motion in this depth range.

Figure 14A:
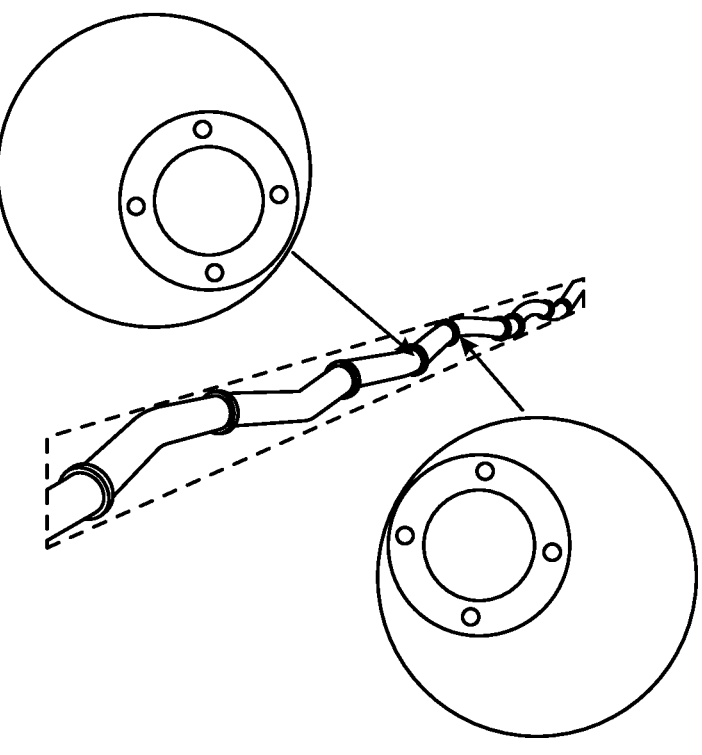
FIGS. 14A and 14B illustrate a definition of a tubular position angle in a wellbore, according to an embodiment.
Figure 14B:
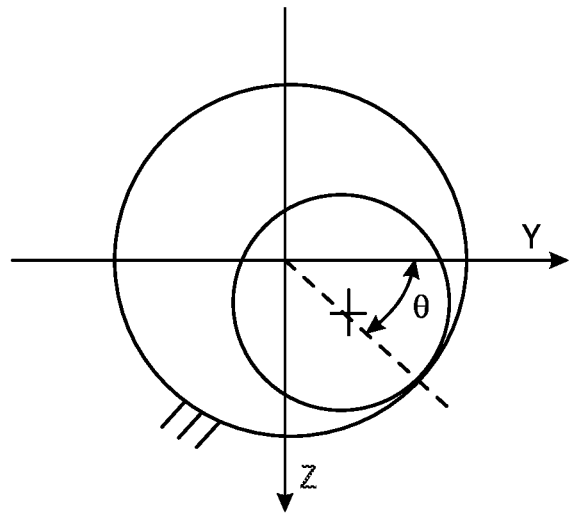

FIGS. 14A and 14B illustrate a definition of a tubular position angle in a wellbore, according to an embodiment. To make the result interpretation process more consistent and efficient, an automatic interpretation algorithm may be used to infer the drillstring behaviors from the digital simulation results of the transient dynamics model. First, the concept of tubular position angle may be introduced to quantitatively describe the angular location of pipe section inside the wellbore. In the cross-section plane perpendicular to the well tangent, a reference line is drawn connecting the well and pipe centers. The position angle may be defined as the angle between the horizontal axis and the center connecting line (FIGS. 14A and 14B). The position angle is able to show the circumferential position of the tubular with respect to the center of the wellbore.

Figure 15A:
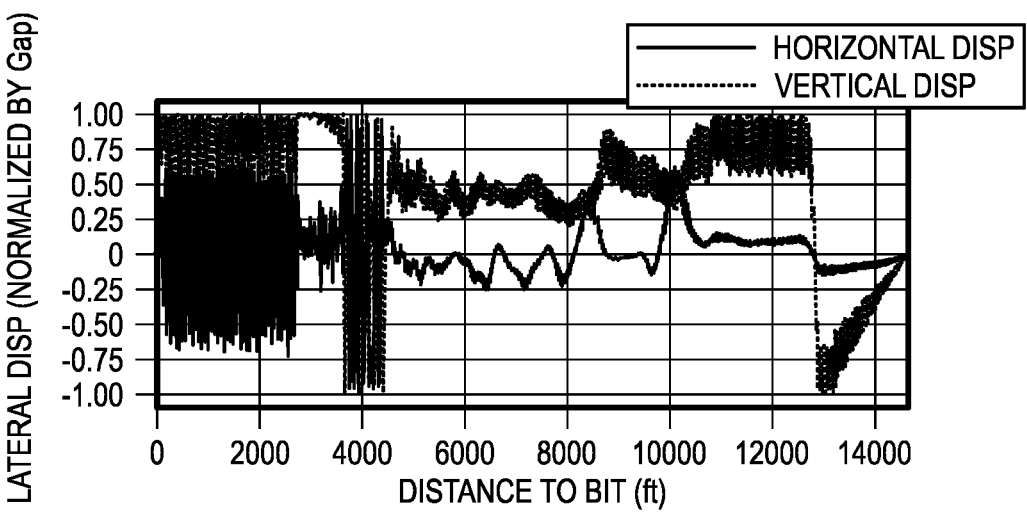
FIGS. 15A and 15B illustrate a drillstring deformation state inference, according to an embodiment.
Figure 15B:
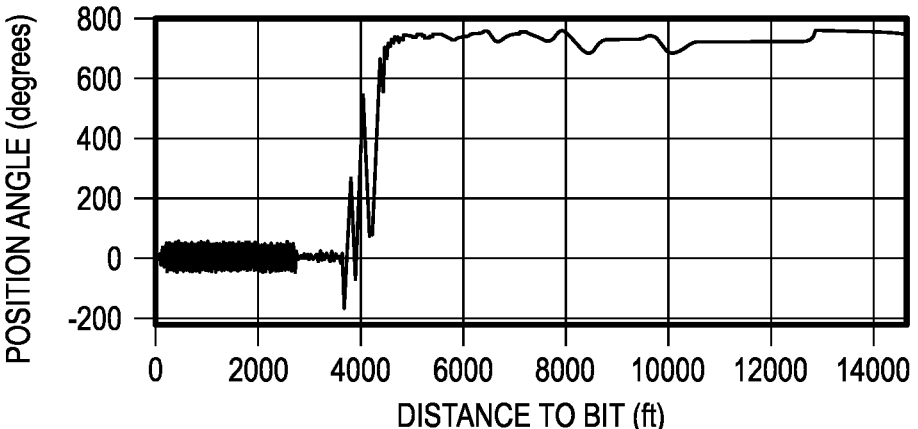
Figure 16A:
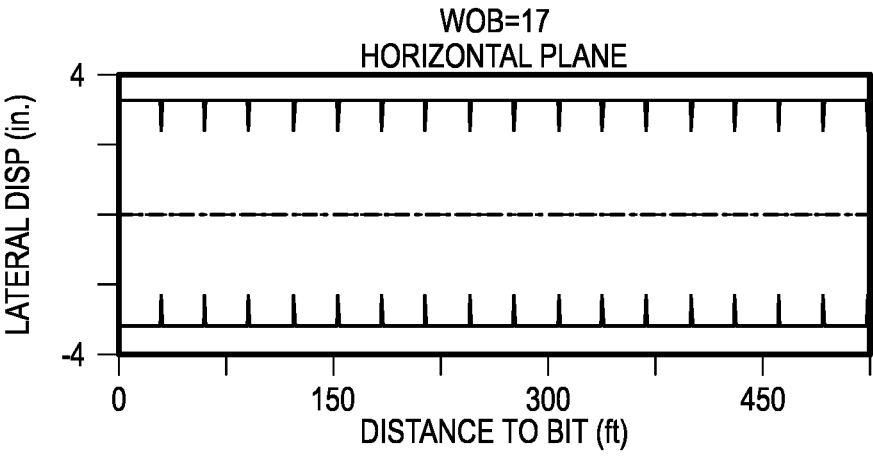
FIGS. 16A-16L illustrate model validation: predictions of sinusoidal and helical buckling inception loads, according to an embodiment.
Figure 16B:
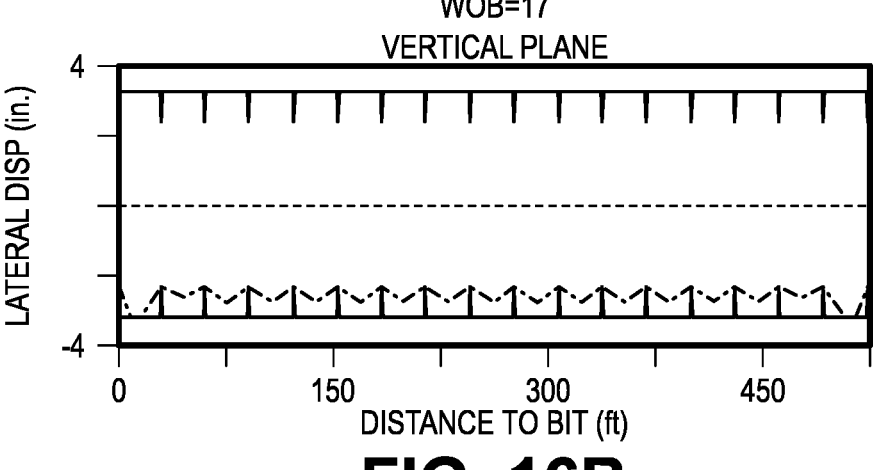
Figure 16C:
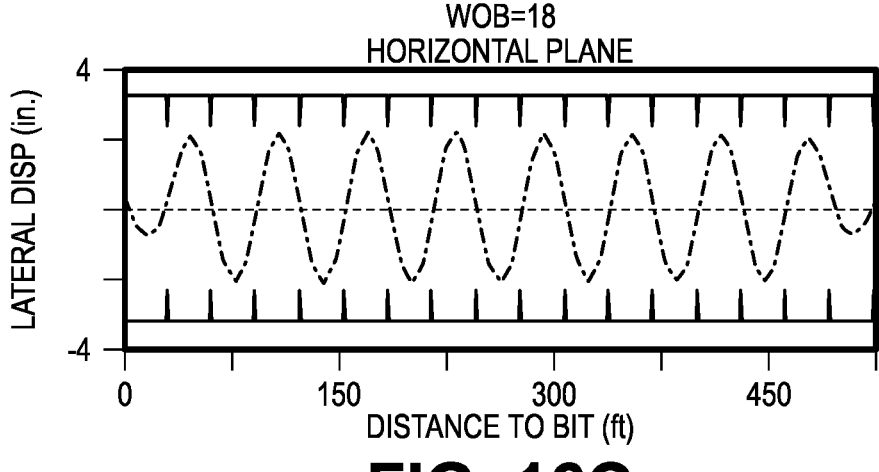
Figure 16D:
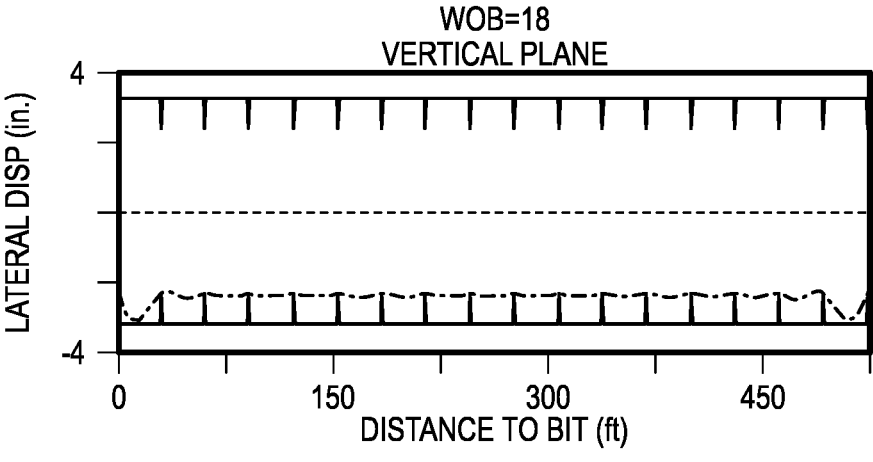
Figure 16E:
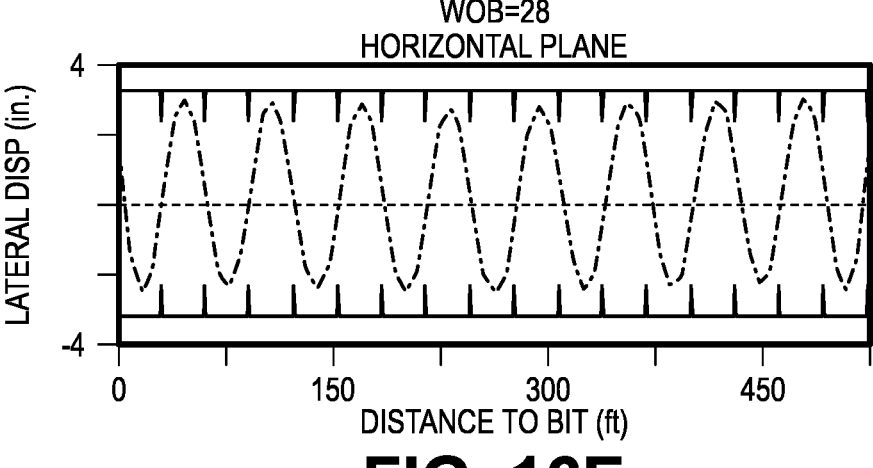
Figure 16F:
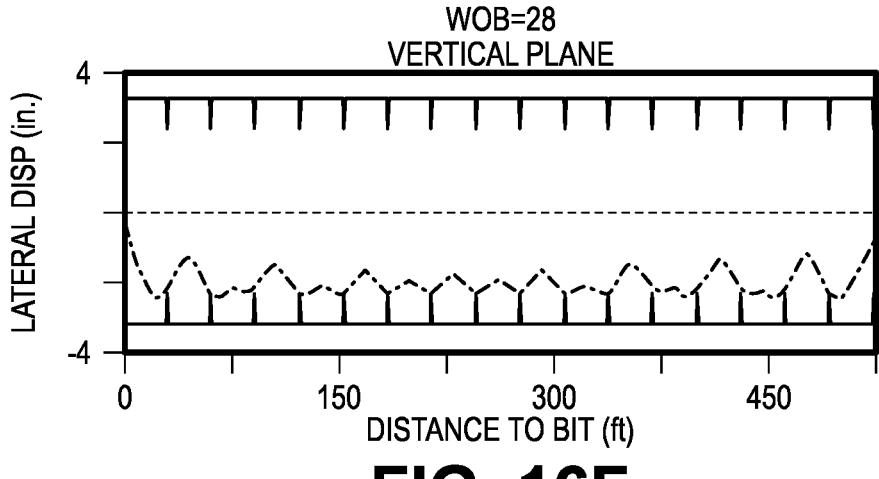
Figure 16G:
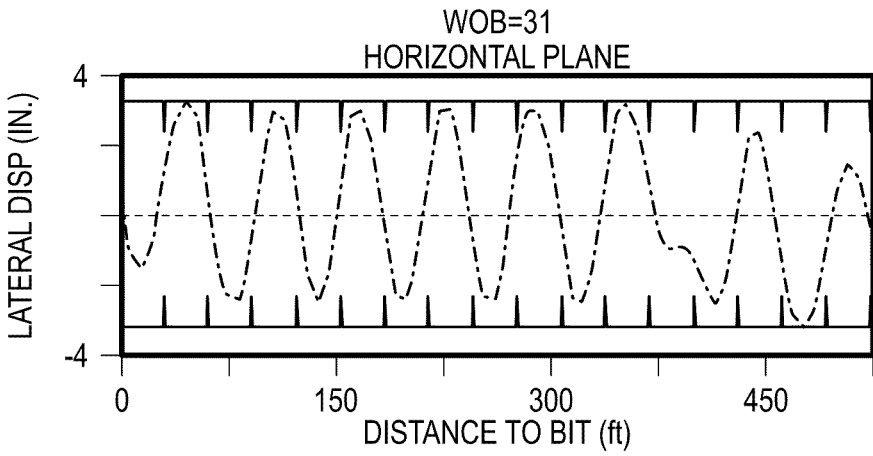
Figure 16H:
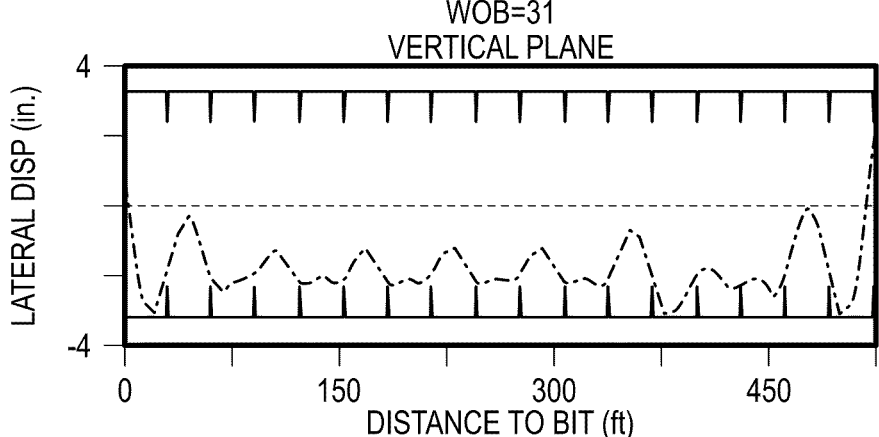
Figure 16I:
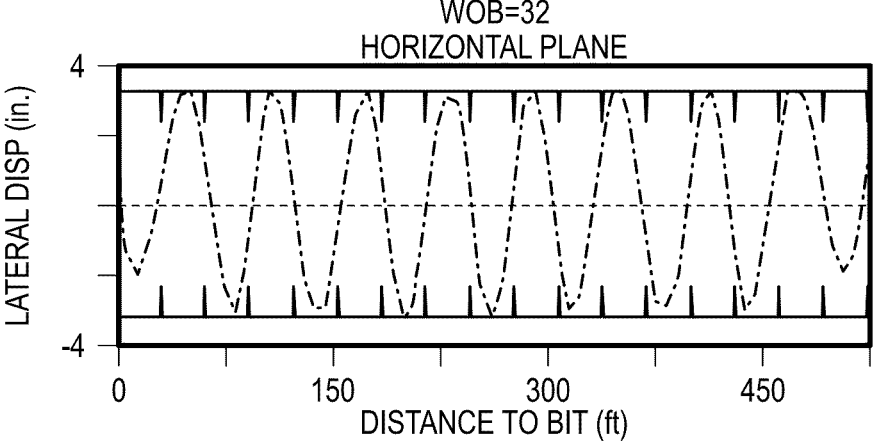
Figure 16J:
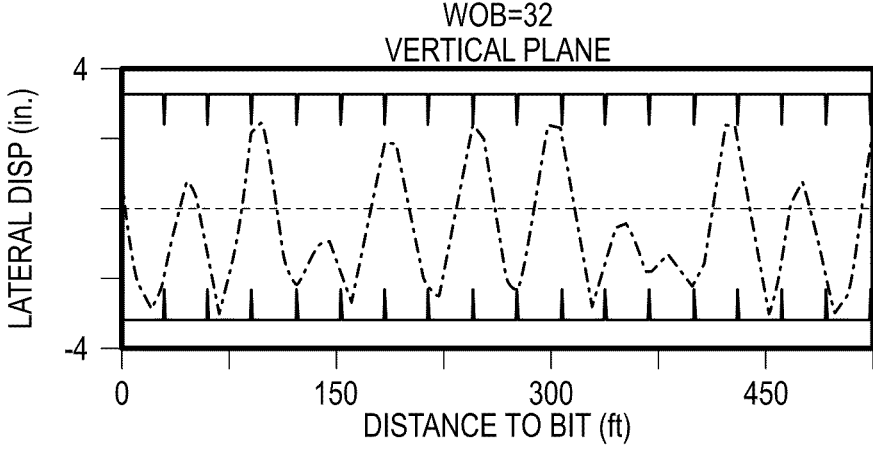
Figure 16K:
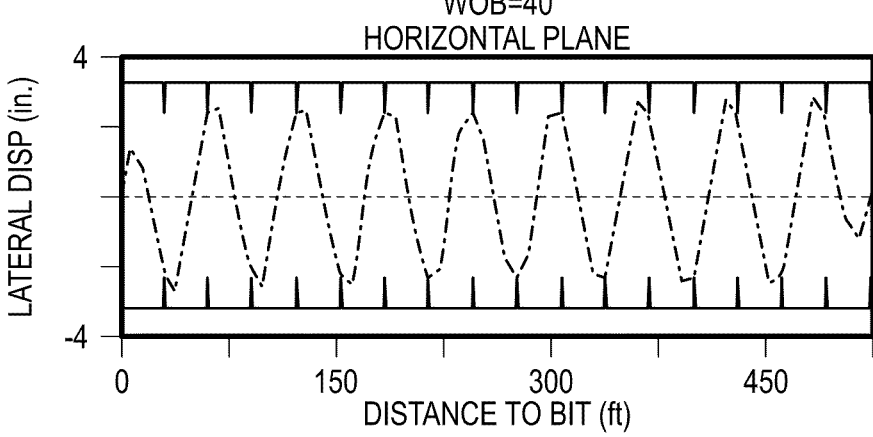
Figure 16L:
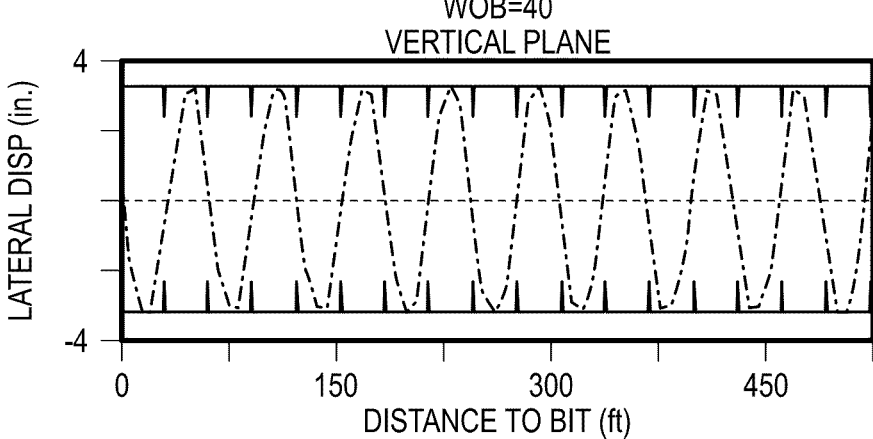

FIGS. 15A and 15B illustrate a drillstring deformation state inference, according to an embodiment. More particularly, FIG. 15A shows normalized string lateral displacements, and FIG. 15B shows tubular position angle. Here, the case in FIGS. 12A, 12B, and 13A-13D is taken as an example. First, the lateral displacement time history (e.g., in the last 10 seconds) of the entire drillstring is extracted from the transient dynamic simulation. For each timestamp, there is a snapshot of drillstring configuration. By comparing the snapshots of drillstring in the last 10-second simulation, a user (or computing system) may select the one showing the largest lateral displacement amplitude. The lateral displacement components in two transverse planes of the picked snapshot may be normalized by the original clearance of pipe (FIG. 15A). On the basis of the normalized lateral displacements, the tubular position angle can be computed (FIG. 15B). For the regular straight pipe, the position angle curve should stay relatively flat with small variations. On the basis of Equation 7, for the snaking motion and sinusoidal buckling, the position angle curve should follow the sine function. Therefore, a threshold value of the position angle variation amplitude can be proposed to differentiate between undeformed pipe and pipe with sinusoidal buckling/snaking motion. For the whirl motion and helical buckling, Equation 8 indicates that the position angle curve should monotonically increase or decrease depending on the tubular spiral direction. For the depth range of 0 to 2,500 ft in the example, the position angle curve has a sinusoidal shape with amplitude of approximately 45 degrees.

Consider that the lateral snaking motion in that depth range is relatively small. Hence, the tubular is marked to have the sinusoidal buckling. In the depth range of 3,500 to 4,500 ft, the position angle curve has monotonic increase and decrease trend in certain ranges (e.g., the variation range is larger than 360 degrees). The direction change in monotonic trend may indicate the direction change of tubular spiral.

Along with the history data of displacements and center orbit, it is found that the tubular in the depth range has the backward whirl motion. By identifying the patterns in the position angle curve and time history results, an automatic inference method has been developed to detect the drillstring behaviors (e.g., dynamics motions and post-buckling states).

Model Validation

To validate the numerical model, this subsection compares the buckling loads predicted by the model against analytical equations in the literature. The classical equations of compressive loads inducing sinusoidal and helical buckling in Equation 2 may be used here. A 510-ft-long drillpipe is placed in a horizontal wellbore (e.g., 10-in. diameter). Pipe rotation and wellbore contact friction are not considered. The static FEM may be used to solve the deflection of pipe. In this example, the outside diameter (OD) and interior diameter (ID) of the drillpipe are 3.5 and 2.602 in., and the tool joint OD and ID are 5.25 and 2.5625 in. The linear weight of the pipe is 15.5 lbm/ft. A mud weight of 10 ppg and the standard steel material properties are used in the simulation. Analytical loads given by Equation 2 are 16,900 and 30,900 lbf for sinusoidal and helical buckling, respectively.

FIGS. 16A-16L illustrate model validation: predictions of sinusoidal and helical buckling inception loads, according to an embodiment. In this example, FIGS. 16A-16L shows that drillpipe maintains the straight shape under a WOB of 17,000 lbf and becomes the sinusoidal buckled shape at a WOB of 18,000 lbf. At a WOB of 28,000 lbf, the string is still under sinusoidal buckling but with a higher deflection amplitude. The buckling develops from sinusoidal to helical shape when the axial compression increases from 31,000 to 32,000 lbf. The buckled pipe rises up to touch the upper side of the wellbore. When the WOB increases to 40,000 lbf, fully developed helical buckling occurs in the drillpipe. The predicted critical loads for sinusoidal and helical buckling have good agreement with the analytical equations.

Figure 17:
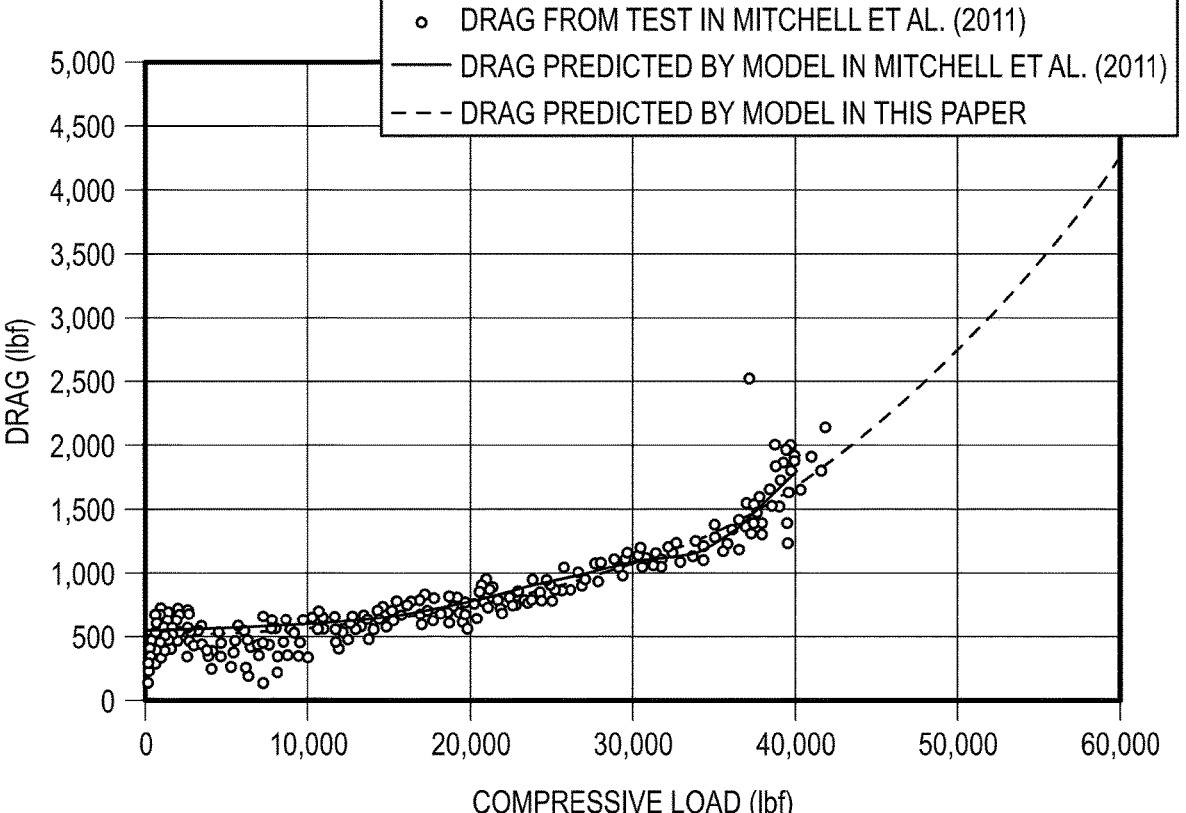
FIG. 17 illustrates model validation: predictions of drag force of a sliding buckling test, according to an embodiment.

FIG. 17 illustrates model validation: predictions of drag force of a sliding buckling test, according to an embodiment. The numerical model was also calibrated against the sliding buckling test data. The horizontal sliding test of a 3.5-in. drillpipe inside a 7-in. casing (ID¼ 6.06 in.) was simulated by the model. The drillpipe is 120 ft long and has a linear weight of 13.3 lbm/ft. The tool joint OD is 4.75 in. During the sliding test, the compression load and axial drag were measured by the load cells. FIG. 17 shows that the model in this paper is able to capture the drag increment rate shown in the test data.

Forced vibration and wave propagation problems of the tubular beam may be simulated by the model. The high frequency dynamics data from the downhole measurement tool may be used to validate and calibrate the transient dynamics model.

Case Study

Figure 18:
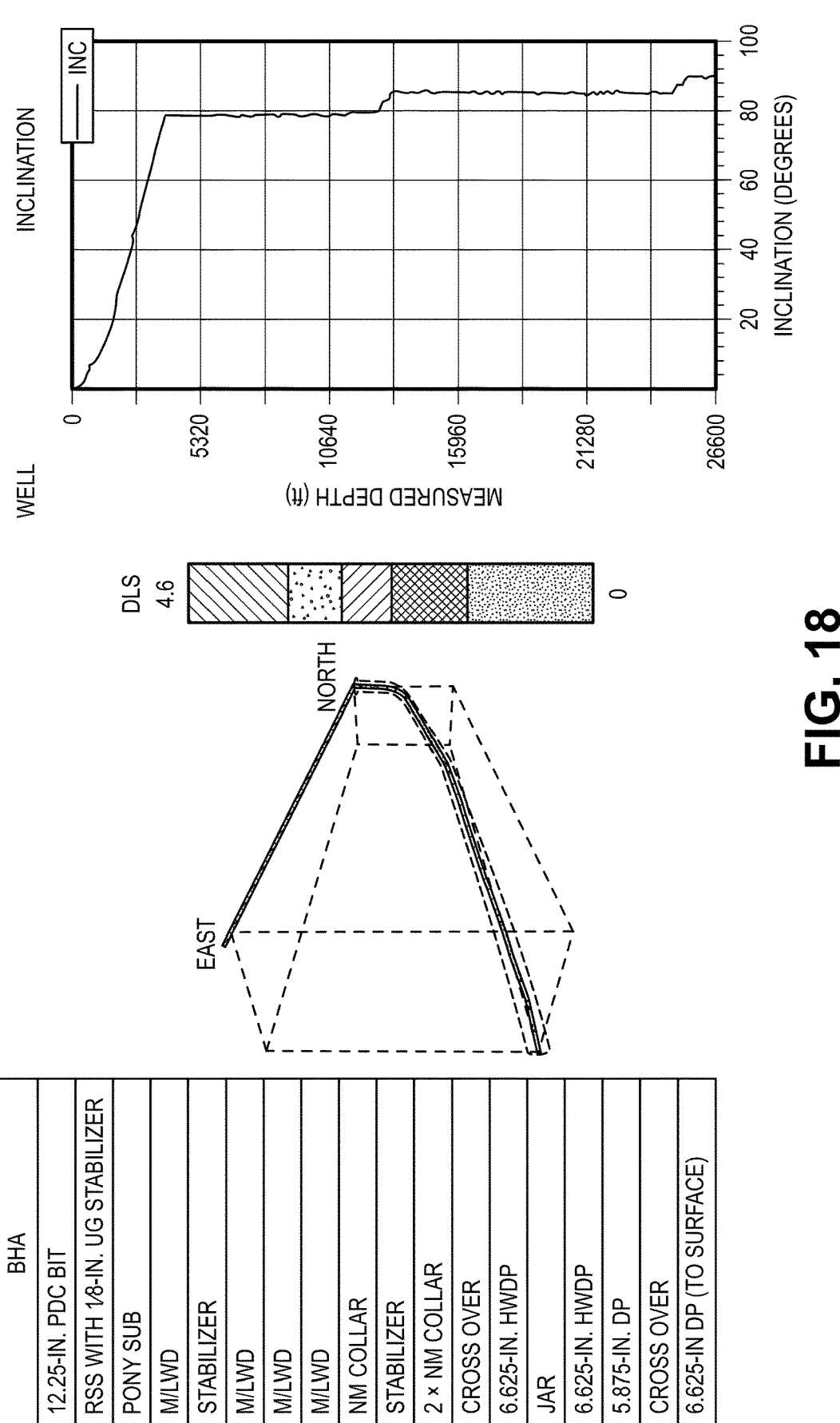
FIG. 18 illustrates a bottom hole assembly (BHA) and wellbore trajectory used in the case study, according to an embodiment.

FIG. 18 illustrates a BHA and wellbore trajectory used in the case study, according to an embodiment. The case study is from a 12¼-in. lateral drilling section with a rotary steerable BHA. FIG. 18 shows the BHA component list and well trajectory. The well has a shallow kickoff and a long lateral section (greater than 20,000 ft). In the BHA, an MWD tool may be deployed to measure the downhole weight and torque. The measurement data provides insight on the downhole weight and torque transfer, which can be used to validate the buckling analysis model. The actual field drilling parameters may be used to build the transient dynamics model. In this example, the mud weight is 12.6 ppg. The drillstring is composed of the mixed pipe configuration: 6⅝-in. HWDPp5⅞-in. drillpipe 6⅝-in. drillpipe. The full drillstring from bit to surface (e.g., the total length is approximately 17,100 ft) was modeled using 1,700 beam elements in FEM. Each node of beam element has six DOFs. Therefore, the total number of DOFs in FEM is approximately 10,000. To account for the effect of pipe connectors on wellbore contact and overall stiffness, each tool joint is modeled as a single beam element with the detailed dimensions considered. The drillpipe body is meshed with two elements (e.g., approximately 15 ft in size). It takes approximately 25 minutes to run one single transient dynamics simulation (e.g., corresponding to 1 minute of actual drilling time). The computation time depends on the drillstring length and well trajectory. The example (e.g., the ERD application) used herein is one of the most time-consuming cases. The simulation time can be reduced to 2 to 3 minutes when simulating a shorter drillstring (approximately 4,000 to 6,000 ft).

Model Validation of Weight Transfer

Figures 19A, 19B, 19C:
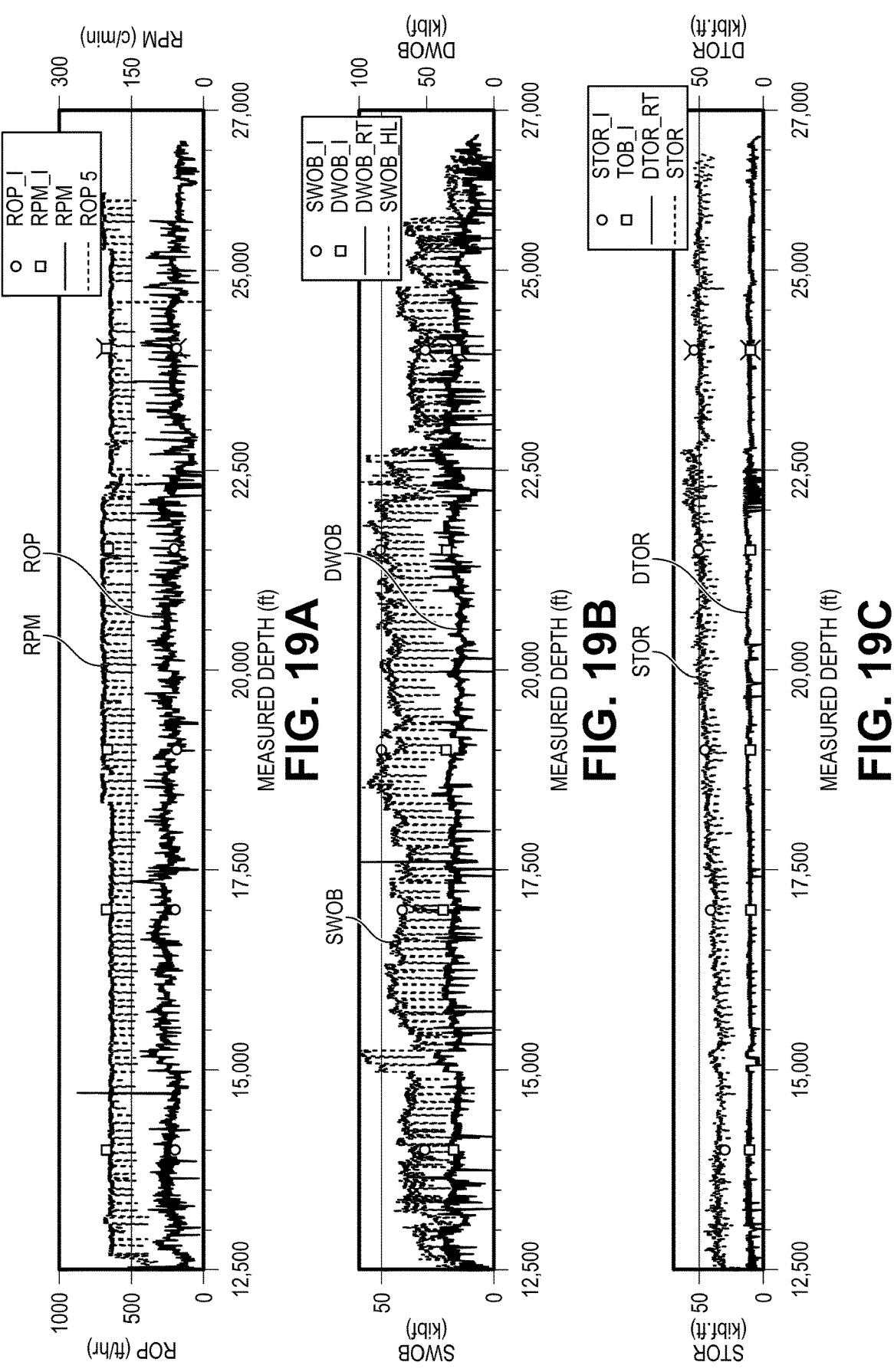
FIGS. 19A-19C illustrates model validation for weight and torque transfer, according to an embodiment.

FIGS. 19A-19C illustrate model validation for weight and torque transfer, according to an embodiment. More particularly, FIGS. 19A-19C present the comparison between field measurement and simulation predictions, where the solid lines are the field data and dots are the simulation predictions. The transient dynamics simulation was conducted with string rotation and field conditions.

The transient dynamics simulation provides the time history results of physical variables (see example of WOB result in FIG. 21). Dynamics simulations may be performed at several depths. The dots at one depth in FIGS. 19A-19C are the average of time history results of corresponding variables from the dynamics simulation performed at that depth. As shown in the two bottom plots (e.g., FIGS. 19B and 19C), the model is capable of predicted weight and torque losses (e.g., the difference between surface and downhole values) shown in the field data.

Figure 20A:
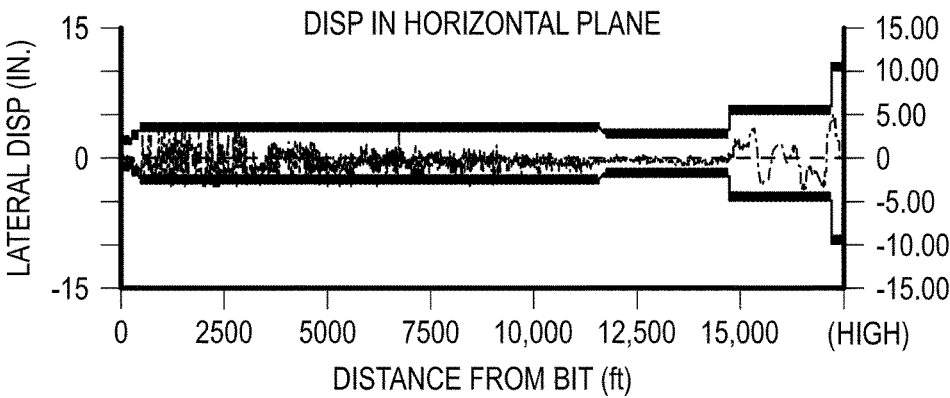
FIGS. 20A and 20B illustrate transient dynamics simulation results, according to an embodiment.
Figure 20A:
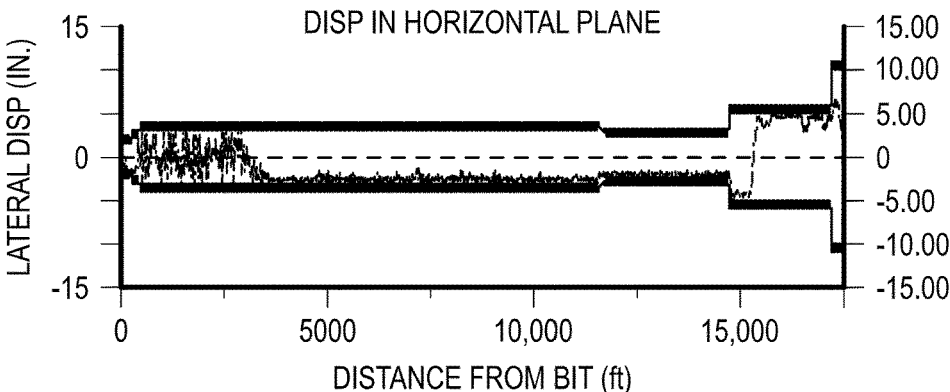
Figure 20B:
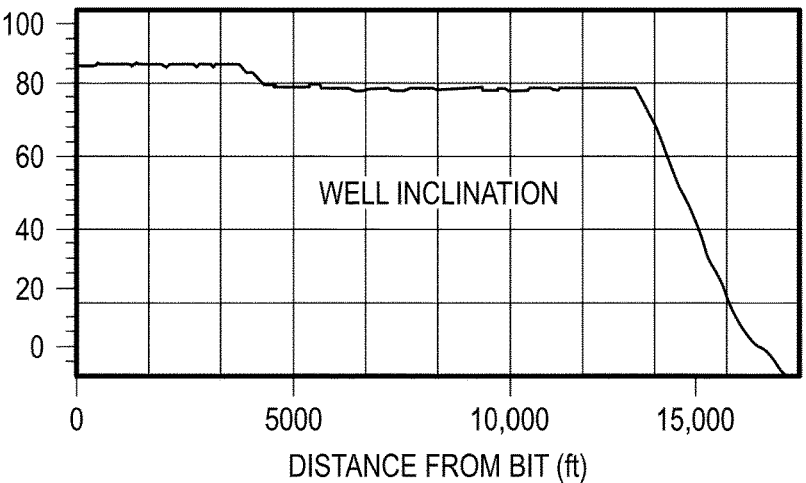

FIGS. 20A and 20B illustrate transient dynamics simulation results, according to an embodiment. More particularly, FIG. 20A shows string lateral displacement, and FIG. 20B shows well inclination. At a measured depth of 21,500 ft, the weight loss is more than 20% of the surface weight, which is large for a rotary drilling operation. To understand the cause of weight loss, more detailed simulation results may be investigated. FIGS. 20A and 20B show the drillstring lateral displacements from the transient dynamics model. It demonstrates that the bottom 3,000 ft of string has the severe helical buckling-induced backward whirl motion. The string in the lateral section becomes sinusoidally buckled. On the basis of the analytical equation-based method, the sinusoidal buckling is identified in the lateral section. The transient dynamics model actually shows that the drillstring is under whirl motion and the weight/torque loss is significant in this specific case.

Figure 21A:
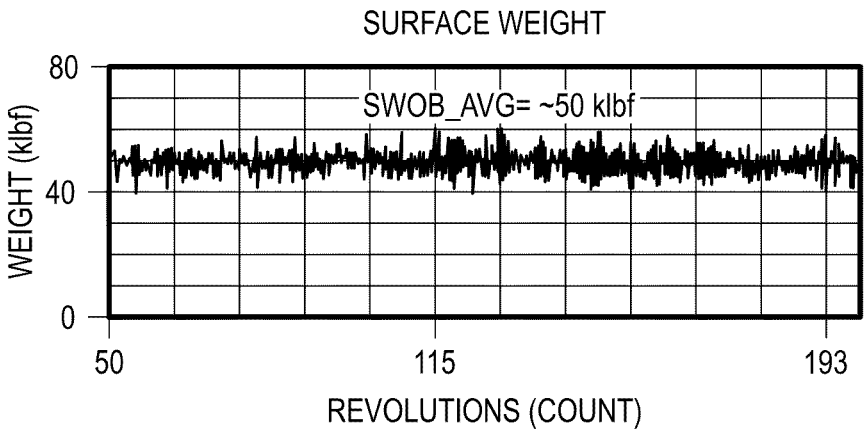
FIGS. 21A and 21B illustrate transient dynamics models of weight transfer, according to an embodiment.
Figure 21B:
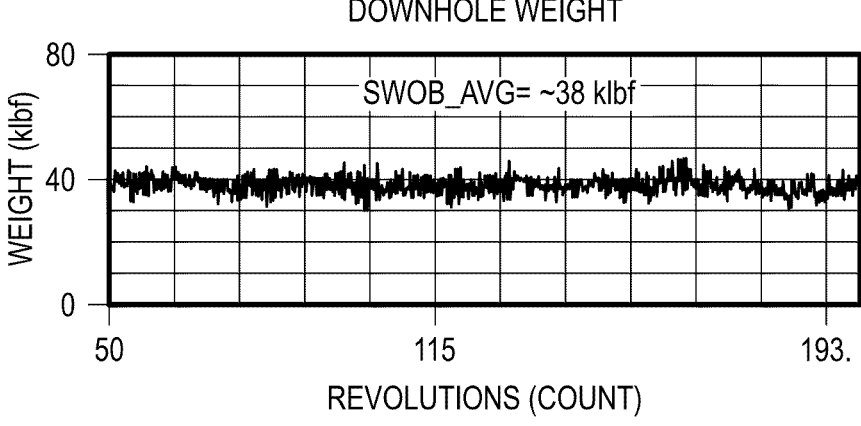

FIGS. 21A and 21B illustrate transient dynamics models of weight transfer, according to an embodiment. More particularly, FIG. 21A shows surface weight, and FIG. 21B shows downhole weight. FIGS. 21A and 21B show the time history simulation results of surface and downhole weight. It can be used to evaluate the weight transfer after the string enters the dynamics instability and post-buckling state. The solid lines are from the field measurement, and the dots are from transient dynamics simulation.

Transient Dynamics Versus Static Model

Figures 22A, 22B, 22C, 22D:
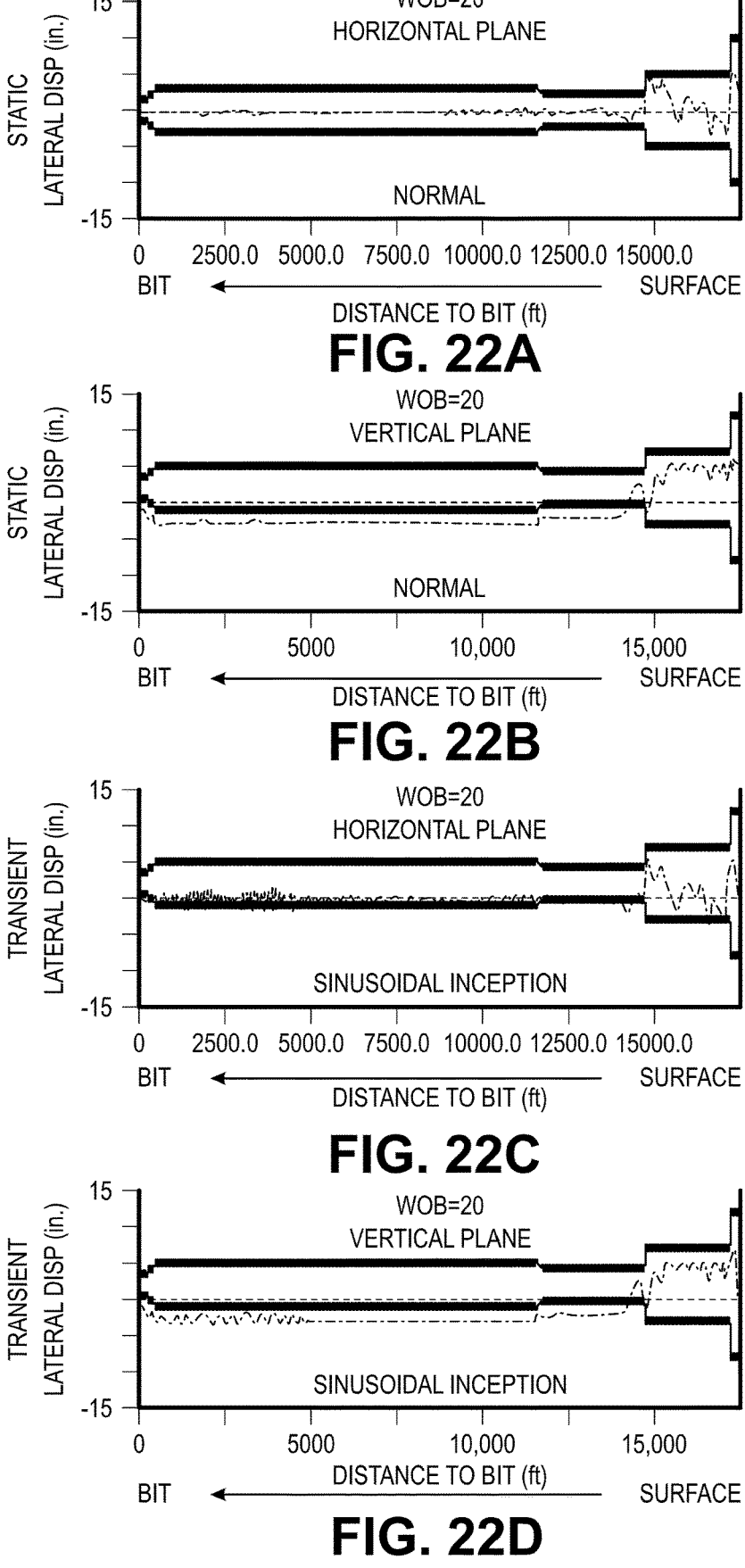
FIGS. 22A-22P illustrate a comparison of static and transient dynamics models: the lateral displacements along the drillstring, according to an embodiment.
Figures 22E, 22F, 22G, 22H:
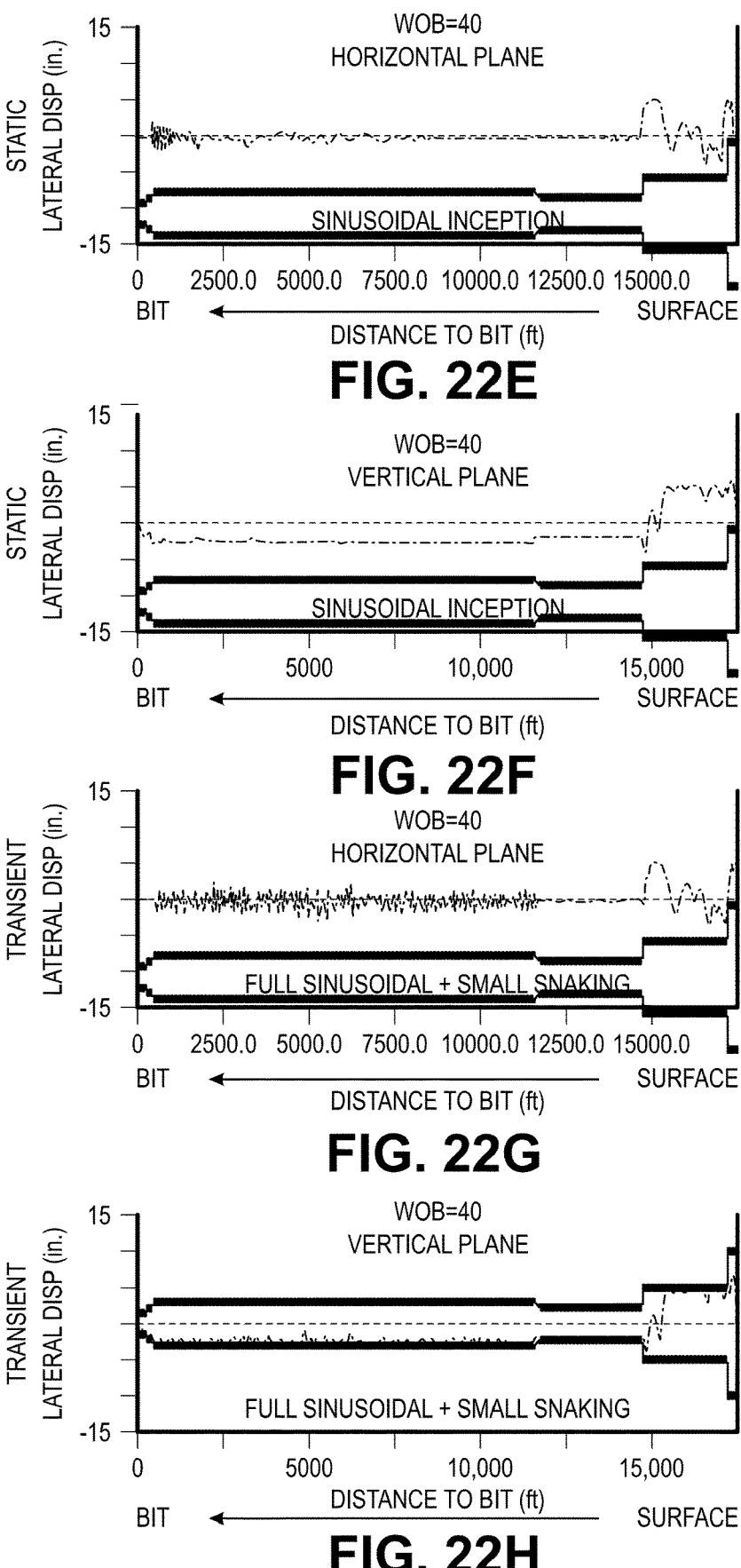
Figures 22I, 22J, 22K, 22L:
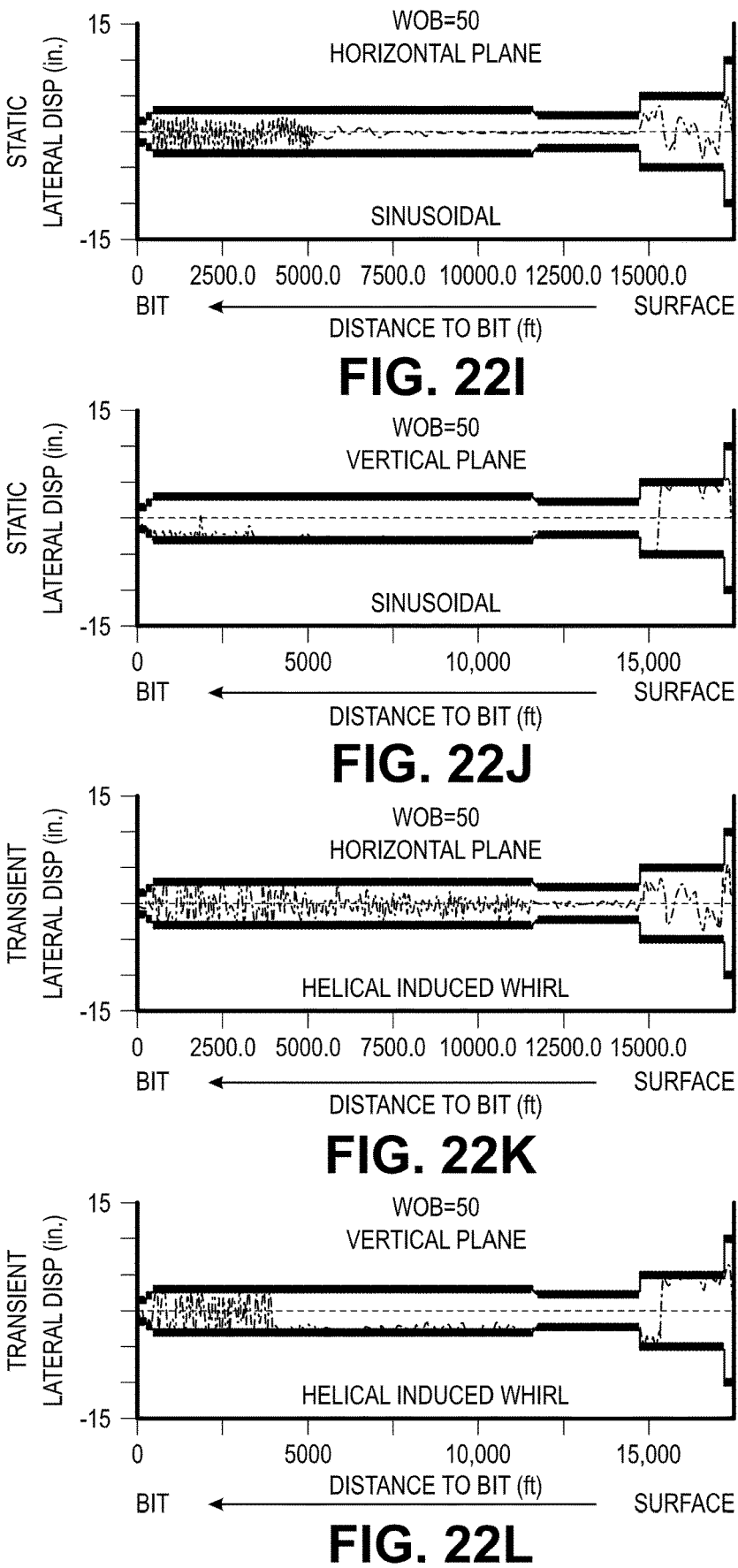
Figures 22M, 22N, 22O, 22P:
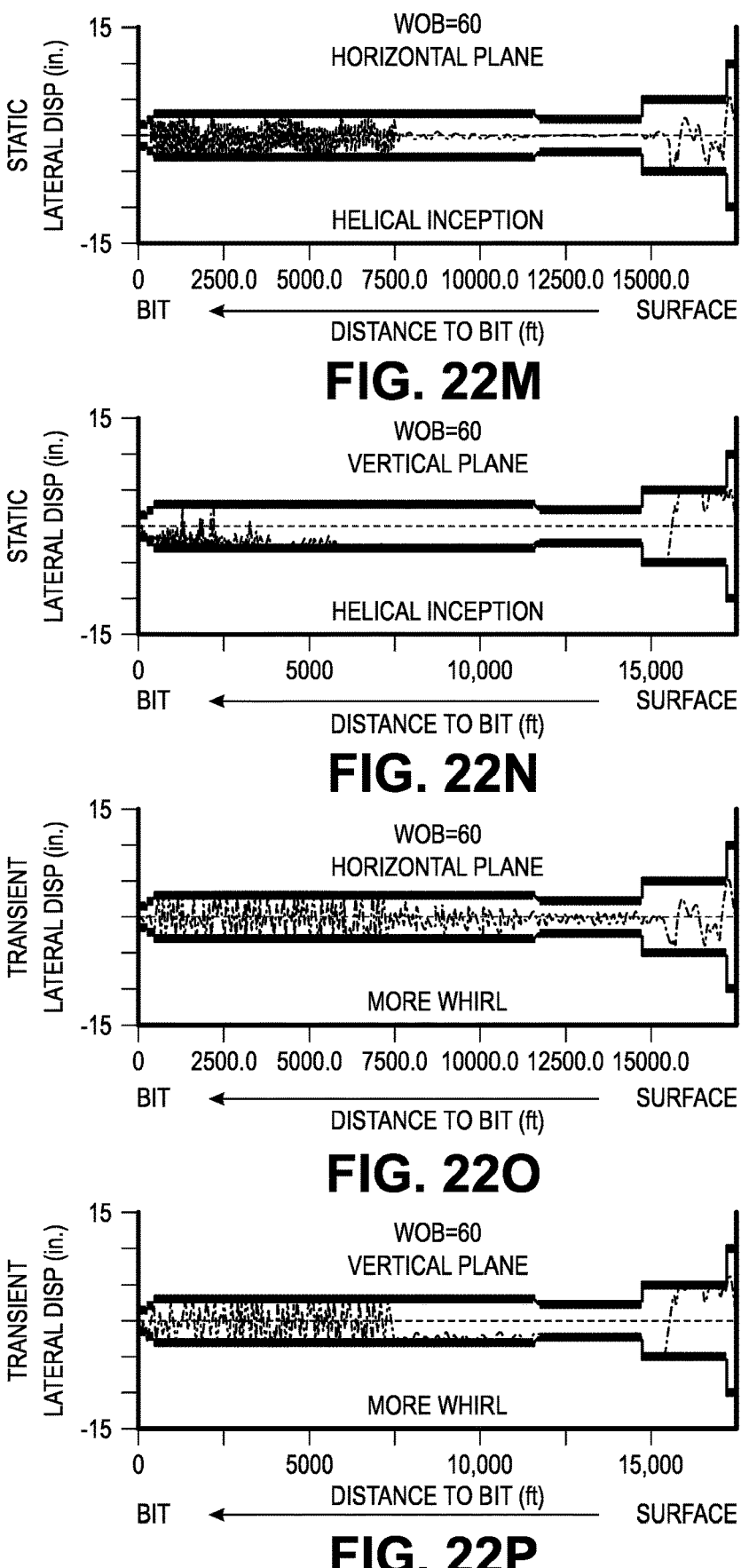
Figure 23A:
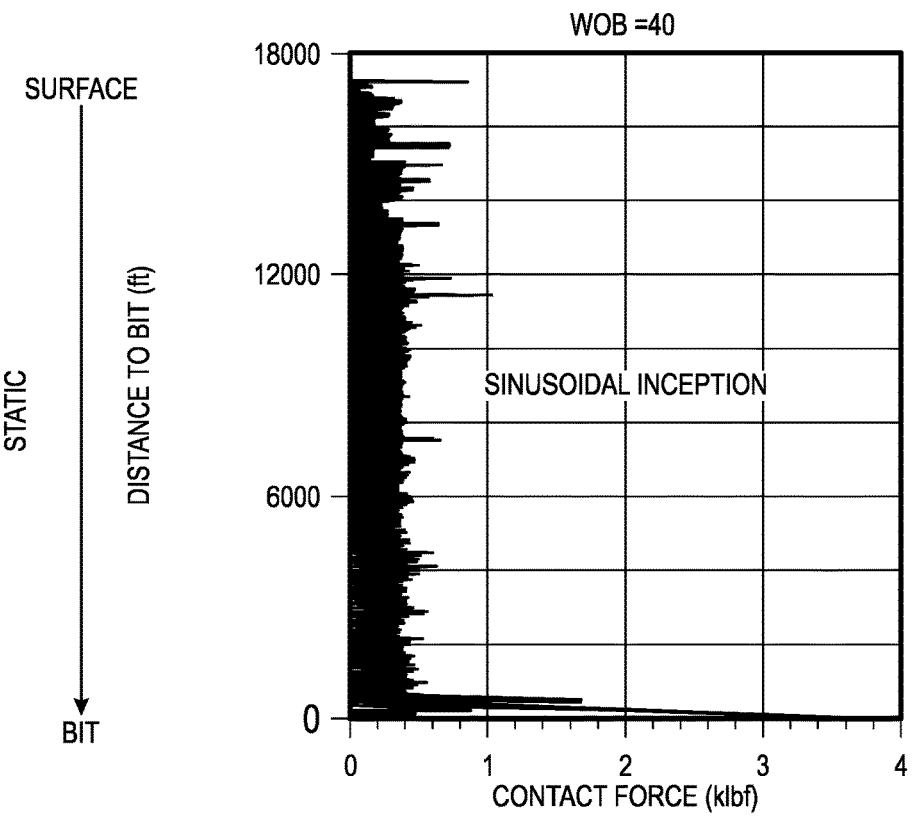
FIGS. 23A-23F illustrates a comparison of static and transient dynamics models: the contact force on the string, according to an embodiment.
Figure 23B:
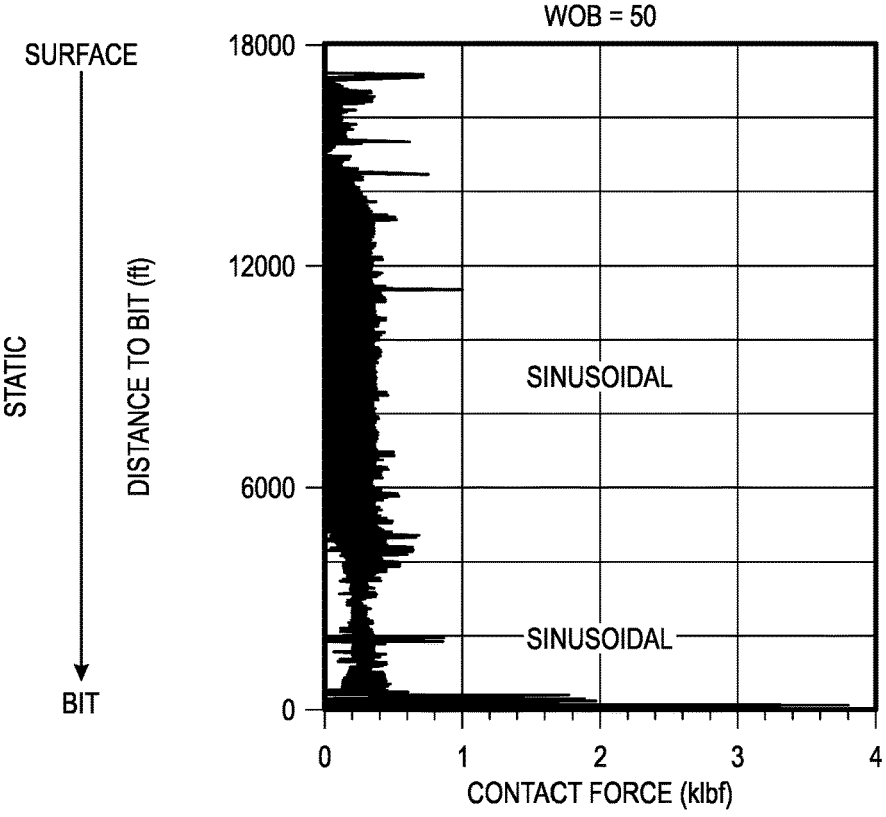
Figures 23C, 23D:
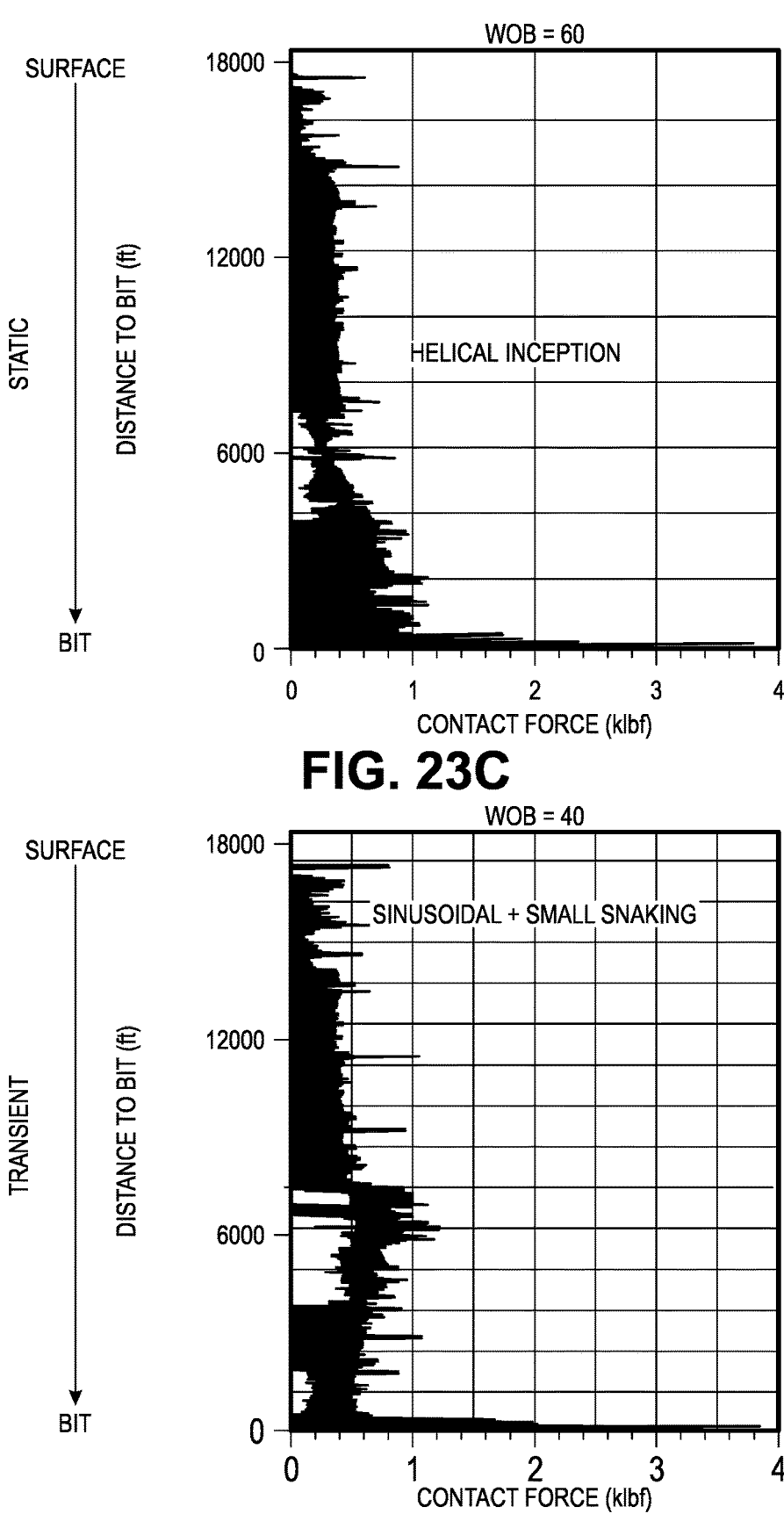
Figure 23E:
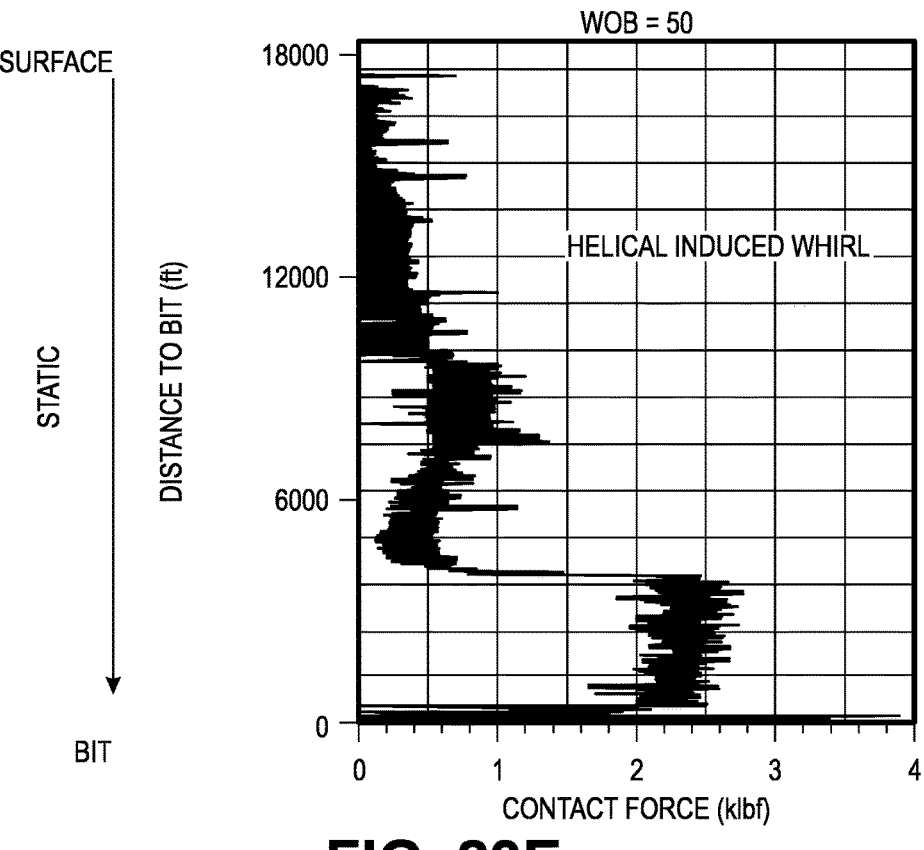
Figure 23F:
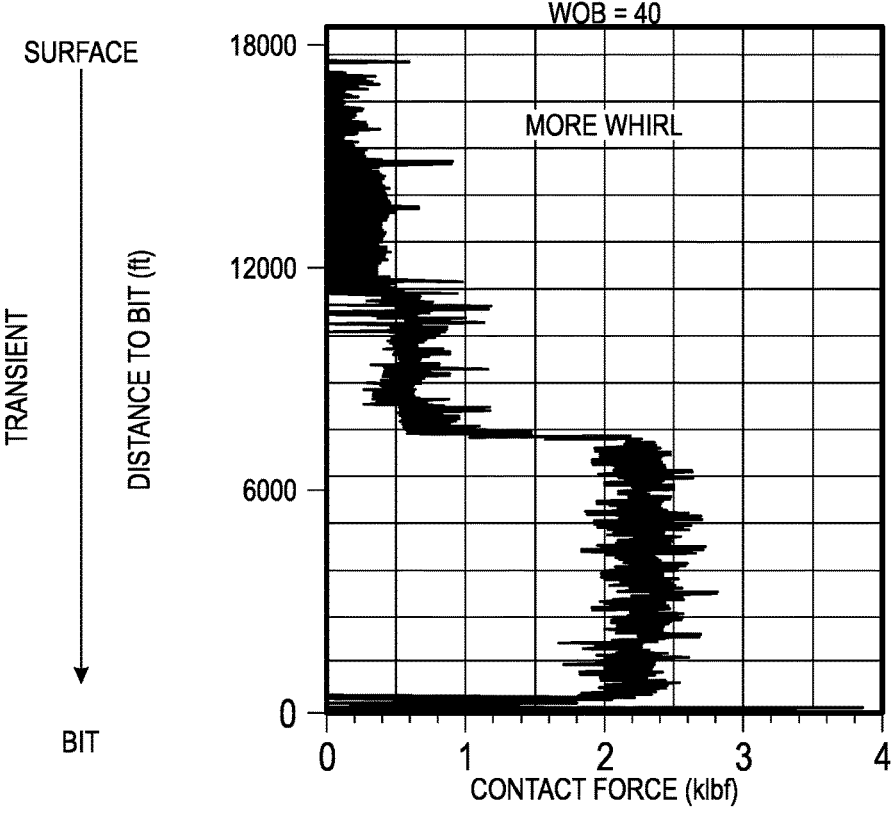
Figure 24A:
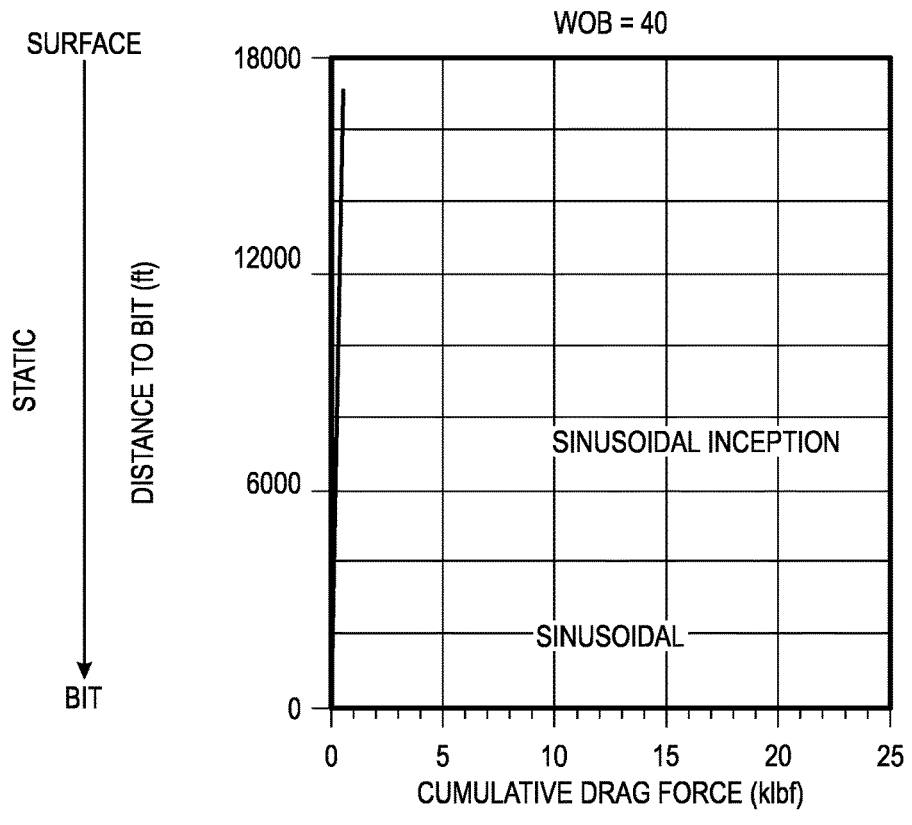
FIGS. 24A-24F illustrate a comparison of static and transient dynamics models: the cumulative axial drag force, according to an embodiment.
Figure 24B:
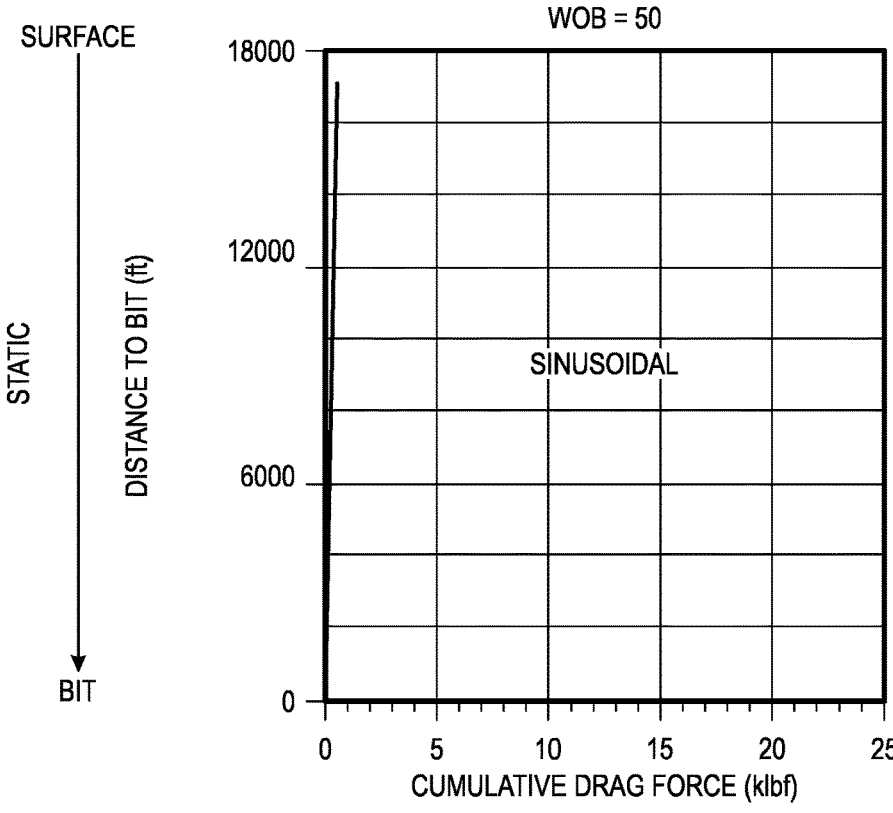
Figure 24C:
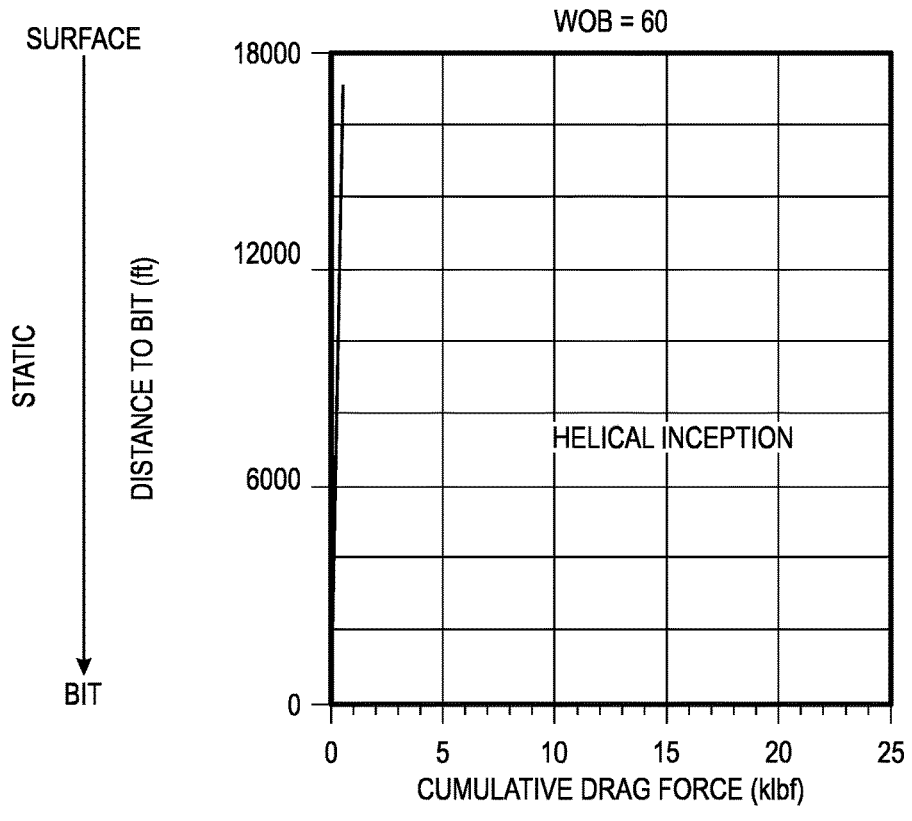
Figure 24D:
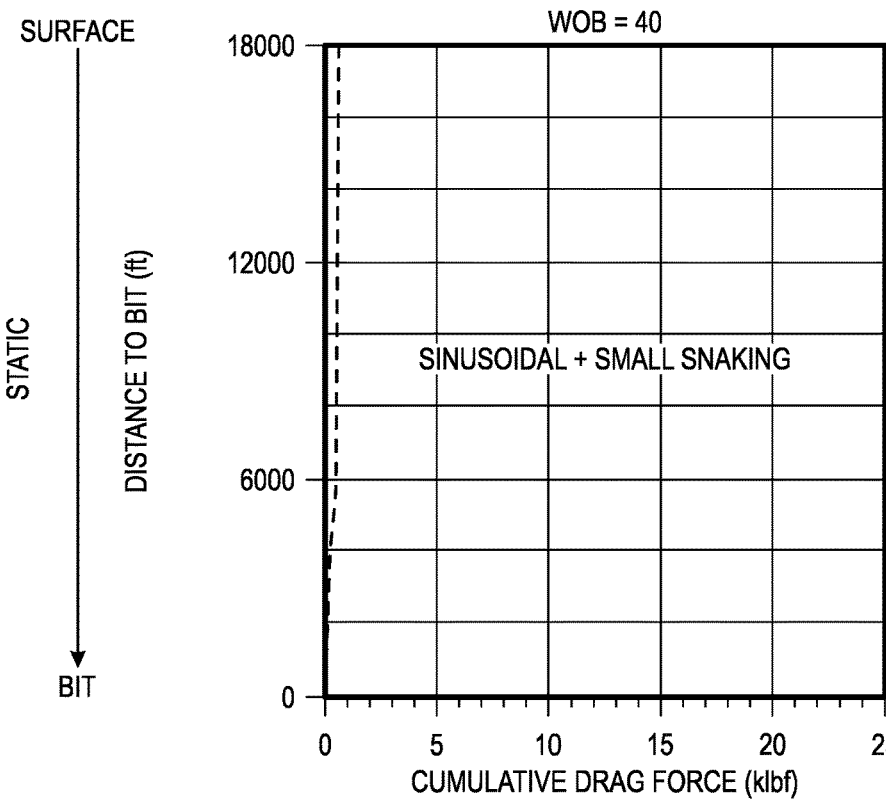
Figure 24E:
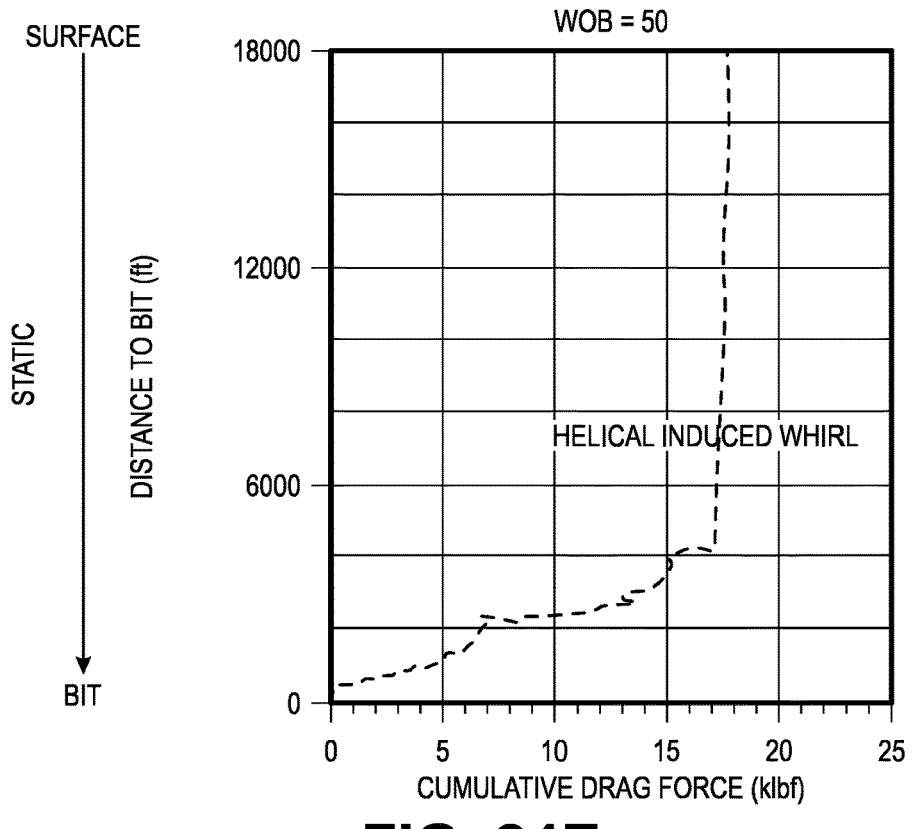
Figure 24F:
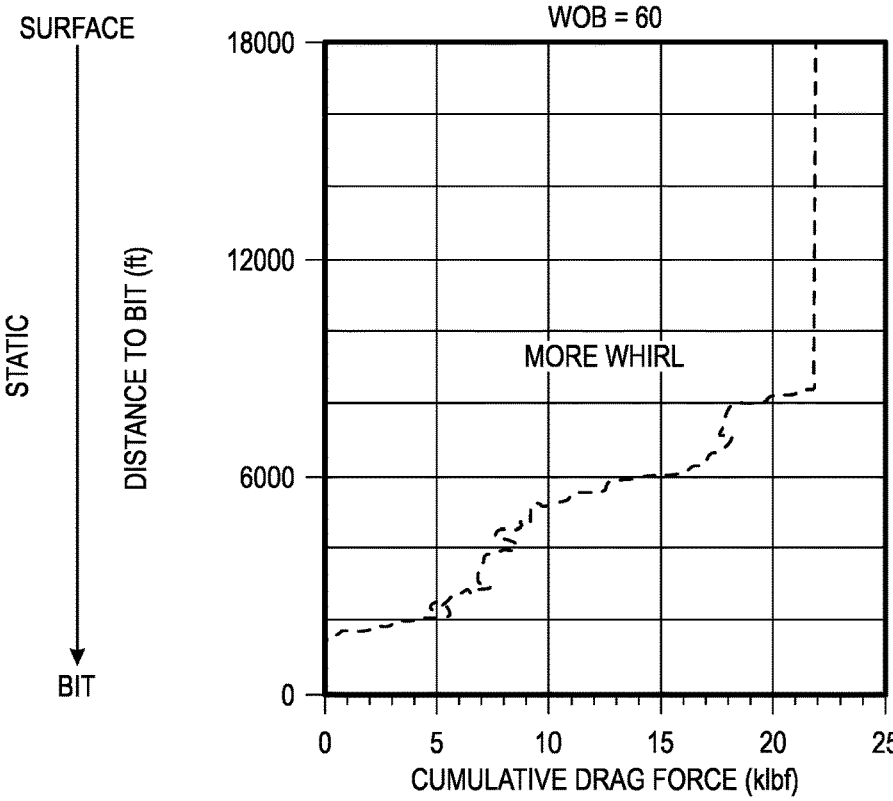

FIGS. 22A-22P illustrate comparisons of static and transient dynamics models: the lateral displacements along the drillstring, according to an embodiment. By investing some computation cost in time integration, the transient model can reveal enriched physics involved in the drillstring dynamics and post-buckling phenomena and give more accurate prediction of the behaviors and internal stresses of tubular. The simulation results of transient dynamics and static models may be compared to demonstrate the value of the transient model. FIGS. 22A-22P present the lateral displacements of string predicted by static and transient dynamics models. By incorporating the string rotation dynamics, the transient model predicts that the sinusoidal buckling inception occurs at a WOB of 20,000 lbf and the helical-buckling-induced whirl occurs at a WOB of 50,000 lbf, whereas the static model shows the sinusoidal buckling inception at a WOB of 40,000 lbf and helical inception at a WOB of 60,000 lbf.

FIGS. 23A-23F illustrate a comparison of static and transient dynamics models: the contact force on the string, according to an embodiment. FIGS. 23A-23F compare the contact force on the string. When both models show sinusoidal buckling, the transient dynamics model predicts higher contact force because of the dynamic inertia force of tubular. The contact force may be amplified in the pipe segment with whirl motion. Higher contact force means higher T&D.

FIGS. 24A-24F illustrate a comparison of static and transient dynamics models: the cumulative axial drag force, according to an embodiment. More particularly, FIGS. 24A-24F compare the cumulative axial drag force, which is the difference between surface WOB and downhole WOB. The weight loss (e.g., axial drag force) predicted by the transient model is much larger than that of the static model.

Effect of Pipe Rotation Speed

Figures 25A, 25B, 25C, 25D:
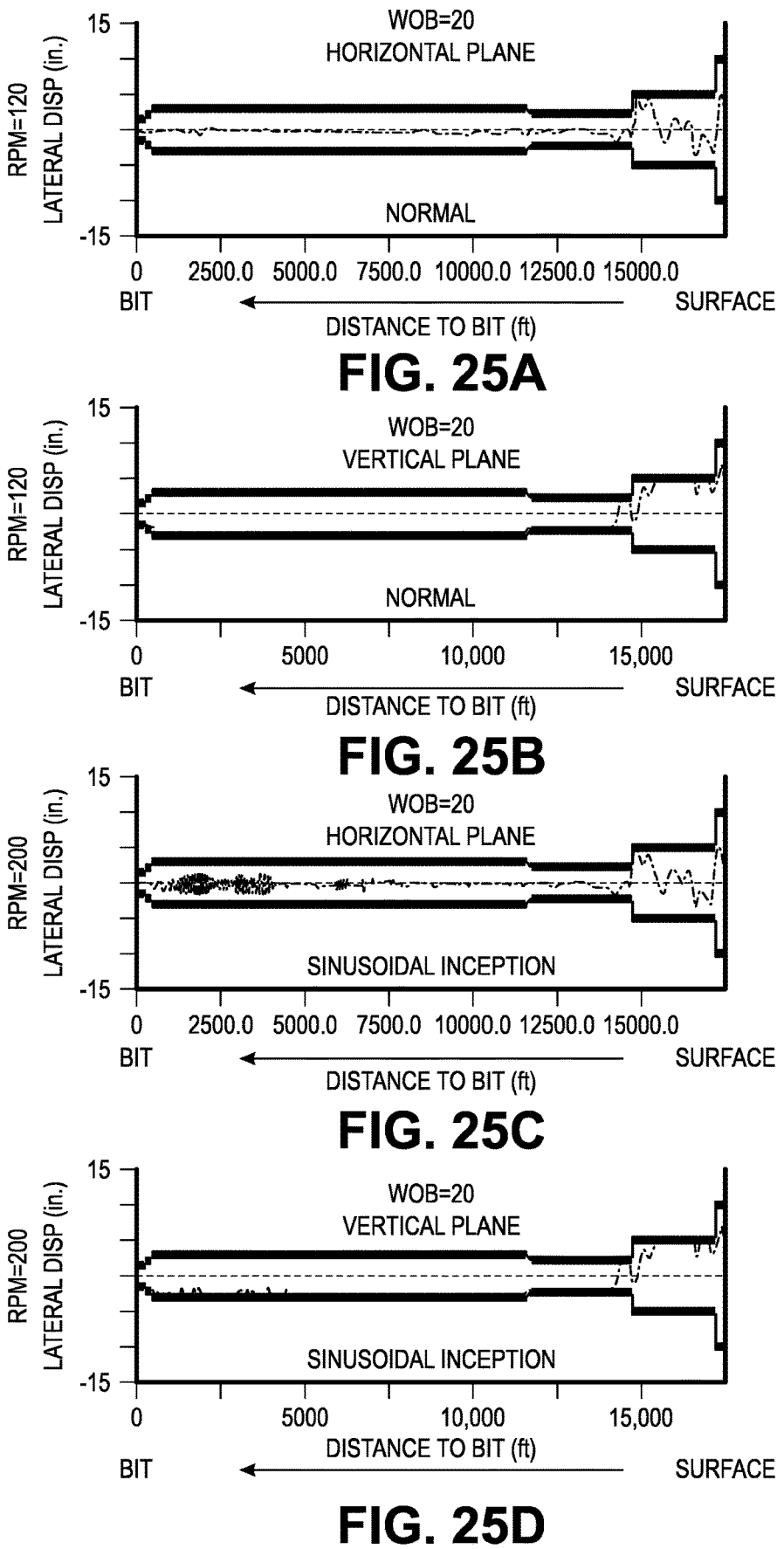
FIGS. 25A-25P illustrate an analysis comparison under different rotational speeds, according to an embodiment.
Figures 25E, 25F, 25G, 25H:
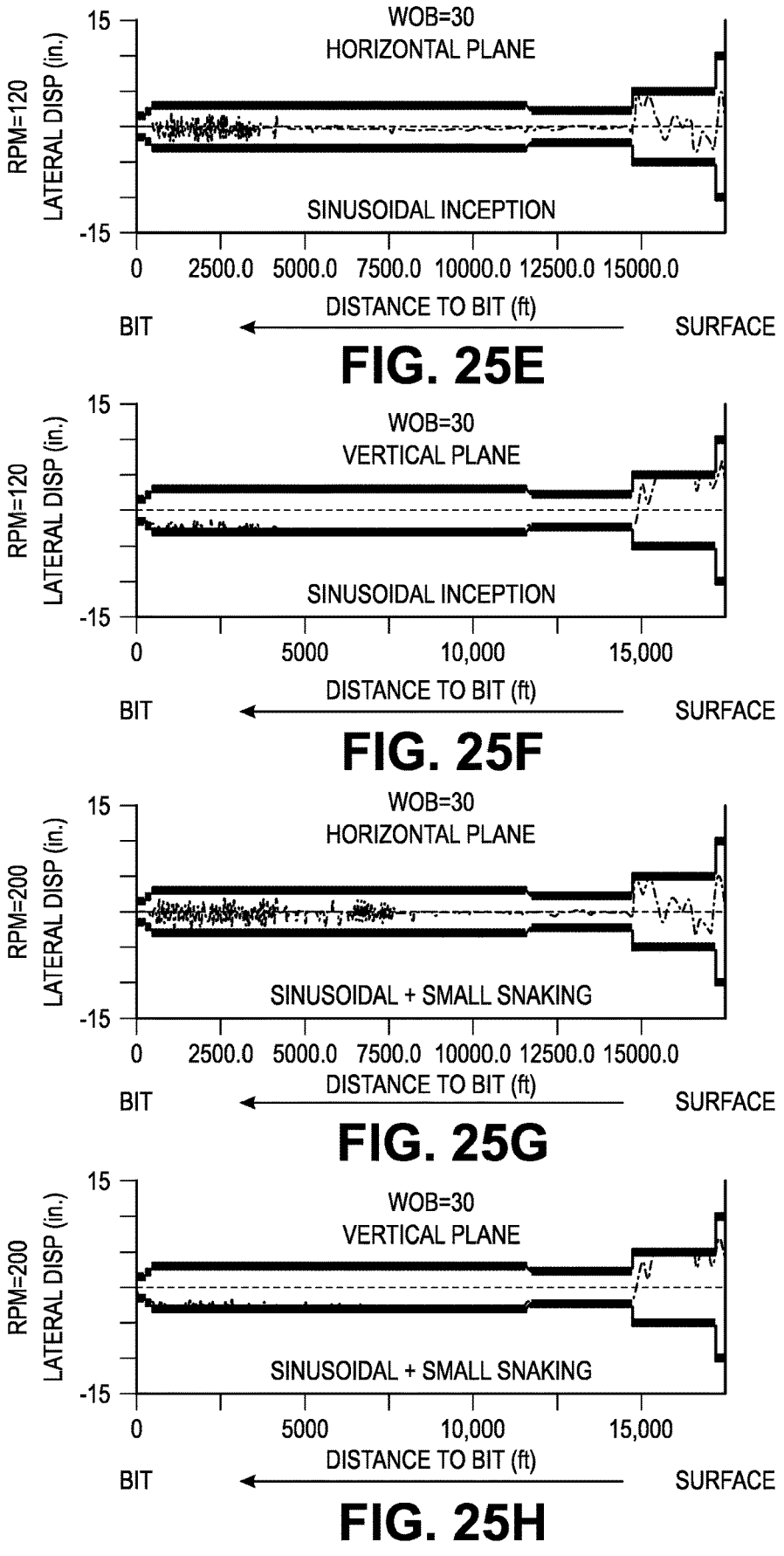
Figures 25I, 25J, 25K, 25L:
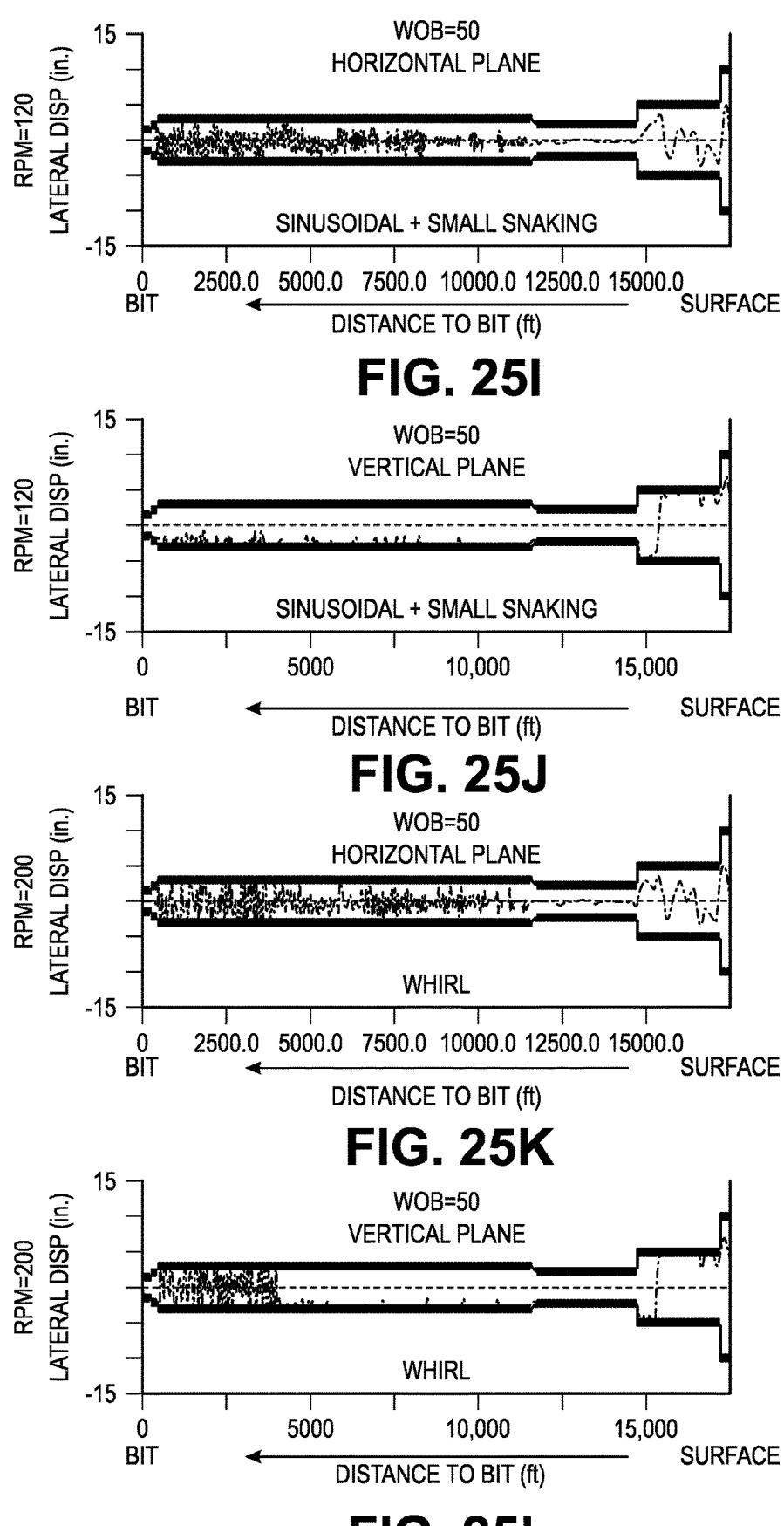
Figures 25M, 25N, 25O, 25P:
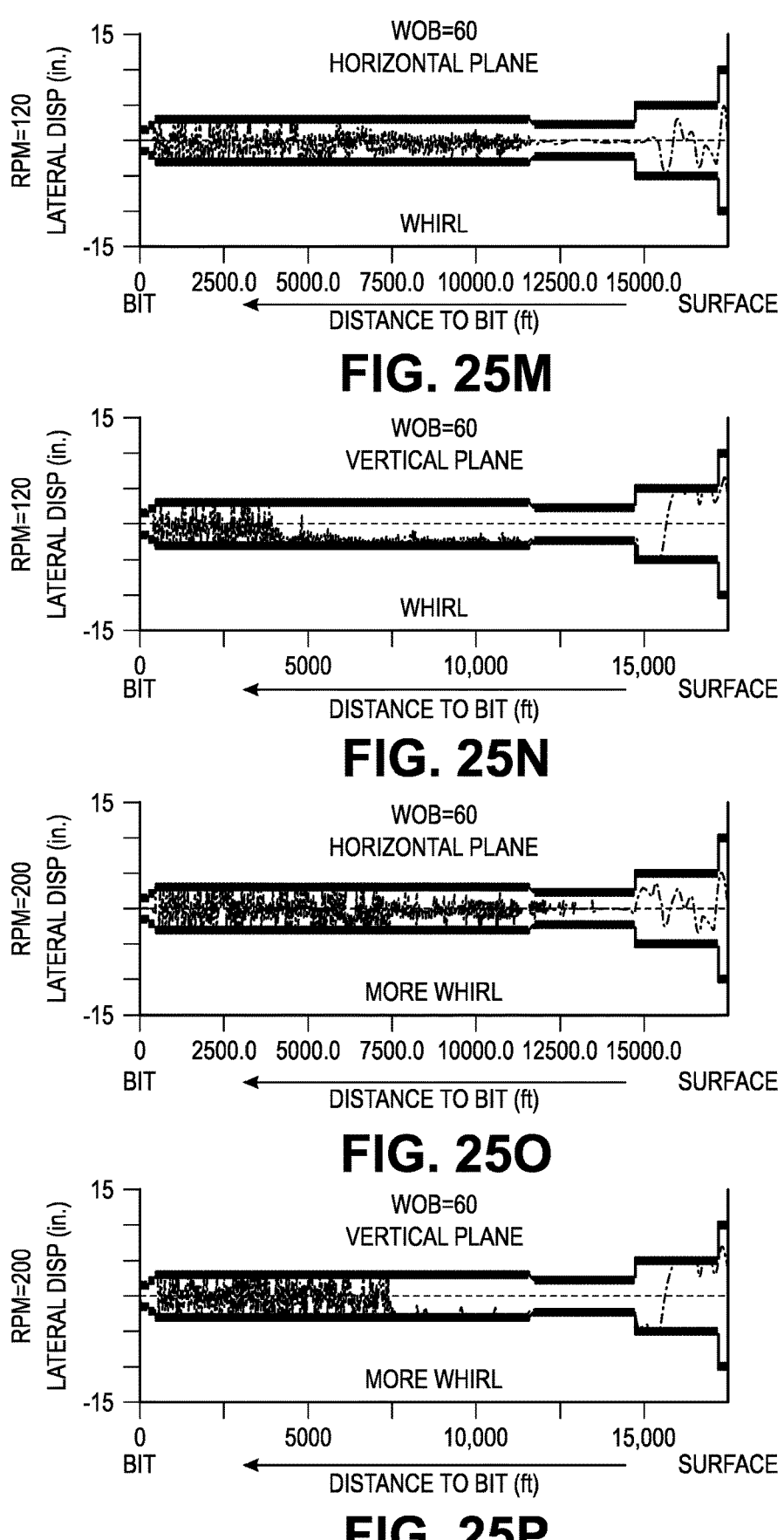

FIGS. 25A-25P illustrate an analysis comparison under different rotational speeds, according to an embodiment. In the static buckling model and the equation-based buckling model, the buckling phenomenon is considered to be independent of rotation speed. By simulating the dynamic contact and whirl motion, the transient model is able to capture the effect of surface rotation speed (SRPM) on the drillstring behaviors. FIGS. 25A-25P present the simulation results under two SRPMs=120 and 200 rev/min. It shows the sinusoidal buckling and dynamics motions initiate at a lower WOB under higher SRPM. For instance, whirl occurs in the drillstring when WOB reaches 60,000 lbf for an SRPM of 120. Under higher SRPM, such as 200 rev/min, the larger dynamics force can drive the drillstring into whirl motion under a WOB of 50,000 lbf. Performing the transient dynamics analysis makes it feasible to systematically optimize the drilling parameters for operation risk mitigation.

Effect of Wellbore Friction

Wellbore friction has an effect on drillstring T&D and buckling/dynamics inception forces. Normally, for conventional static T&D analysis, the transverse friction factor can be calibrated by matching the surface torque value during the rotating off-bottom operation. The axial friction factor can be calibrated by matching hookload during the picking up operation.

Figure 26A:
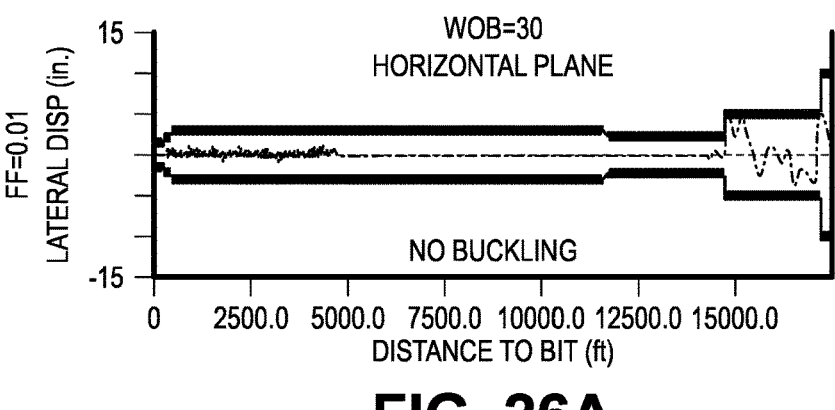
FIGS. 26A-26X illustrate an analysis comparison under different well friction factors, according to an embodiment.
Figure 26B:
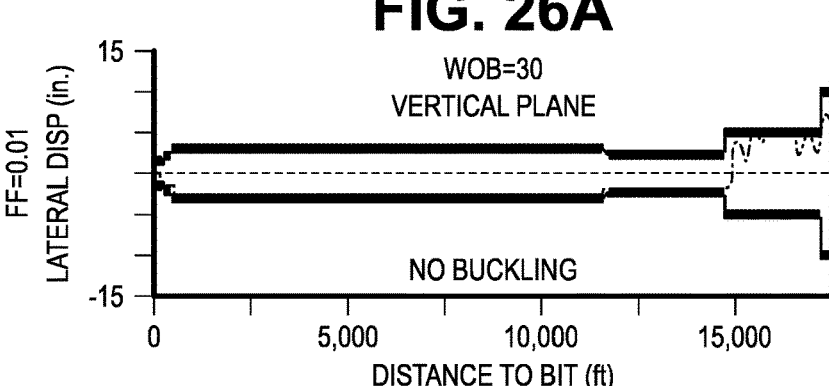
Figure 26C:
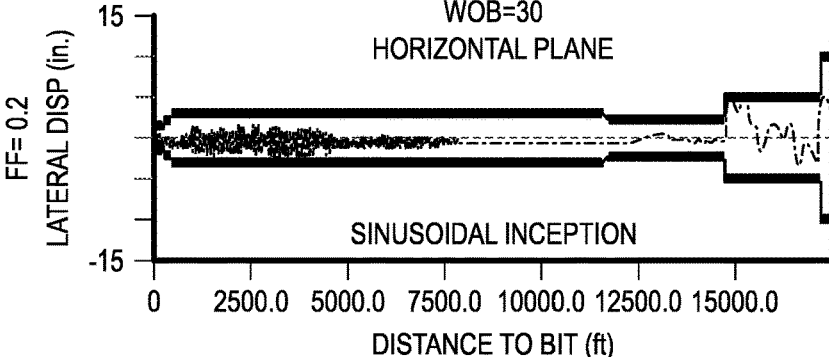
Figure 26D:
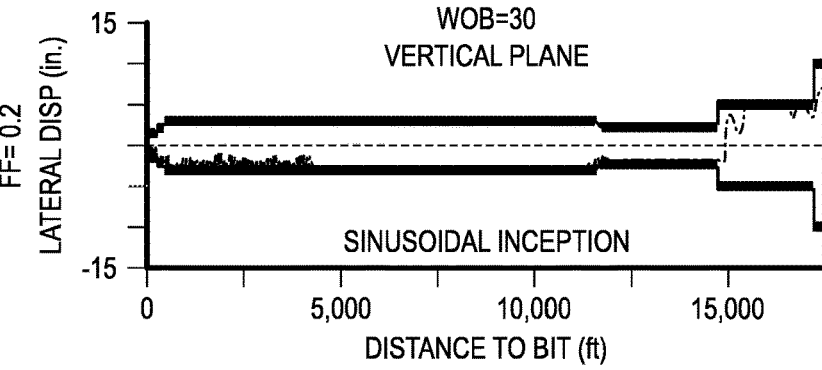
Figure 26E:
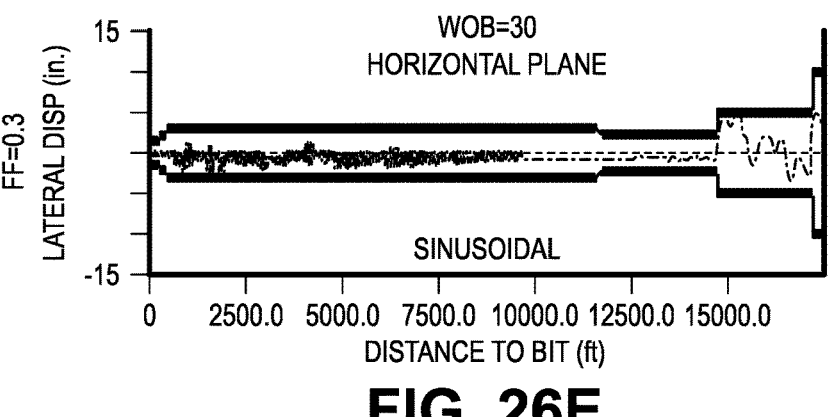
Figure 26F:
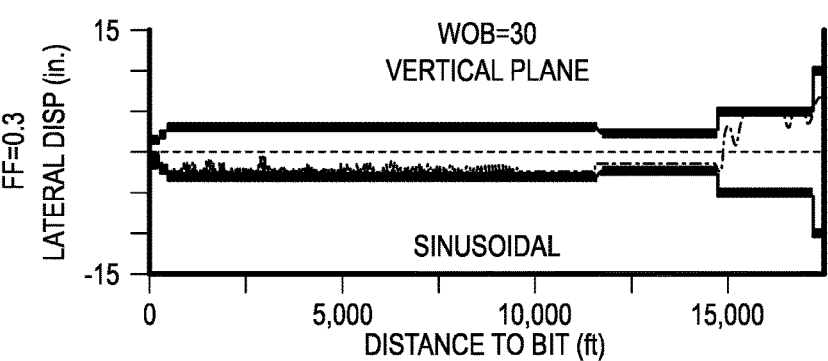
Figure 26G:
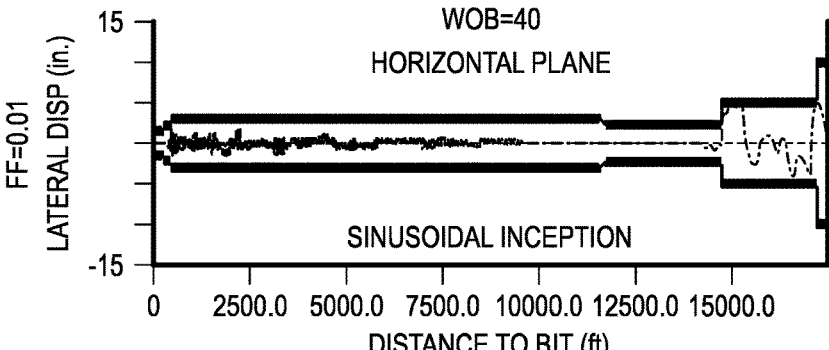
Figure 26H:
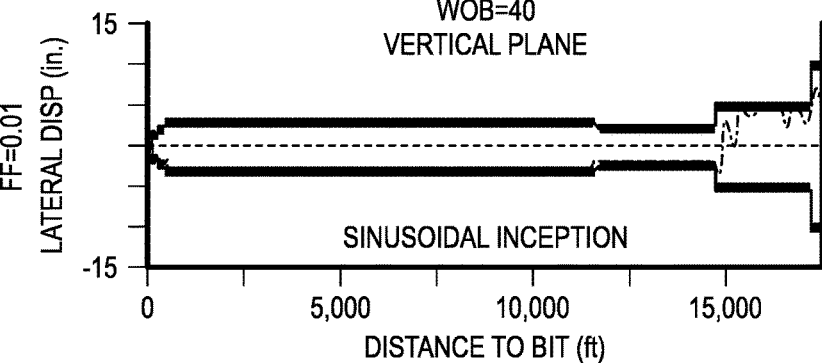
Figures 26I, 26J, 26K, 26L:
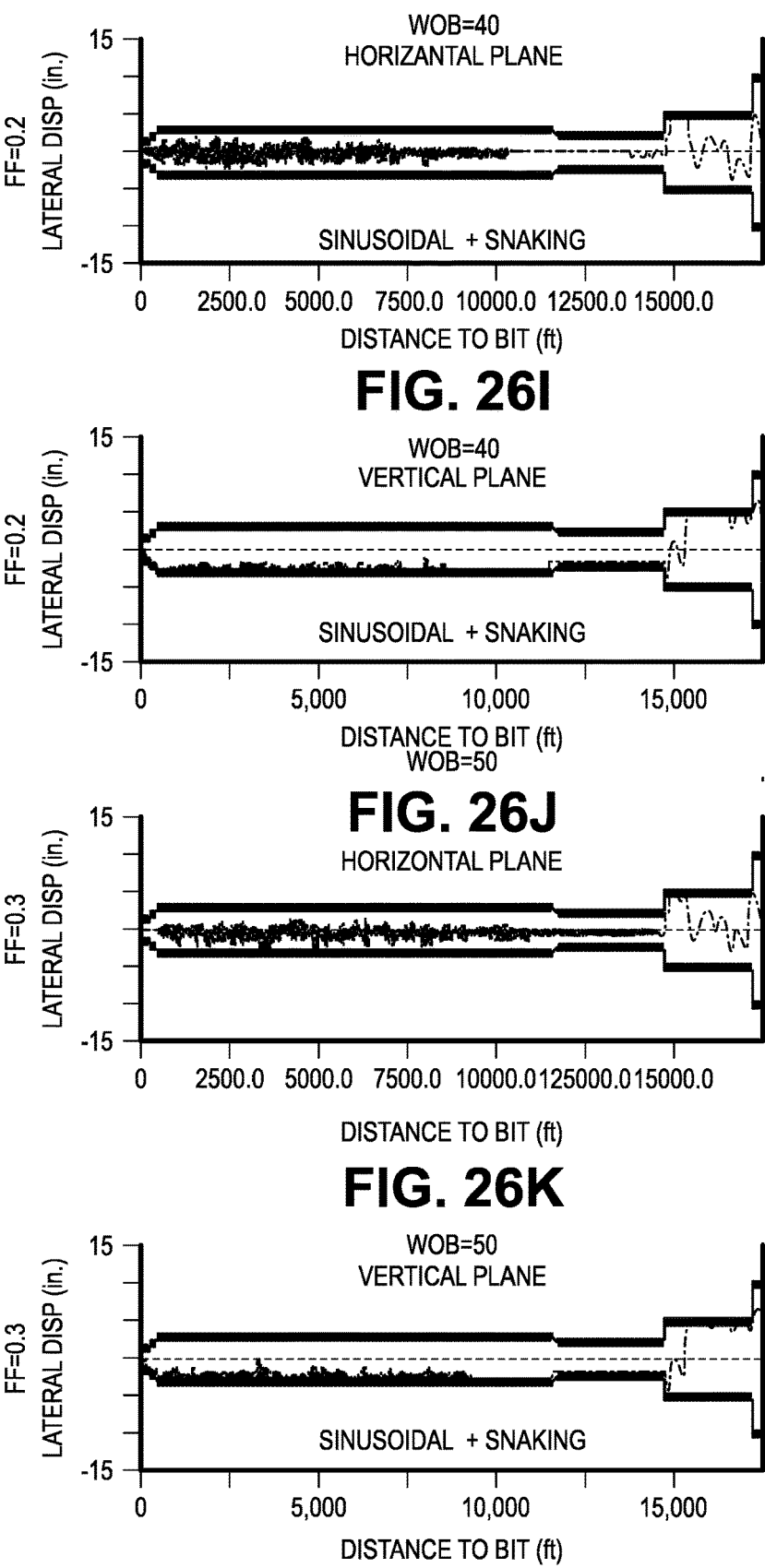
Figure 26M:
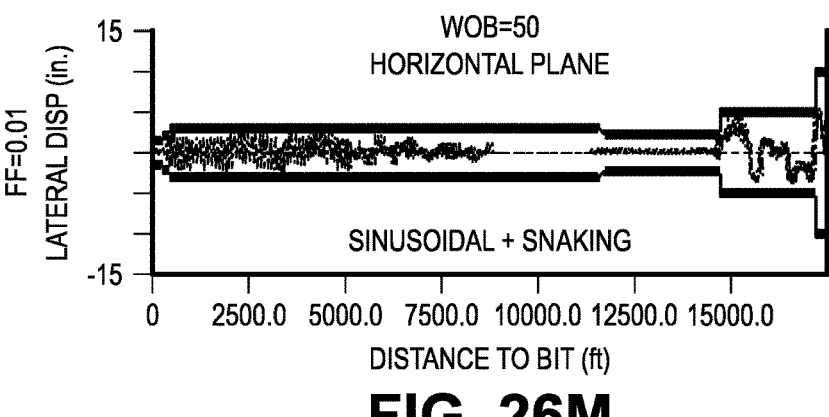
Figure 26N:
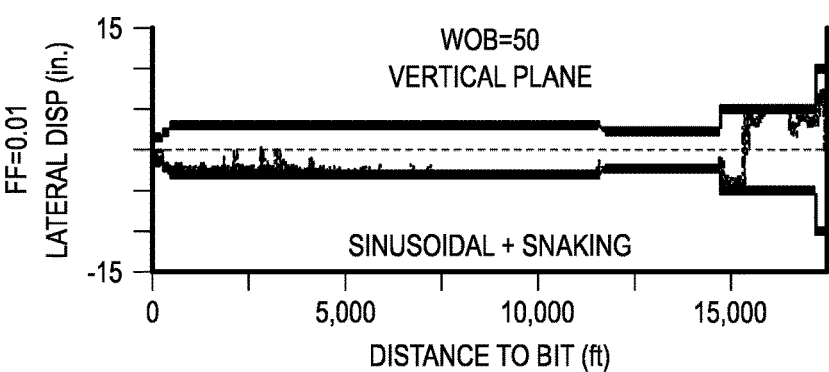
Figure 26O:
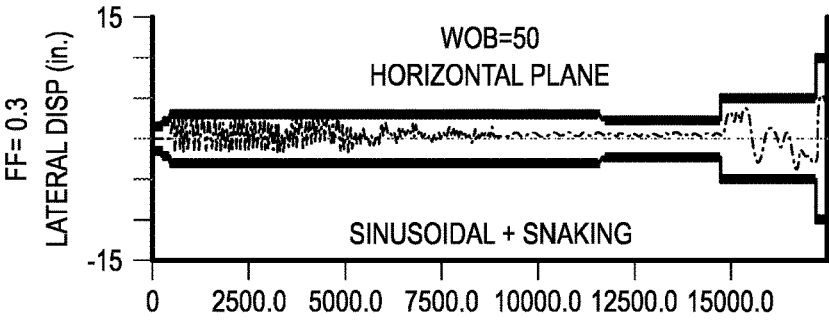
Figure 26P:
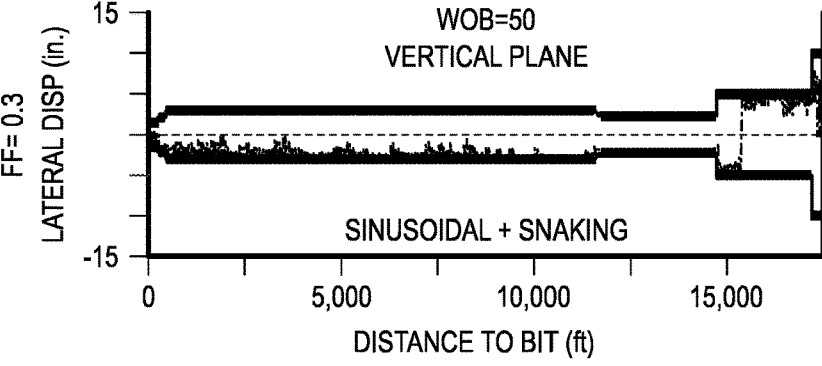
Figures 26Q, 26R, 26S, 26T:
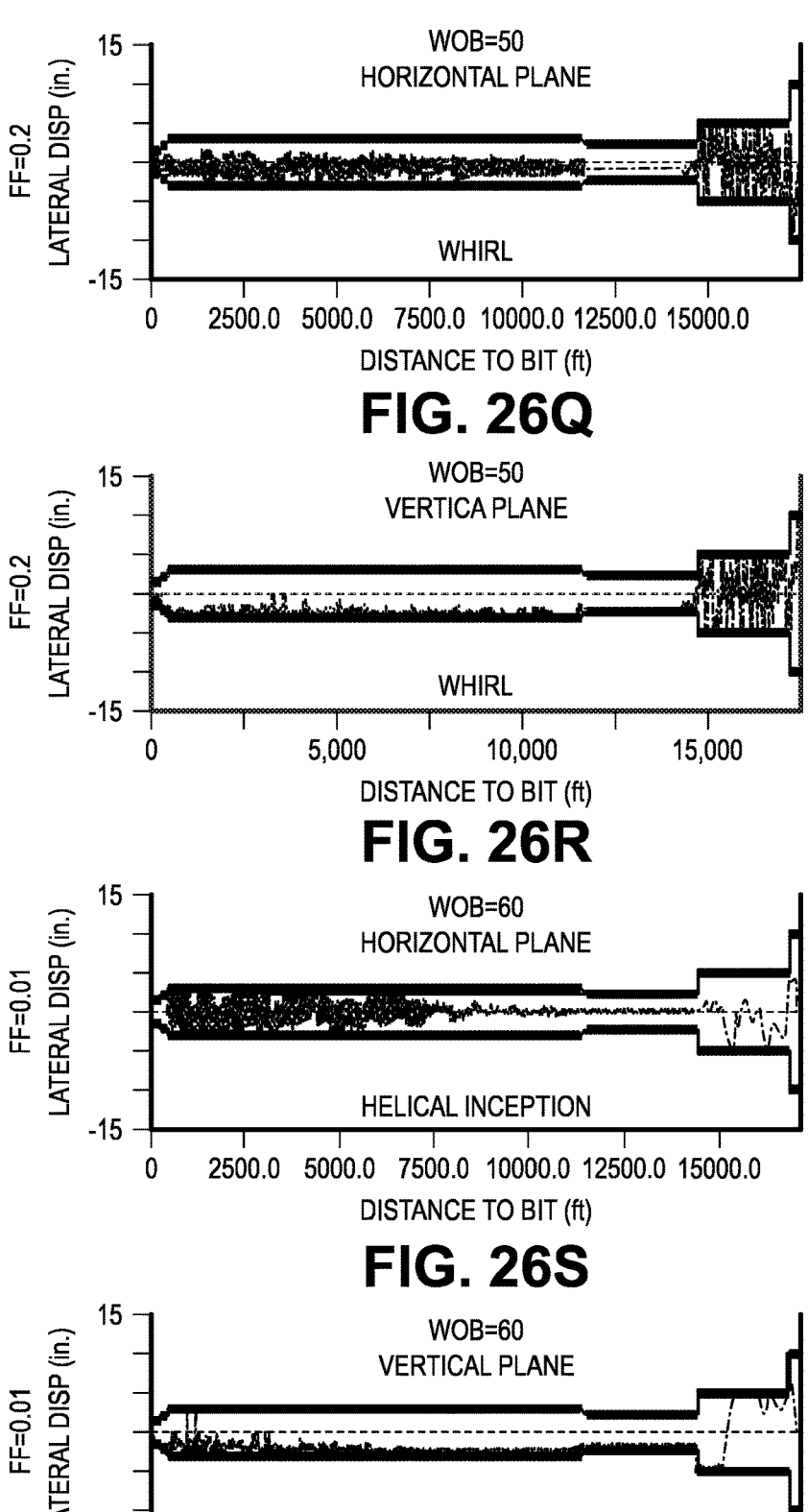
Figure 26U:
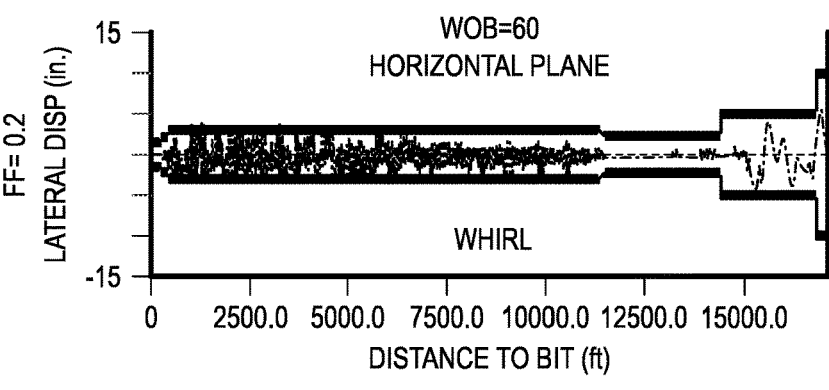
Figure 26V:
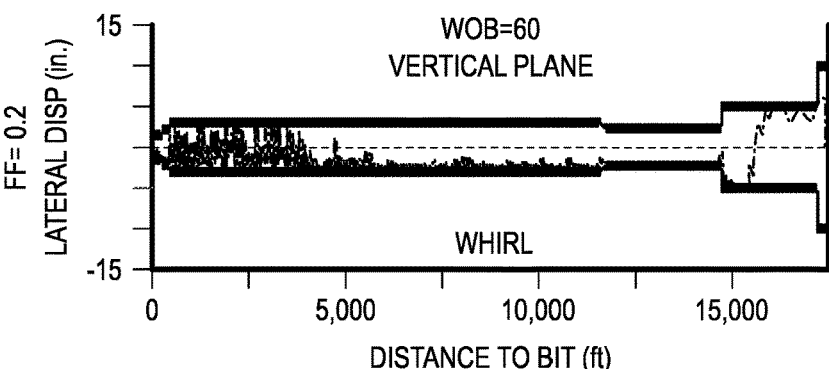
Figure 26W:
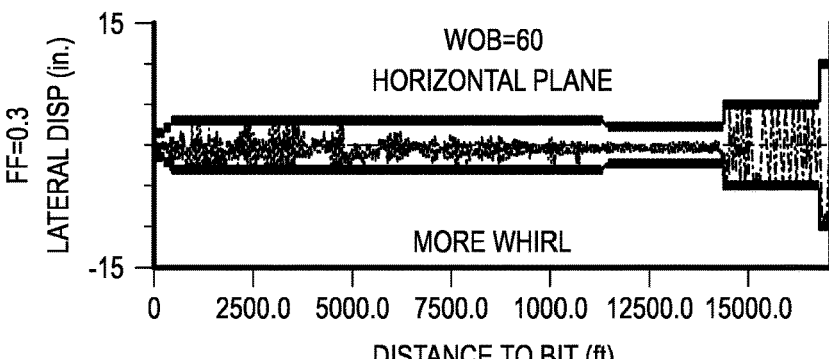
Figure 26X:
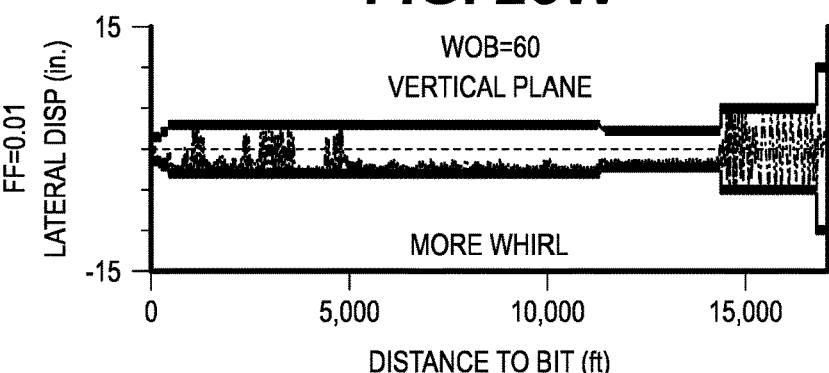
Figures 27A, 27B, 27C, 27D:
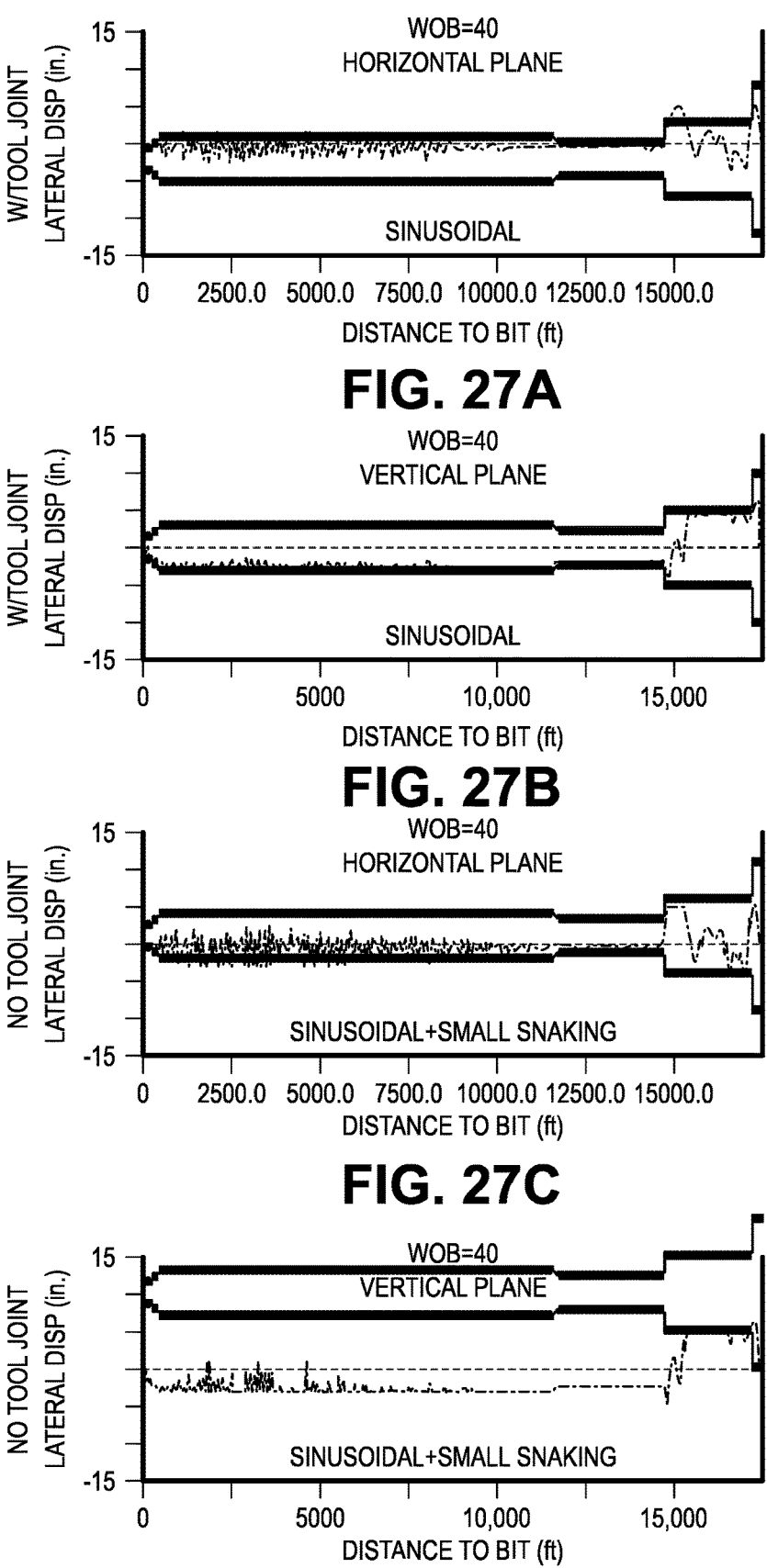
FIGS. 27A-27L illustrate a connector effect on transient dynamics simulation results, according to an embodiment.
Figures 27E, 27F, 27G, 27H:
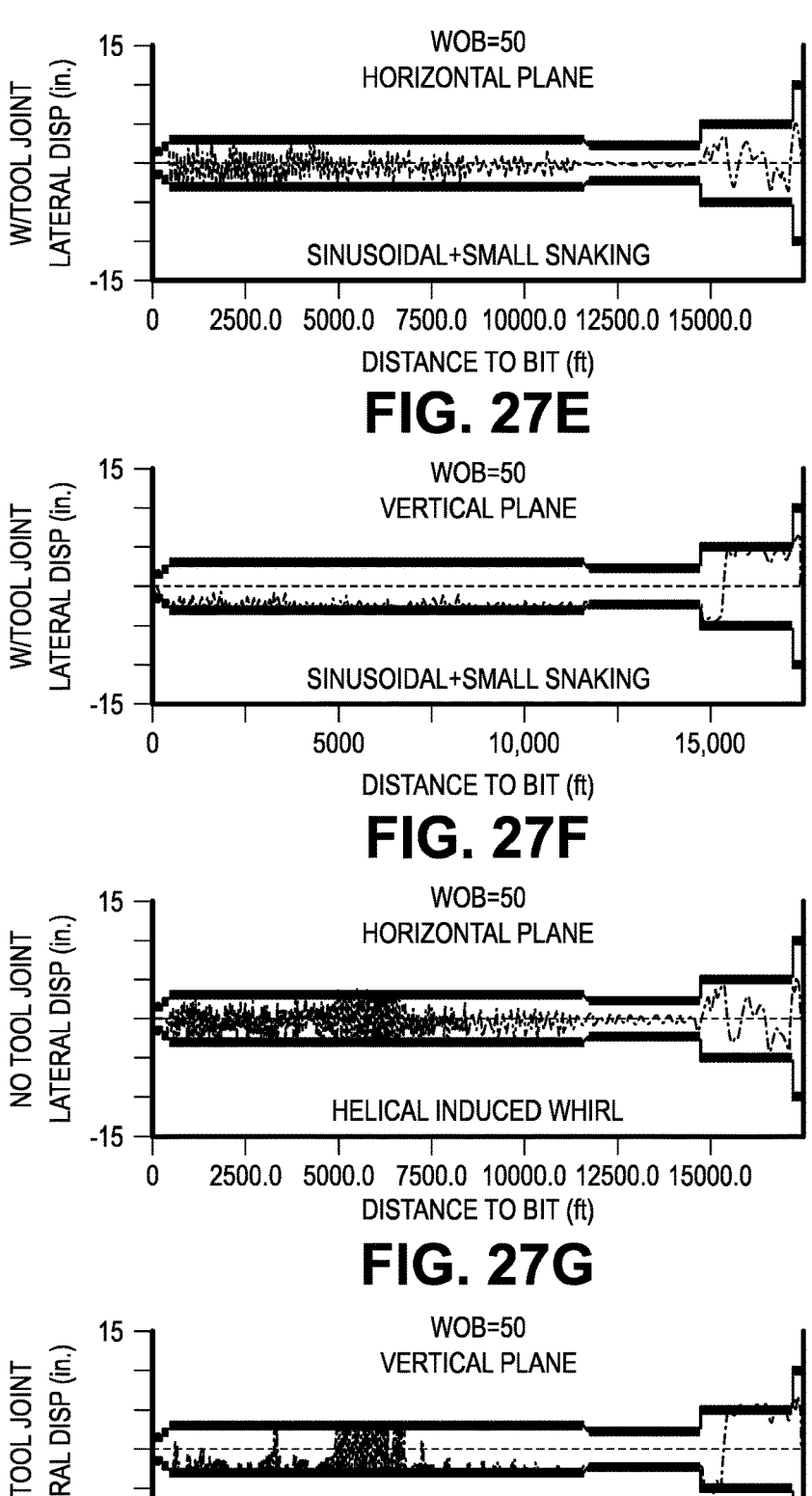
Figure 27I:
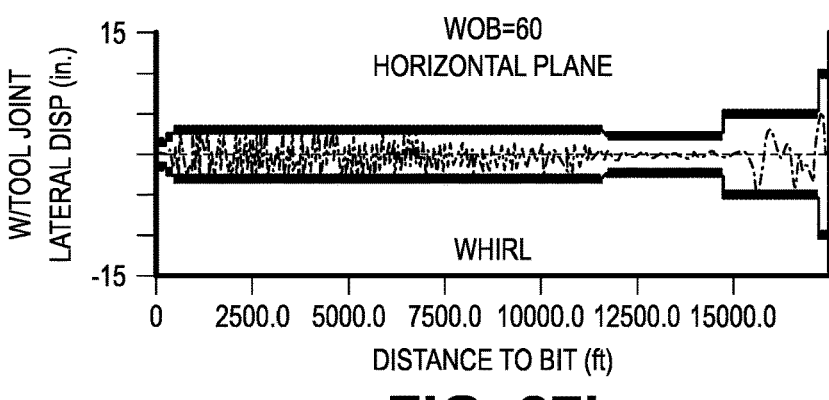
Figure 27J:
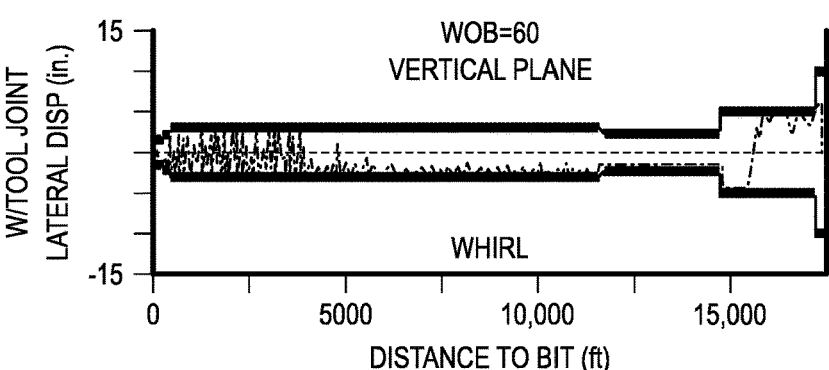
Figure 27K:
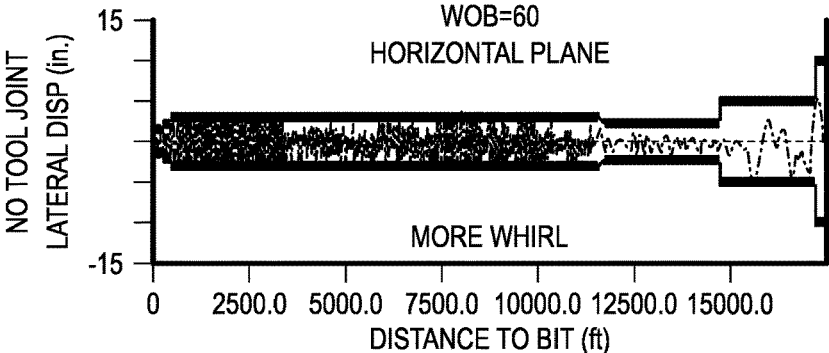
Figure 27L:
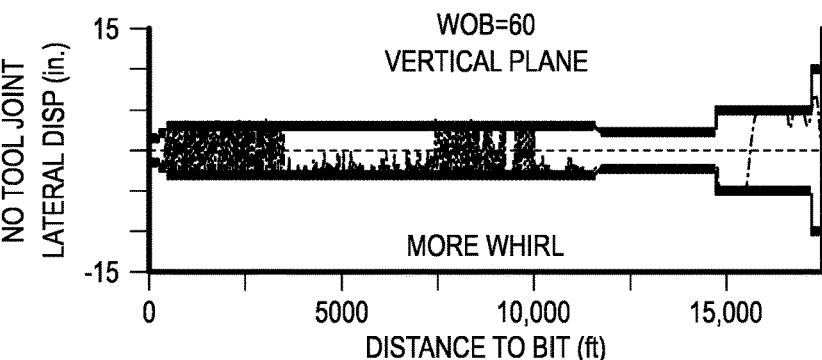

FIGS. 26A-26X illustrate an analysis comparison under different well friction factors, according to an embodiment. In this disclosure, the dynamic friction effect was investigated using the transient dynamics model. FIGS. 26A-26X show the simulation results of three wellbore friction factors (¼ 0.01, 0.2, and 0.3). By considering the dynamics effect of pipe rotation, higher friction drag force introduces more excitation to the system and tends to drive tubular into dynamic snaking and whirling motions. It shows the higher friction factor reduces the inception forces for buckling and dynamics motions. Downhole mechanics measurement tools have been developed to record downhole vibrations and forces. The measurement data provides insight into the downhole vibration modes (e.g., whirl) and also benefits the validation of transient dynamics model development. Through calibrating the hyperparameters in the model (e.g., wellbore friction is one of these parameters), the transient dynamics model can capture the vibration mode and magnitude recorded by downhole measurement tool.

Effect of Pipe Connector

FIGS. 27A-27L illustrate a connector effect on transient dynamics simulation results, according to an embodiment. The joints of drillpipe are connected through tool joints, which have larger diameters than the pipe body. Therefore, the tool joint comes into contact with the wellbore before the body does. The dimensions of the tool joint influence the effective size and stiffness of the drillstring and hence the drillstring behaviors. FIGS. 27A-27L compare the transient dynamics simulation results for the tubular string with and without tool joints. It indicates that a tool joint (e.g., connector) can delay the inception of the larger lateral deflection because of dynamics and buckling.

Effect of Mesh Density

Figures 28A, 28B, 28C, 28D:
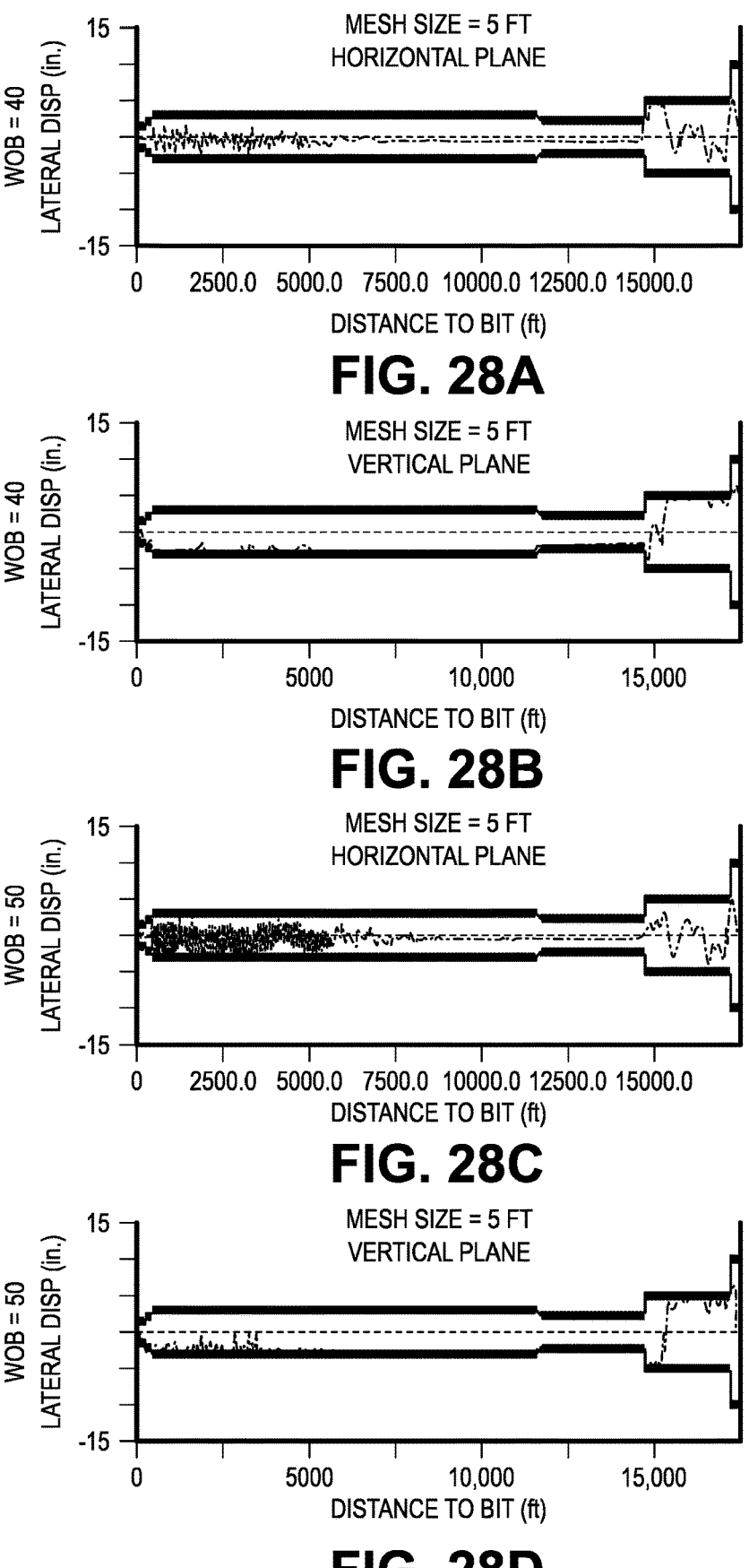
FIGS. 28A-28P illustrate a mesh density effect on transient dynamics simulation results, according to an embodiment.
Figures 28E, 28F, 28G, 28H:
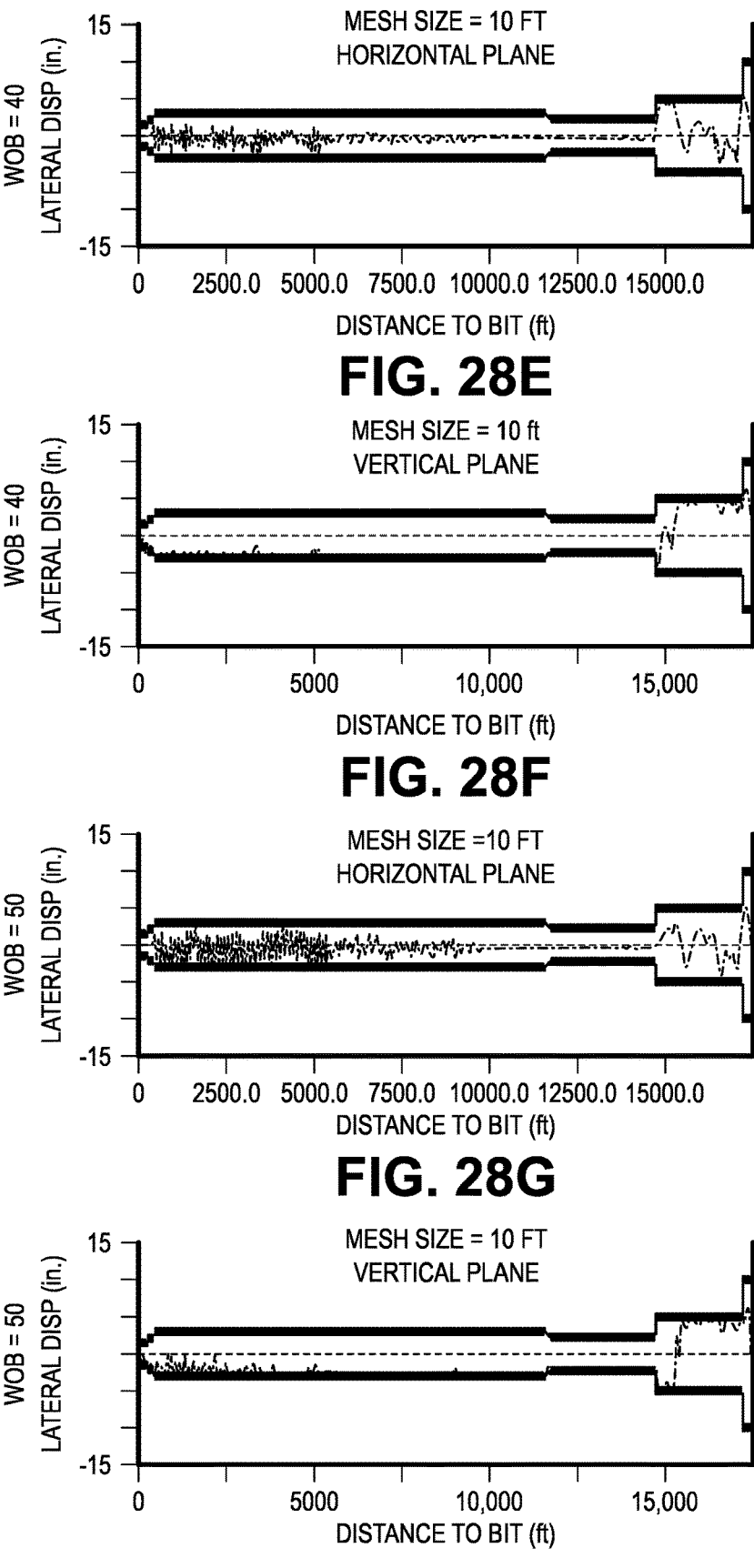
Figures 28I, 28J, 28K, 28L:
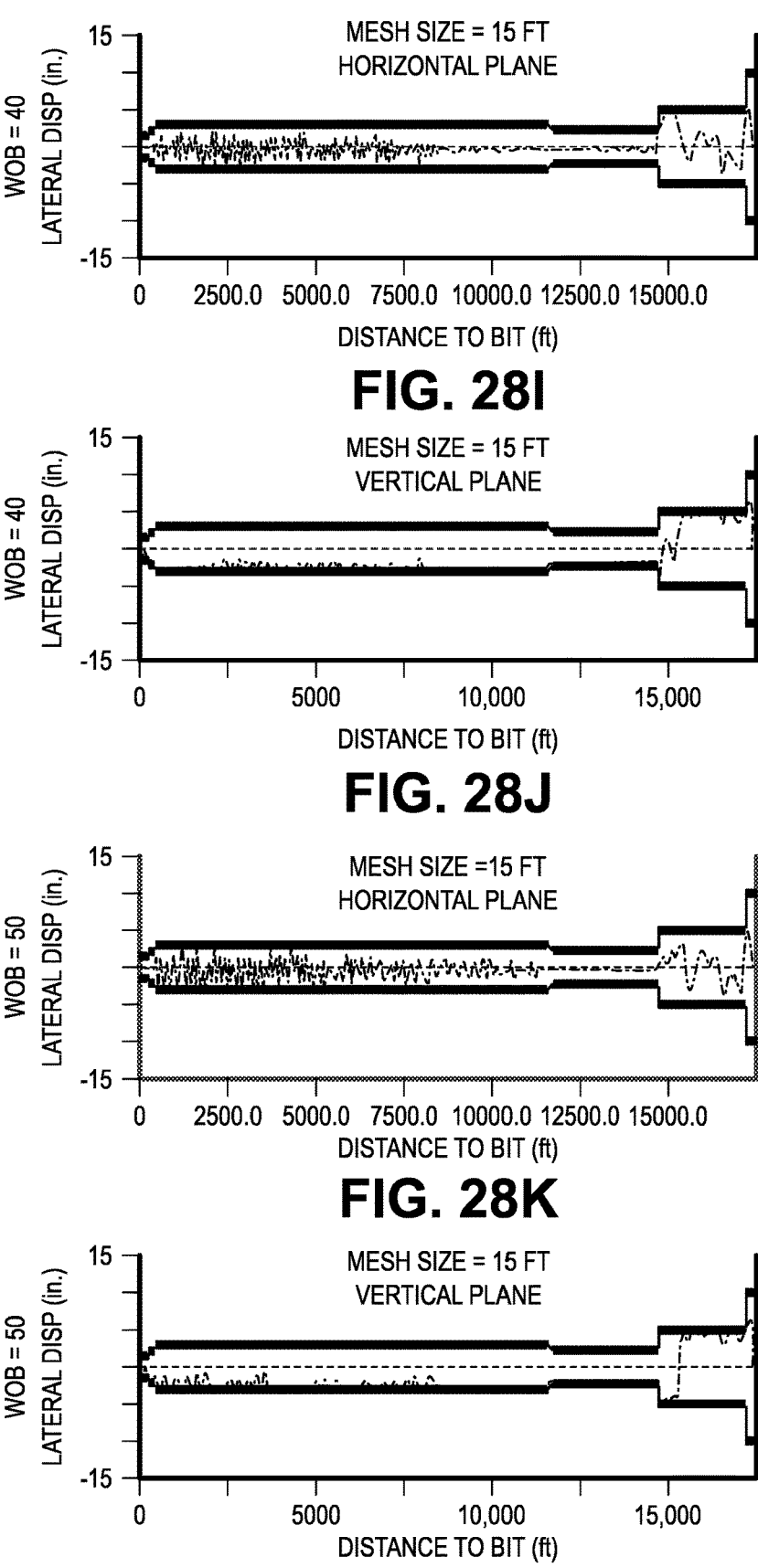
Figures 28M, 28N, 28O, 28P:
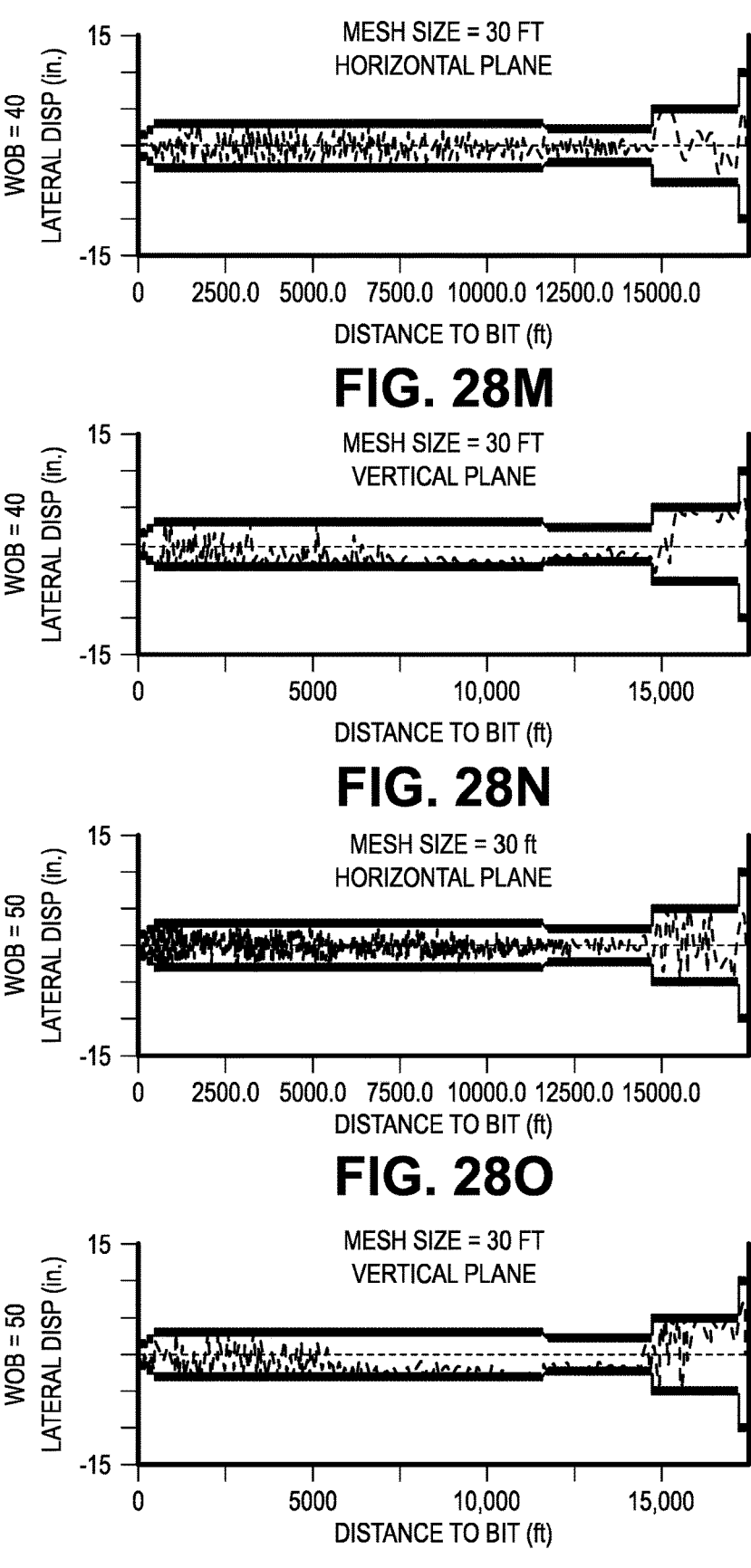

FIGS. 28A-28P illustrate a mesh density effect on transient dynamics simulation results, according to an embodiment. The mesh size has an effect on the numerical simulation behaviors of FEM. The mesh density study has been performed to identify the proper mesh size balancing the computation speed and accuracy. Because the tool joint is considered in the model, the maximum element size for drillpipe body is the joint length (e.g., 30 ft). The comparisons of transient dynamics results with different mesh sizes are presented in FIGS. 28A-28P. It shows that the model has similar dynamics results when the element size reduces to less than 15 ft. It shows that the predictions of the transient dynamics model are in good agreement with analytical solutions and downhole high frequency measurement data. Per the study, to achieve balance between accuracy and speed, it is recommended to mesh pipe body using 10- to 15-ft-long elements for the transient dynamics simulation of drillstring.

In summary, the present disclosure describes an analysis method for dynamics motion and post-buckling states of drilling and completion strings. The method aims to capture the enriched physics involved in the drilling dynamics and mechanics and to provide a more realistic prediction of the inception parameters for drillstring dynamics instability and buckling. An automatic inference method may also be used to facilitate the interpretation of drillstring behaviors. The tubular is simulated by a time-based transient dynamics model. It incorporates the dynamic inertia force and contact friction in the analysis. With the robust FEM-based computation engine, the large deflection caused by the drilling dynamics and buckling can be solved, and the weight and torque losses caused by contact force can be simulated. The model is validated through the comparison of the static buckling prediction with the classical analytical equations of buckling inception forces. For the field case study, the predicted weight and torque losses correlate well with the field measurements. It was demonstrated that the transient dynamics model was able to predict sinusoidal buckling at WOB lower than the values given by the static model and equation-based method. By considering the dynamic effect, the model is capable of capturing the dynamics snaking and whirling motions of tubular strings. It enables the optimization workflow of drilling parameters (e.g., WOB and RPM) for operation risk mitigation.

The method enables a holistic approach for drillstring dynamics and buckling analysis. This can be implemented in the well planning phase to facilitate the validation check of operation risk for the planned well trajectory, BHA, and drilling parameters. The method may aid in real-time monitoring of drilling dynamics and tubular buckling while drilling to achieve improved drilling efficiency and string integrity.

Figure 29:
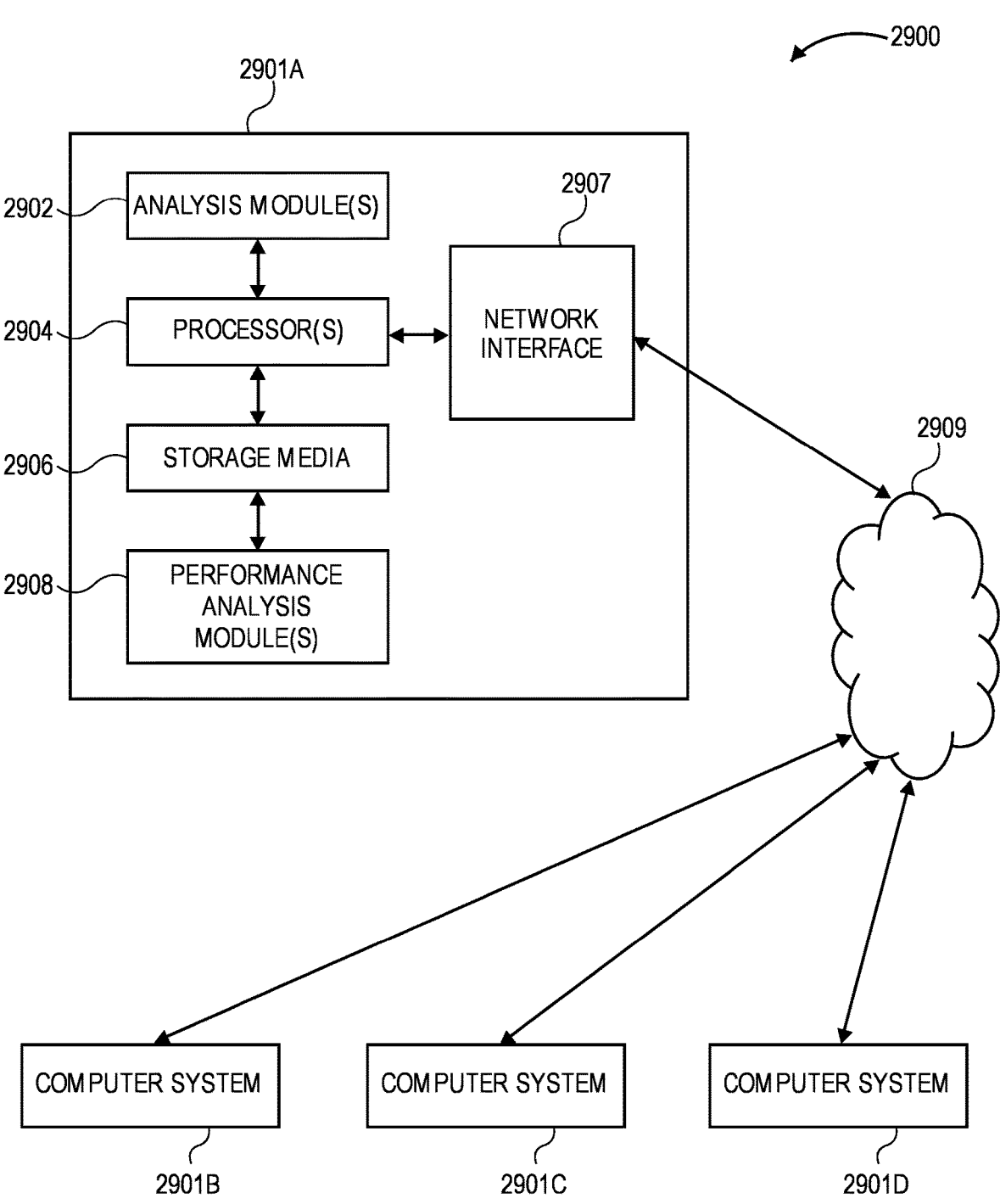
FIG. 29 illustrates a schematic view of a computing system for performing at least a portion of the method(s) herein, according to an embodiment.

In some embodiments, the methods of the present disclosure may be executed by a computing system. FIG. 29 illustrates an example of such a computing system 2900, in accordance with some embodiments. The computing system 2900 may include a computer or computer system 2901A, which may be an individual computer system 2901A or an arrangement of distributed computer systems. The computer system 2901A includes one or more analysis modules 2902 that are configured to perform various tasks according to some embodiments, such as one or more methods disclosed herein. To perform these various tasks, the analysis module 2902 executes independently, or in coordination with, one or more processors 2904, which is (or are) connected to one or more storage media 2906. The processor(s) 2904 is (or are) also connected to a network interface 2907 to allow the computer system 2901A to communicate over a data network 2909 with one or more additional computer systems and/or computing systems, such as 2901B, 2901C, and/or 2901D (note that computer systems 2901B, 2901C and/or 2901D may or may not share the same architecture as computer system 2901A, and may be located in different physical locations, e.g., computer systems 2901A and 2901B may be located in a processing facility, while in communication with one or more computer systems such as 2901C and/or 2901D that are located in one or more data centers, and/or located in varying countries on different continents).

A processor may include a microprocessor, microcontroller, processor module or subsystem, programmable integrated circuit, programmable gate array, or another control or computing device.

The storage media 2906 may be implemented as one or more computer-readable or machine-readable storage media. Note that while in the example embodiment of FIG. 29 storage media 2906 is depicted as within computer system 2901A, in some embodiments, storage media 2906 may be distributed within and/or across multiple internal and/or external enclosures of computing system 2901A and/or additional computing systems. Storage media 2906 may include one or more different forms of memory including semiconductor memory devices such as dynamic or static random access memories (DRAMs or SRAMs), erasable and programmable read-only memories (EPROMs), electrically erasable and programmable read-only memories (EEPROMs) and flash memories, magnetic disks such as fixed, floppy and removable disks, other magnetic media including tape, optical media such as compact disks (CDs) or digital video disks (DVDs), BLURAY® disks, or other types of optical storage, or other types of storage devices. Note that the instructions discussed above may be provided on one computer-readable or machine-readable storage medium, or may be provided on multiple computer-readable or machine-readable storage media distributed in a large system having possibly plural nodes. Such computer-readable or machine-readable storage medium or media is (are) considered to be part of an article (or article of manufacture). An article or article of manufacture may refer to any manufactured single component or multiple components. The storage medium or media may be located either in the machine running the machine-readable instructions, or located at a remote site from which machine-readable instructions may be downloaded over a network for execution.

In some embodiments, computing system 2900 contains one or more prediction module(s) 2908. It should be appreciated that computing system 2900 is merely one example of a computing system, and that computing system 2900 may have more or fewer components than shown, may combine additional components not depicted in the example embodiment of FIG. 29, and/or computing system 2900 may have a different configuration or arrangement of the components depicted in FIG. 29. The various components shown in FIG. 29 may be implemented in hardware, software, or a combination of both hardware and software, including one or more signal processing and/or application specific integrated circuits.

Further, the steps in the processing methods described herein may be implemented by running one or more functional modules in information processing apparatus such as general purpose processors or application specific chips, such as ASICs, FPGAS, PLDs, or other appropriate devices. These modules, combinations of these modules, and/or their combination with general hardware are included within the scope of the present disclosure.

Computational interpretations, models, and/or other interpretation aids may be refined in an iterative fashion; this concept is applicable to the methods discussed herein. This may include use of feedback loops executed on an algorithmic basis, such as at a computing device (e.g., computing system 2900, FIG. 29), and/or through manual control by a user who may make determinations regarding whether a given step, action, template, model, or set of curves has become sufficiently accurate for the evaluation of the subsurface three-dimensional geologic formation under consideration.

The foregoing description, for purpose of explanation, has been described with reference to specific embodiments. However, the illustrative discussions above are not intended to be exhaustive or limiting to the precise forms disclosed. Many modifications and variations are possible in view of the above teachings. Moreover, the order in which the elements of the methods described herein are illustrate and described may be re-arranged, and/or two or more elements may occur simultaneously. The embodiments were chosen and described in order to best explain the principles of the disclosure and its practical applications, to thereby enable others skilled in the art to best utilize the disclosed embodiments and various embodiments with various modifications as are suited to the particular use contemplated.

What is claimed is:

1. A non-transitory computer-readable medium storing instructions that, when executed by one or more processors of a computing system, cause the computing system to perform operations, the operations comprising:

performing a first finite element analysis (FEA) on a tubular string in a wellbore;

iteratively performing a series of sub-operations, wherein the series of sub-operations comprises:

determining one or more first properties of the tubular string based upon the first FEA;

identifying a possible buckling zone in the tubular string based upon an axial load;

splitting the possible buckling zone into a plurality of segments;

performing a second FEA on one or more segments of the plurality of segments;

determining one or more second properties of the tubular string based upon the second FEA;

comparing the one or more first properties of first FEA to the one or more second properties of second FEA to identify incremental changes therebetween; and applying the incremental changes to the first FEA to produce an updated first FEA, wherein the updated first FEA comprises a linear FEA;

performing the updated first FEA on the tubular string to produce a final result; and generating and transmitting a signal in response to the final result, wherein the signal comprises instructions to vary a weight or torque on a drill string.

2. The non-transitory computer-readable medium of claim 1, wherein the first FEA comprises a linear FEA, wherein the second FEA comprises a non-linear FEA, and wherein the second FEA is performed on a lowermost of the one or more segments that has not had the second FEA performed on it.

3. The non-transitory computer-readable medium of claim 1, wherein the tubular string comprises the drill string, a coiled tubing, a liner, a casing, or a combination thereof, wherein the one or more first properties of the tubular string and the one or more second properties of the tubular string comprise the axial load, a torque, a bending moment, or a combination thereof, and wherein the plurality of segments of the tubular string each have a length from about 300 feet to about 400 feet.

4. The non-transitory computer-readable medium of claim 1, wherein the operations further comprise refining grid size to improve convergence of the second FEA performed on the one or more segments.

* * * * *